United States Patent
Lang et al.

(10) Patent No.: US 9,852,800 B2
(45) Date of Patent: Dec. 26, 2017

(54) ADAPTIVE DETERMINATION OF PROGRAM PARAMETER USING PROGRAM OF ERASE RATE

(71) Applicant: SanDisk Technologies Inc., Plano, TX (US)

(72) Inventors: Murong Lang, Santa Clara, CA (US); Deepanshu Dutta, Fremont, CA (US); Cynthia Hsu, Milpitas, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/062,661

(22) Filed: Mar. 7, 2016

(65) Prior Publication Data

US 2017/0256320 A1    Sep. 7, 2017

(51) Int. Cl.
G11C 16/16    (2006.01)
G11C 16/34    (2006.01)
G11C 16/26    (2006.01)

(52) U.S. Cl.
CPC .............. *G11C 16/26* (2013.01); *G11C 16/16* (2013.01); *G11C 16/3459* (2013.01)

(58) Field of Classification Search
CPC ..... G11C 16/0483; G11C 16/26; G11C 16/16; G11C 16/3459
See application file for complete search history.

(56) References Cited

U.S. PATENT DOCUMENTS

| | | | |
|---|---|---|---|
| 6,259,627 B1 * | 7/2001 | Wong ................. | G11C 11/5621 365/185.03 |
| 7,633,807 B2 | 12/2009 | Chen et al. | |
| 7,839,690 B2 * | 11/2010 | Lee .................... | G11C 11/5635 365/185.18 |
| 7,916,533 B2 * | 3/2011 | Dong ................. | G11C 11/5628 365/185.02 |
| 7,929,350 B2 * | 4/2011 | Hwang ............... | G11C 16/30 365/185.02 |
| 8,111,544 B2 | 2/2012 | Chung et al. | |

(Continued)

OTHER PUBLICATIONS

Kultursay, Emre, et al., "Evaluating STT-RAM as an Energy-Efficient Main Memory Alternative," The Pennsylvania State University and Carnegie Mellon University, Feb. 29, 2013, 12 pages.

*Primary Examiner* — Anthan Tran
*Assistant Examiner* — Mushfique Siddique
(74) *Attorney, Agent, or Firm* — Vierra Magen Marcus LLP

(57) ABSTRACT

Techniques are provided for optimizing the programming of memory cells by obtaining a metric which indicates a program or erase rate of the memory cells. In one approach, a count of pulses used to program the cells to different verify levels of respective data states is stored. A slope of a straight line fit of data points is then obtained. Each data point can include one of the verify levels and a corresponding one of the counts. An optimal step size is determined based on the slope. The counts may exclude one or more initial program voltages while the cells are programmed sufficiently to allow faster and slower cells to be distinguished, e.g., in a natural threshold voltage distribution. An erase depth can also be adjusted. The cells can be programmed in a separate evaluation or during programming of user data.

19 Claims, 35 Drawing Sheets

(56) References Cited

U.S. PATENT DOCUMENTS

| | | | |
|---|---|---|---|
| 8,737,130 B2 | 5/2014 | D' Abreu et al. | |
| 8,854,890 B1* | 10/2014 | Miwa | G11C 16/0483 365/185.02 |
| 8,891,308 B1* | 11/2014 | Ou | G11C 16/16 365/185.17 |
| 8,971,128 B2 | 3/2015 | Chin et al. | |
| 9,123,424 B2* | 9/2015 | Oowada | G11C 16/10 |
| 9,142,298 B2 | 9/2015 | Dong et al. | |
| 9,236,131 B1* | 1/2016 | Yuan | G11C 16/10 |
| 9,343,141 B2* | 5/2016 | Pang | G11C 11/5628 |
| 9,343,171 B1* | 5/2016 | Sun | G11C 16/3445 |
| 9,583,198 B1* | 2/2017 | Pang | G11C 16/10 |
| 9,711,231 B1* | 7/2017 | Yip | G11C 16/28 |
| 9,715,937 B1* | 7/2017 | Pang | G11C 16/26 |
| 2005/0083735 A1* | 4/2005 | Chen | G11C 11/5628 365/185.17 |
| 2005/0219896 A1* | 10/2005 | Chen | G11C 16/3459 365/185.03 |
| 2005/0248988 A1* | 11/2005 | Guterman | G11C 16/0483 365/185.28 |
| 2006/0120165 A1* | 6/2006 | Hemink | G11C 11/5628 365/185.28 |
| 2008/0198662 A1* | 8/2008 | Mokhlesi | G11O 5/147 365/185.22 |
| 2008/0253193 A1* | 10/2008 | Cernea | G11C 11/5628 365/185.19 |
| 2008/0273385 A1* | 11/2008 | Goda | G11O 5/145 365/185.03 |
| 2010/0195387 A1* | 8/2010 | Park | G11C 11/5628 365/185.03 |
| 2011/0103150 A1* | 5/2011 | Chan | G11C 16/0483 365/185.19 |
| 2012/0033500 A1 | 2/2012 | Dutta et al. | |
| 2012/0224430 A1* | 9/2012 | Visconti | G11C 16/10 365/185.19 |
| 2014/0215128 A1* | 7/2014 | Chin | G11C 11/5628 711/103 |
| 2015/0149699 A1* | 5/2015 | Fitzpatrick | G11C 11/5635 711/103 |
| 2015/0255166 A1* | 9/2015 | Tseng | G11C 16/28 365/185.17 |
| 2015/0287459 A1 | 10/2015 | Navon et al. | |
| 2016/0019947 A1* | 1/2016 | Pang | G11C 11/5628 365/185.03 |
| 2016/0019948 A1* | 1/2016 | Pang | G11C 11/5628 365/185.03 |
| 2016/0118131 A1* | 4/2016 | Dong | G11C 16/3427 365/185.02 |
| 2016/0163382 A1* | 6/2016 | Conley | G11C 11/5642 365/185.03 |
| 2017/0125117 A1* | 5/2017 | Tseng | G11C 16/3459 |
| 2017/0221573 A1* | 8/2017 | Darragh | G11C 16/26 |

* cited by examiner

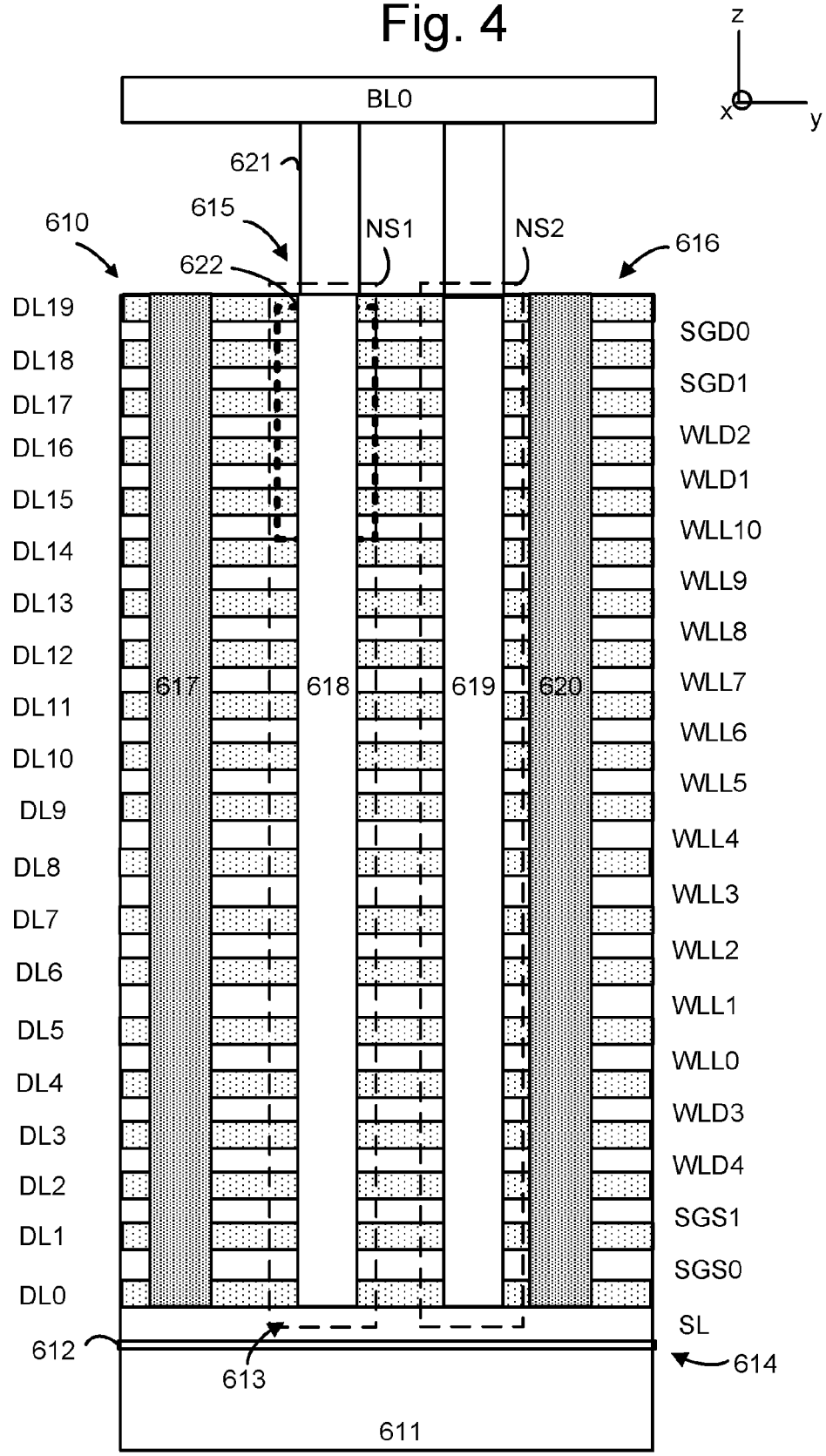

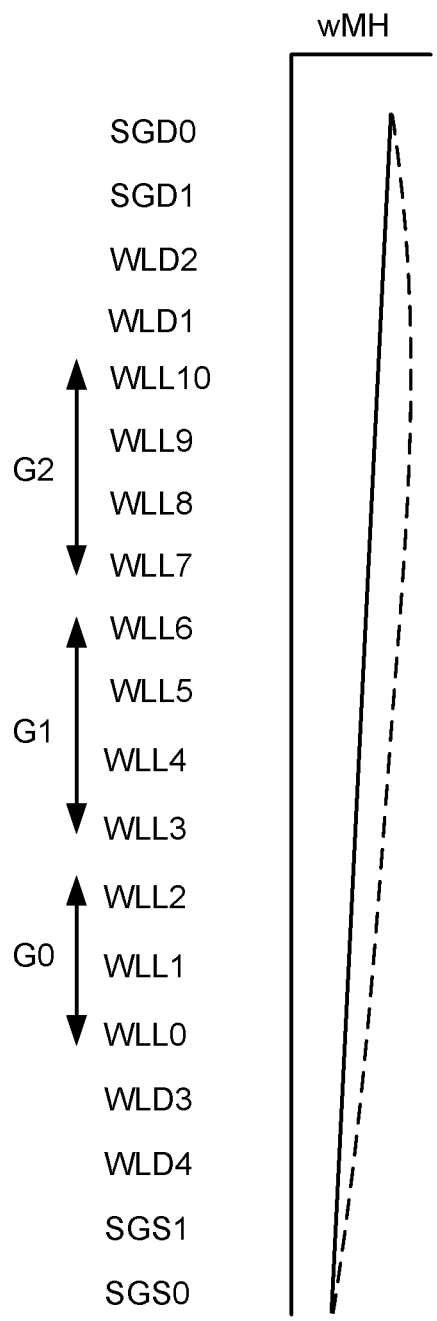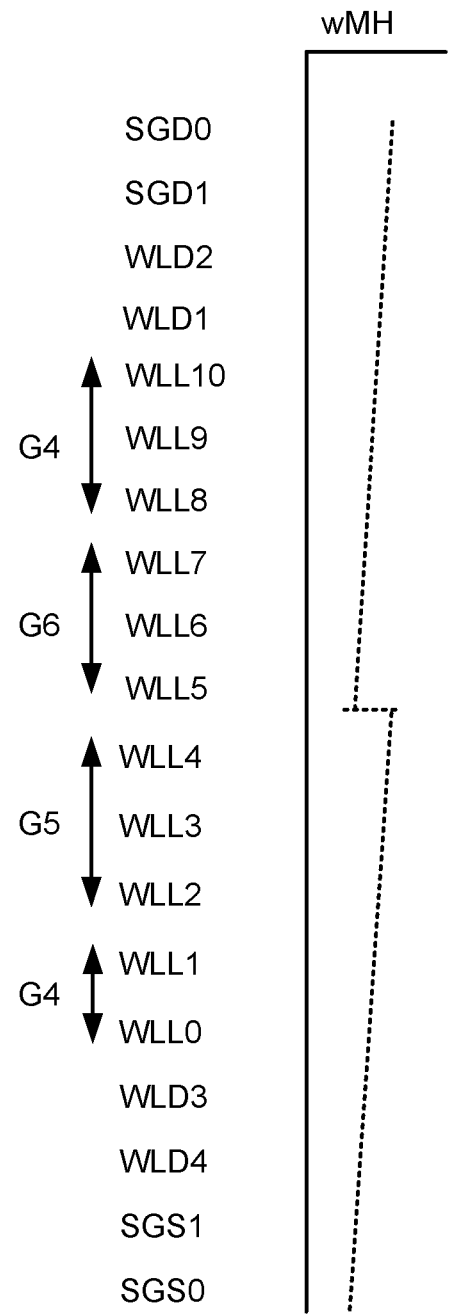

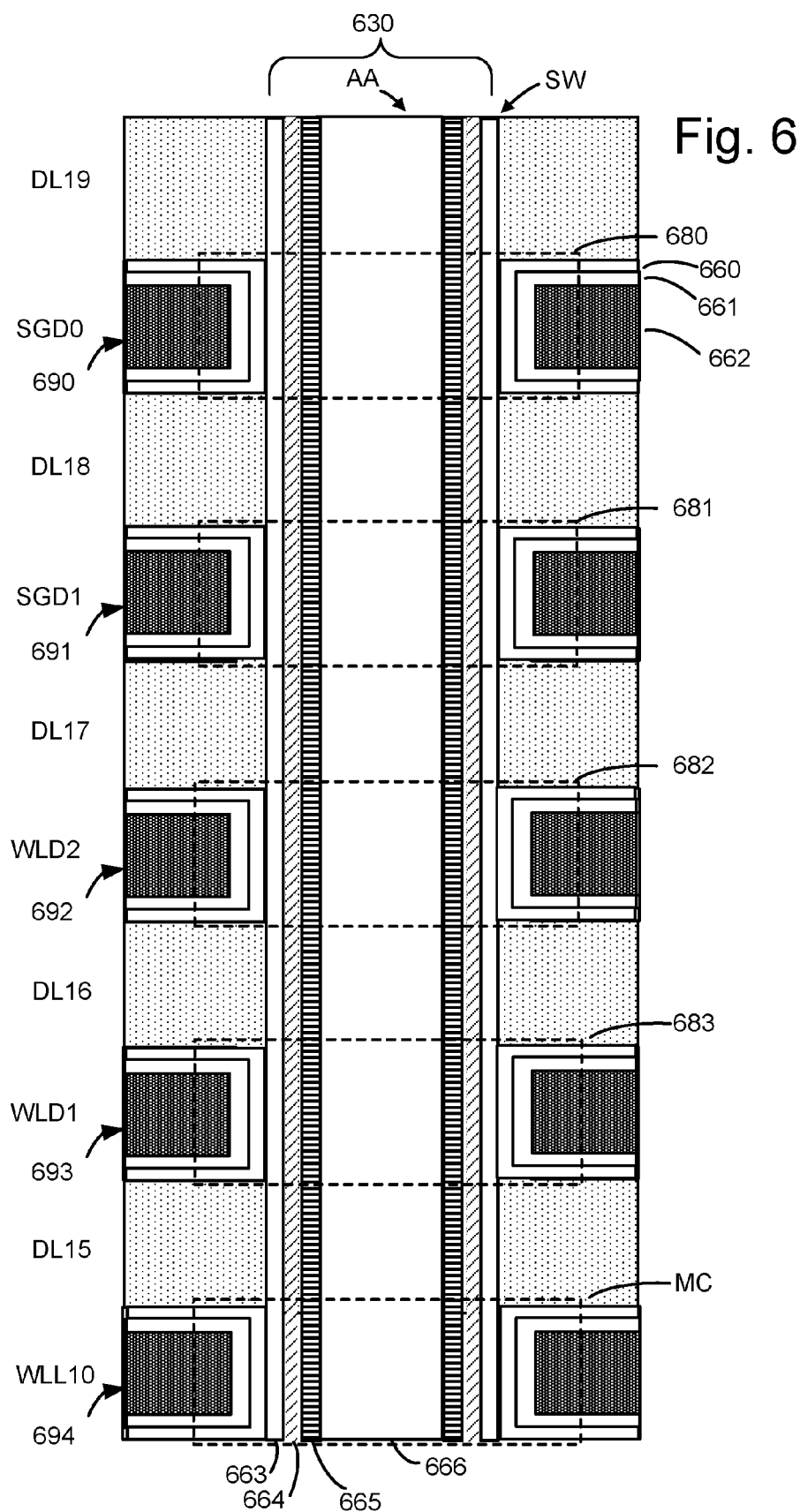

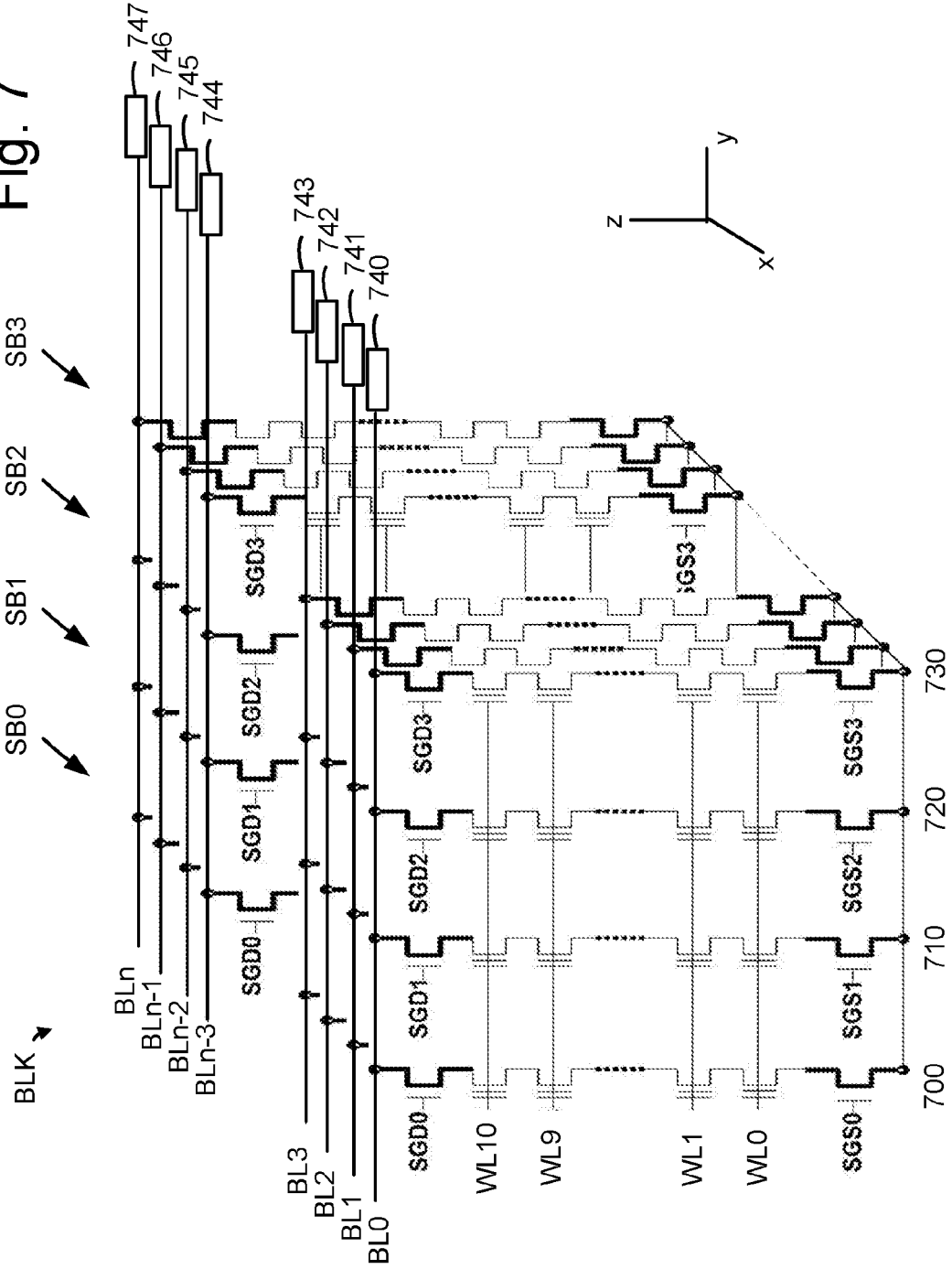

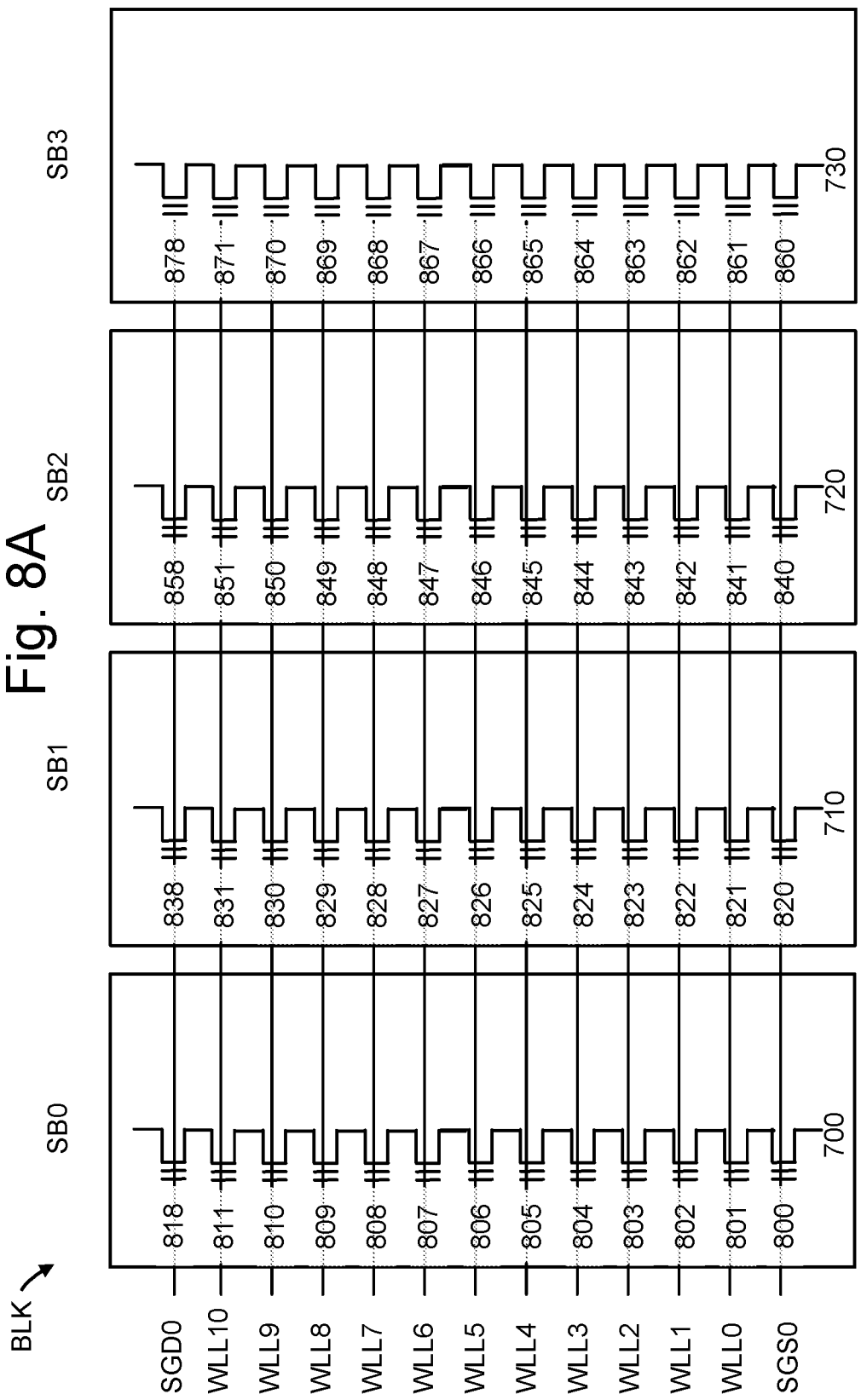

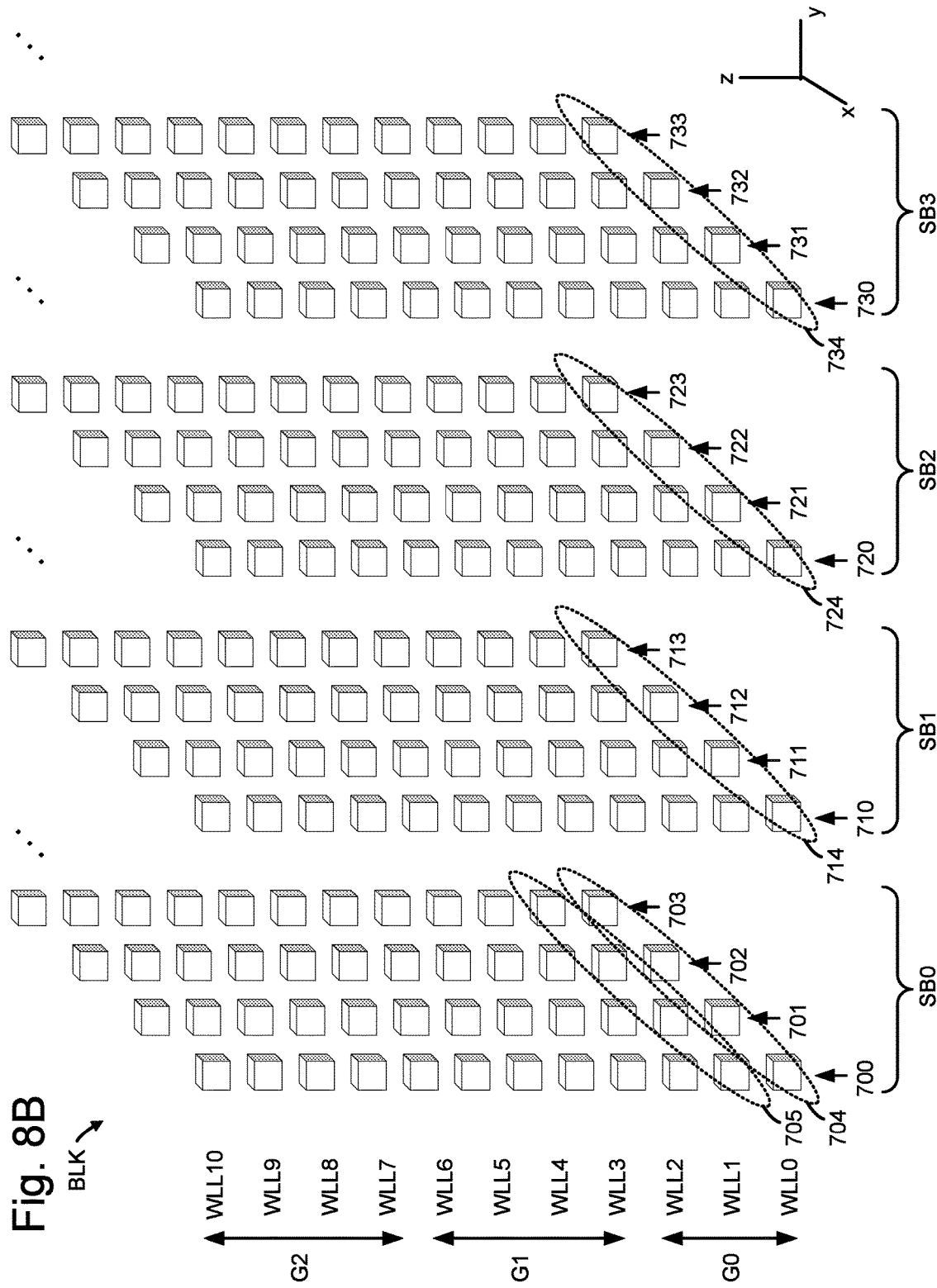

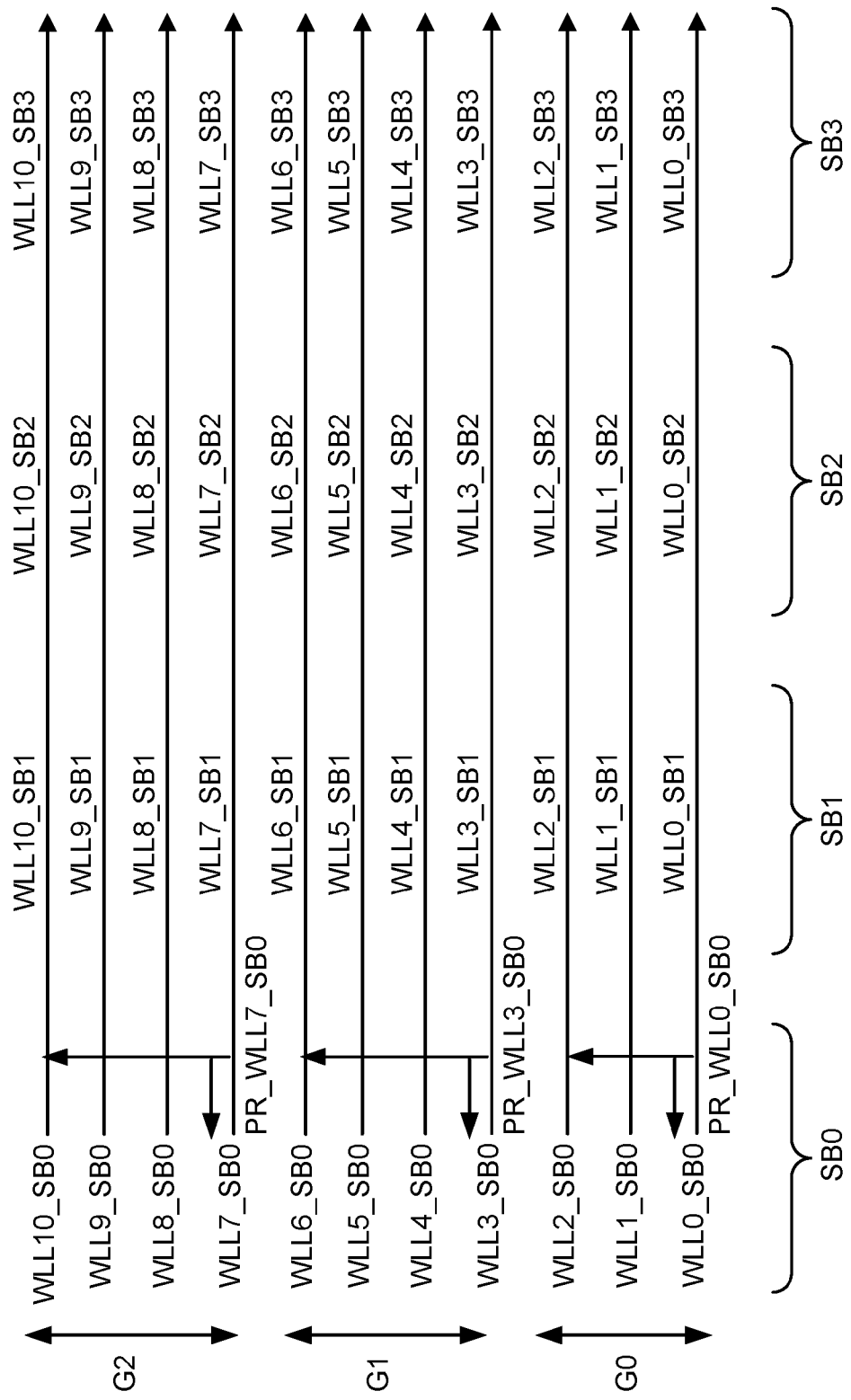

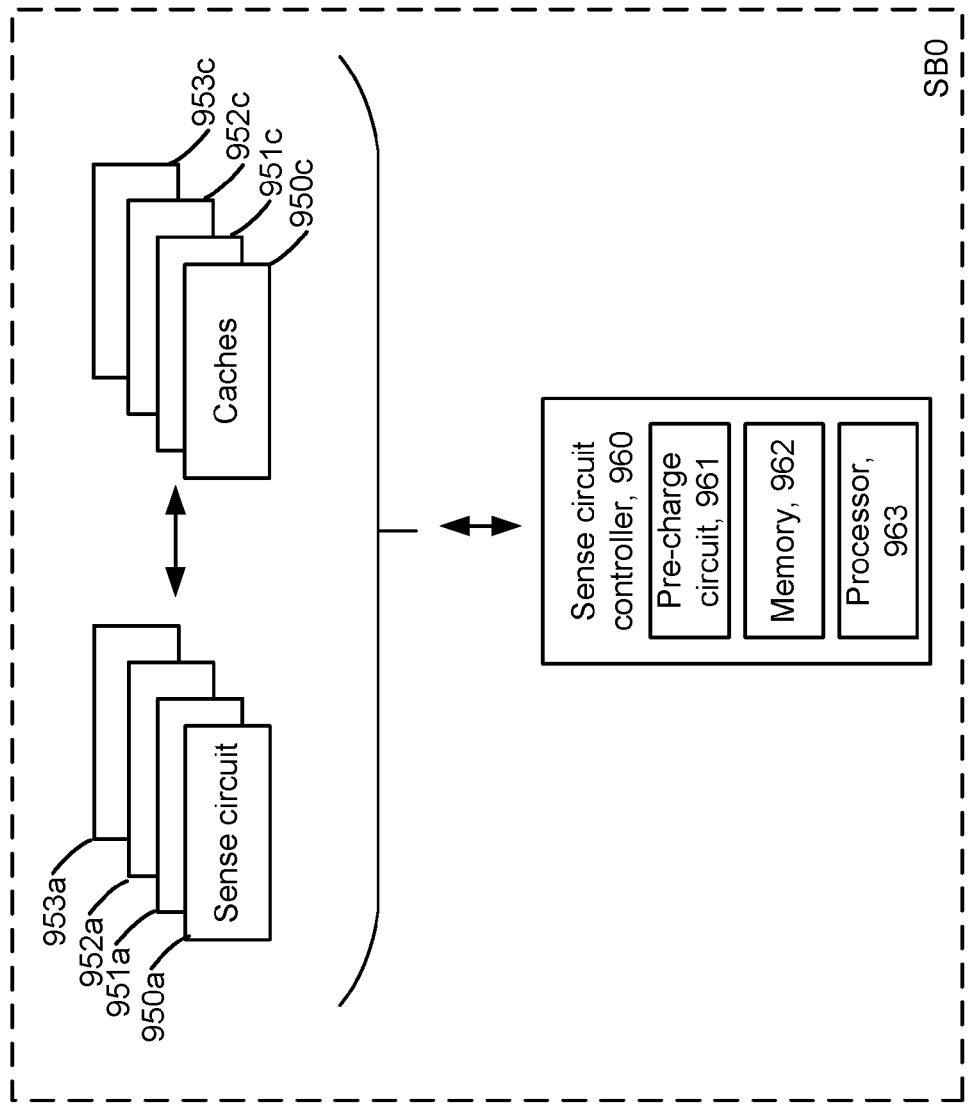

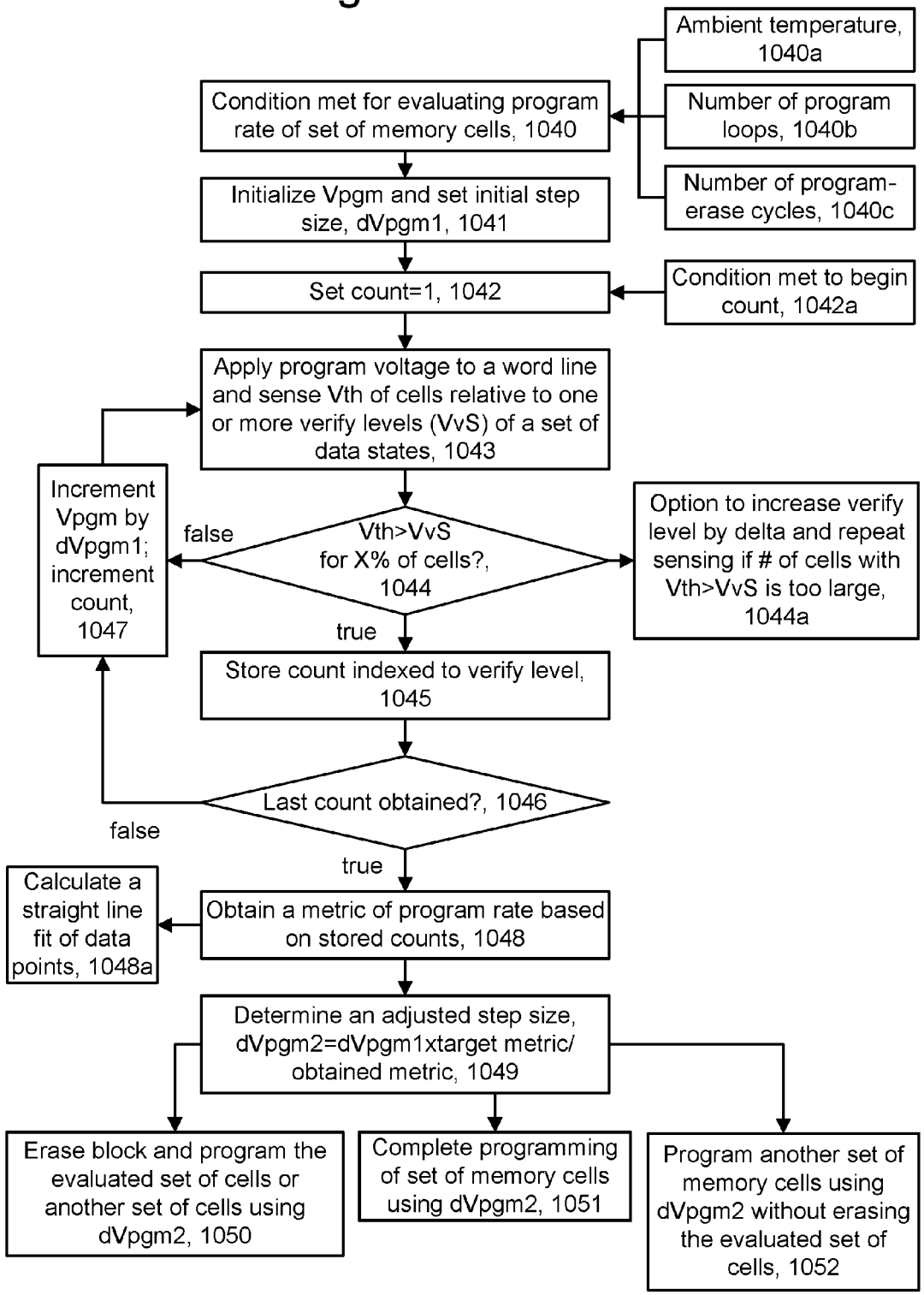
Fig. 10E1

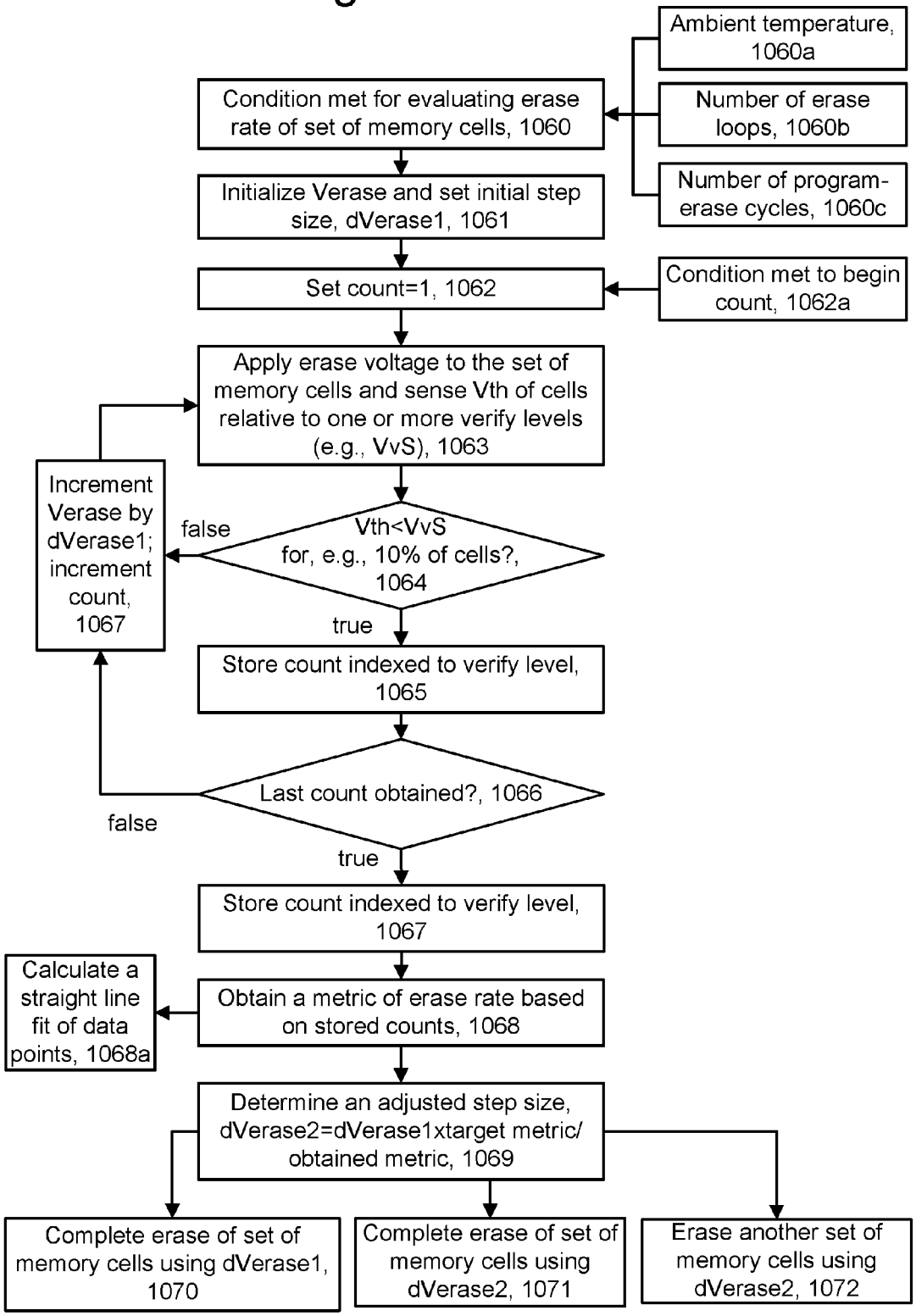
Fig. 10E2

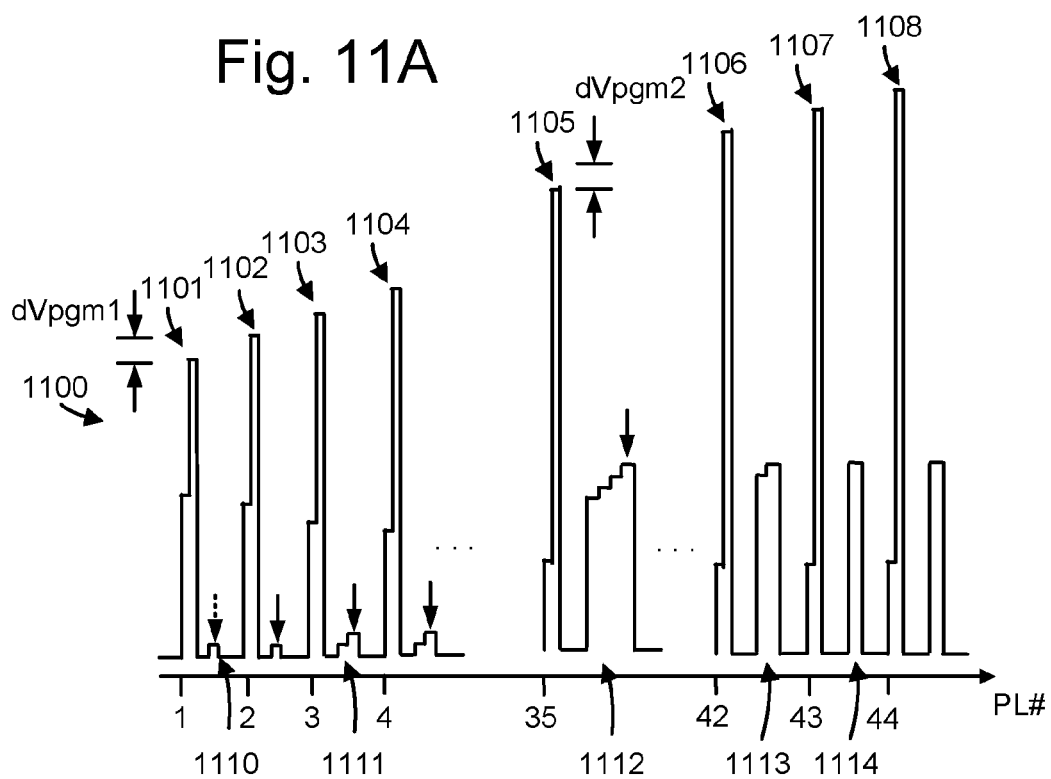
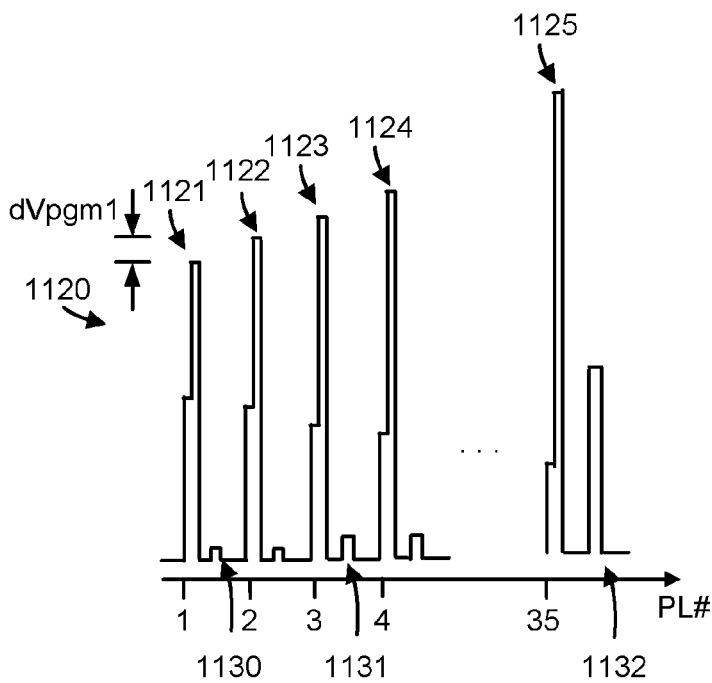

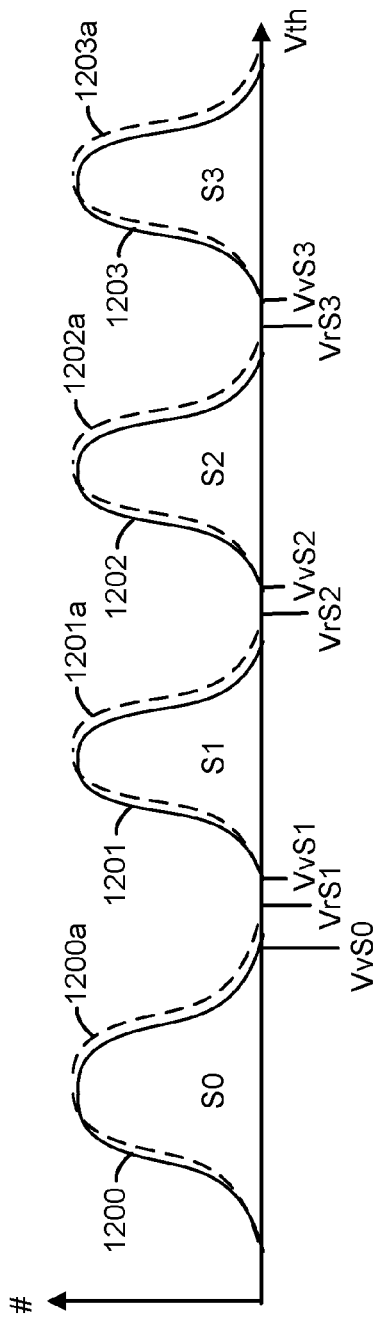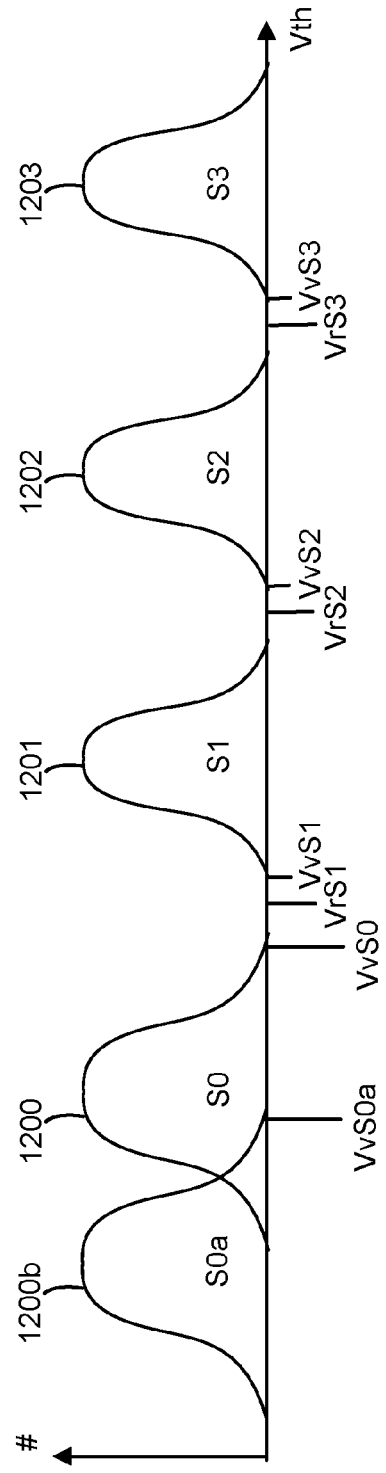

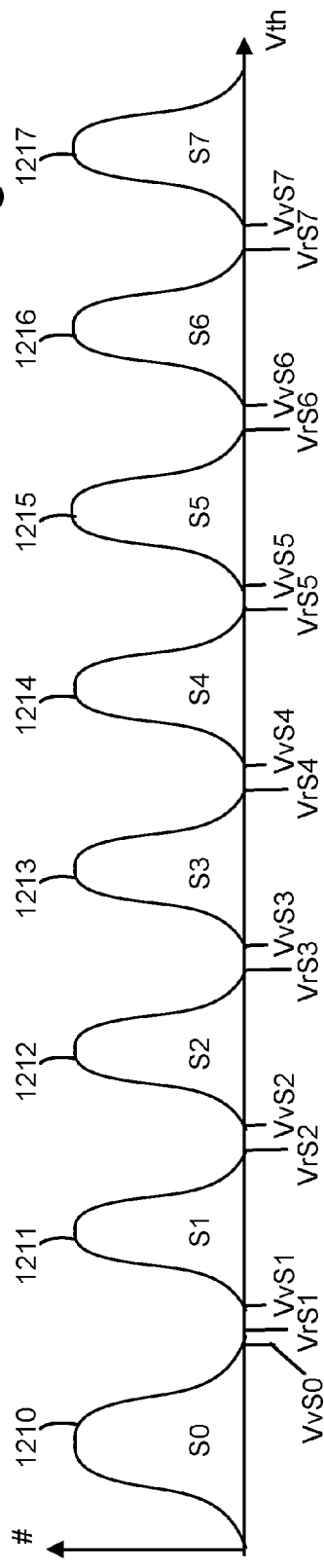
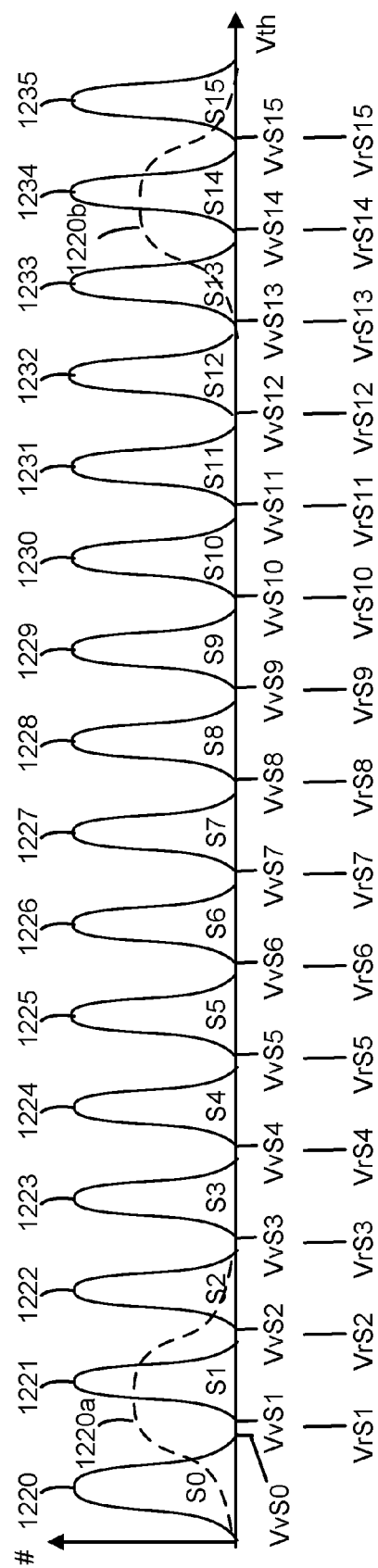

Fig. 13

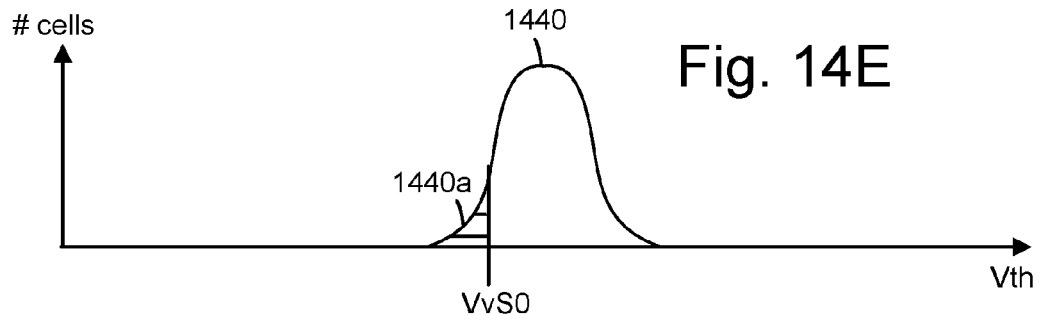
Fig. 14E
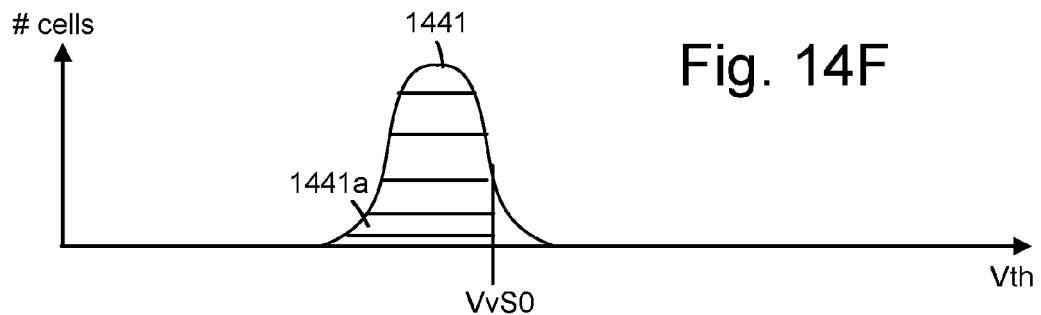
Fig. 14F
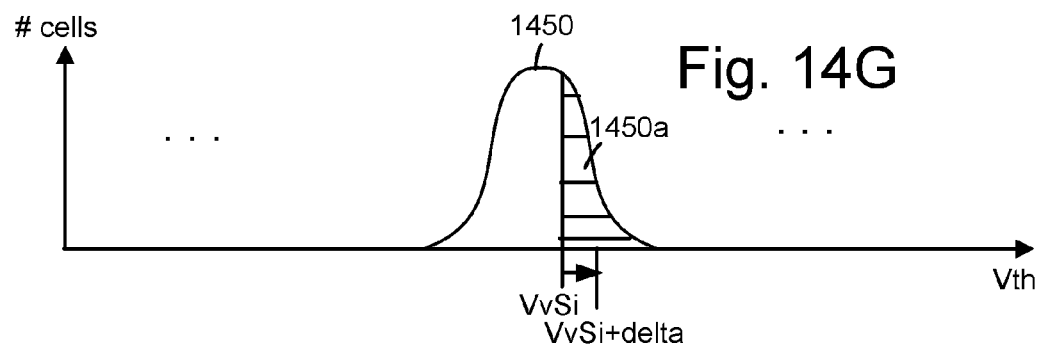
Fig. 14G
Fig. 14H
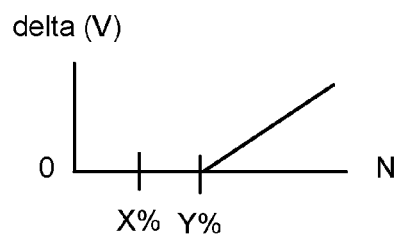

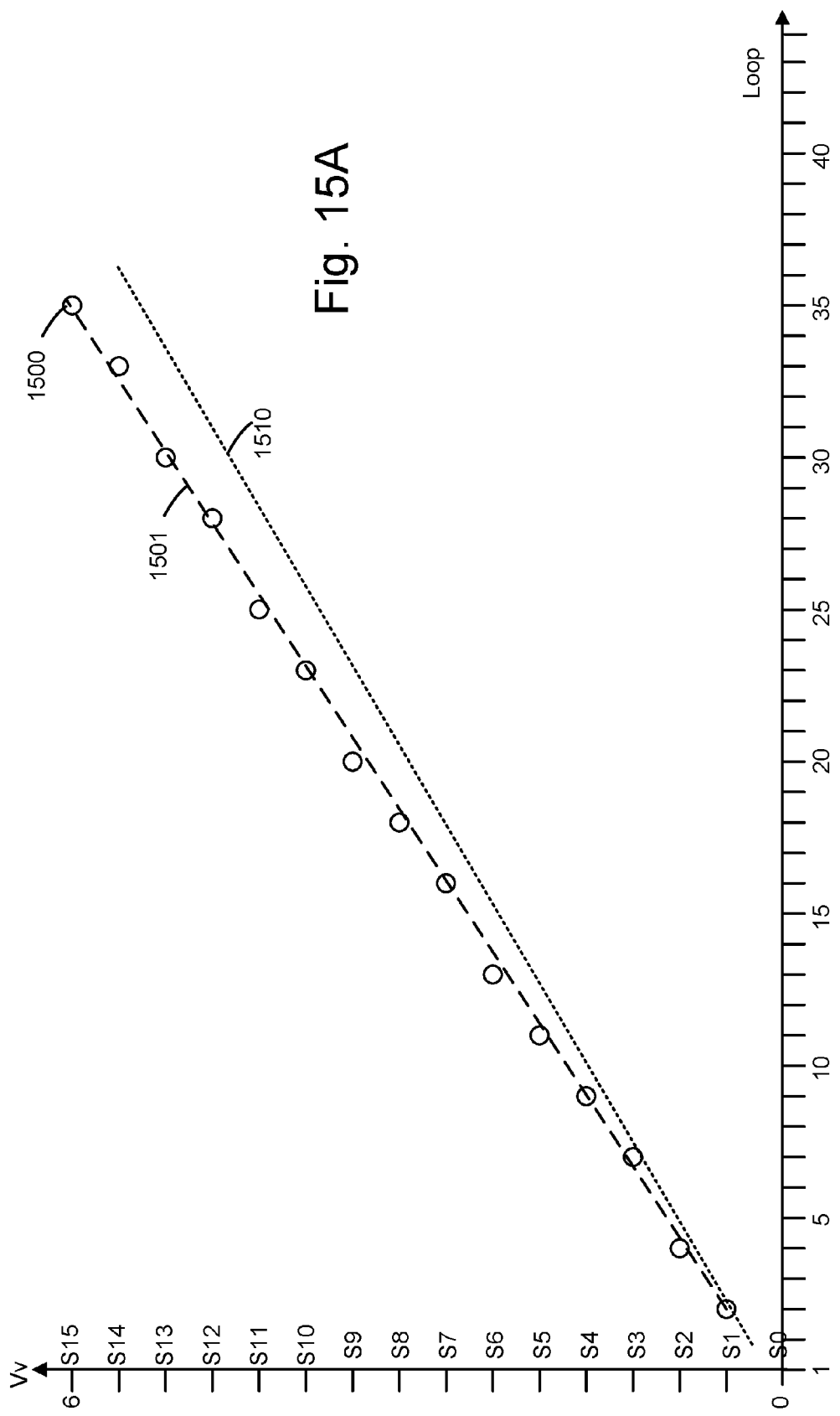

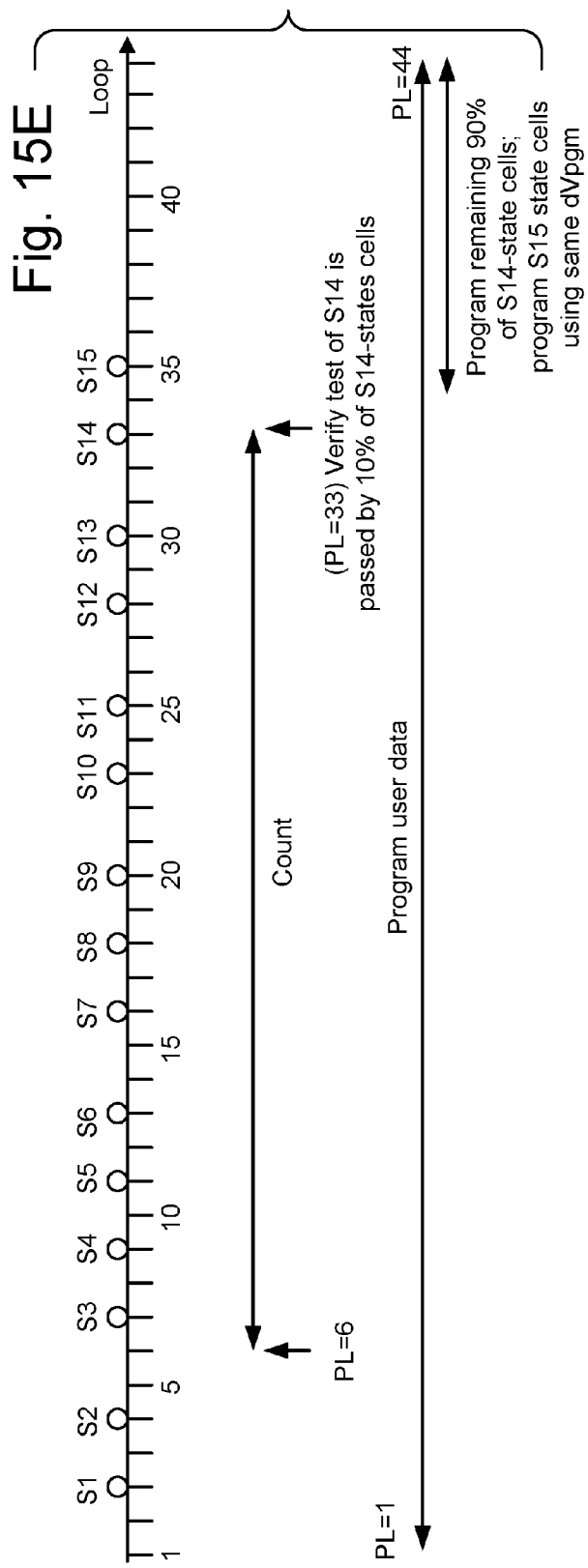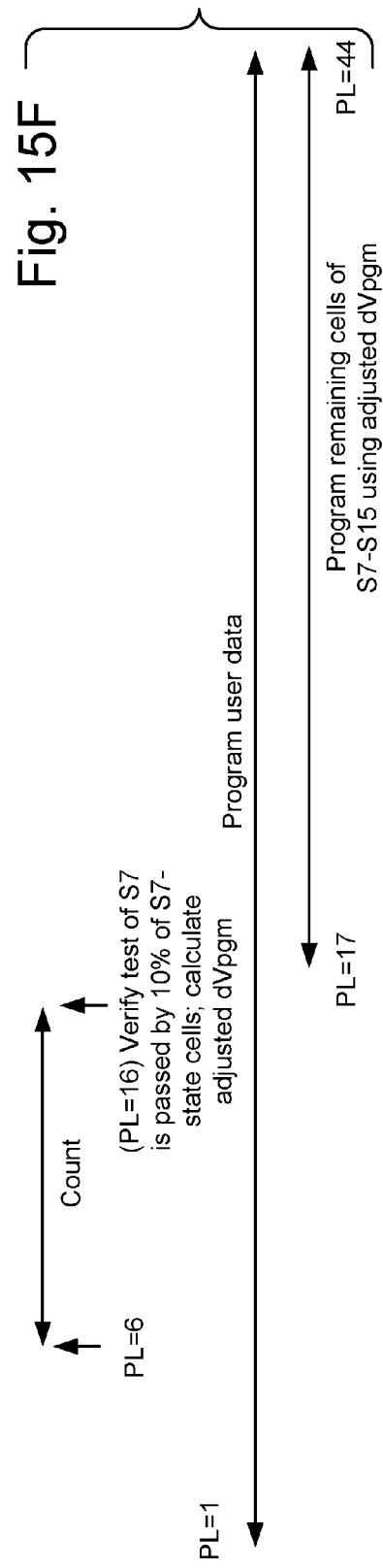

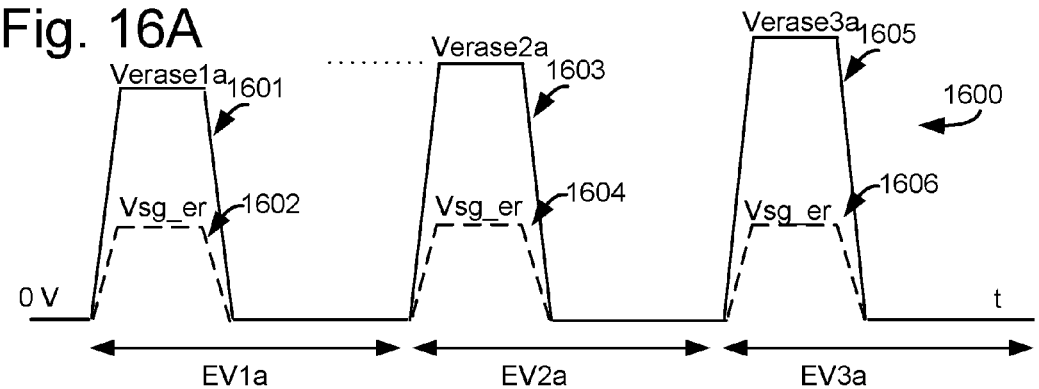
Fig. 16A
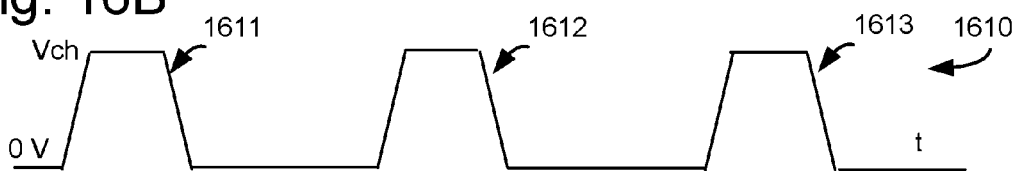
Fig. 16B
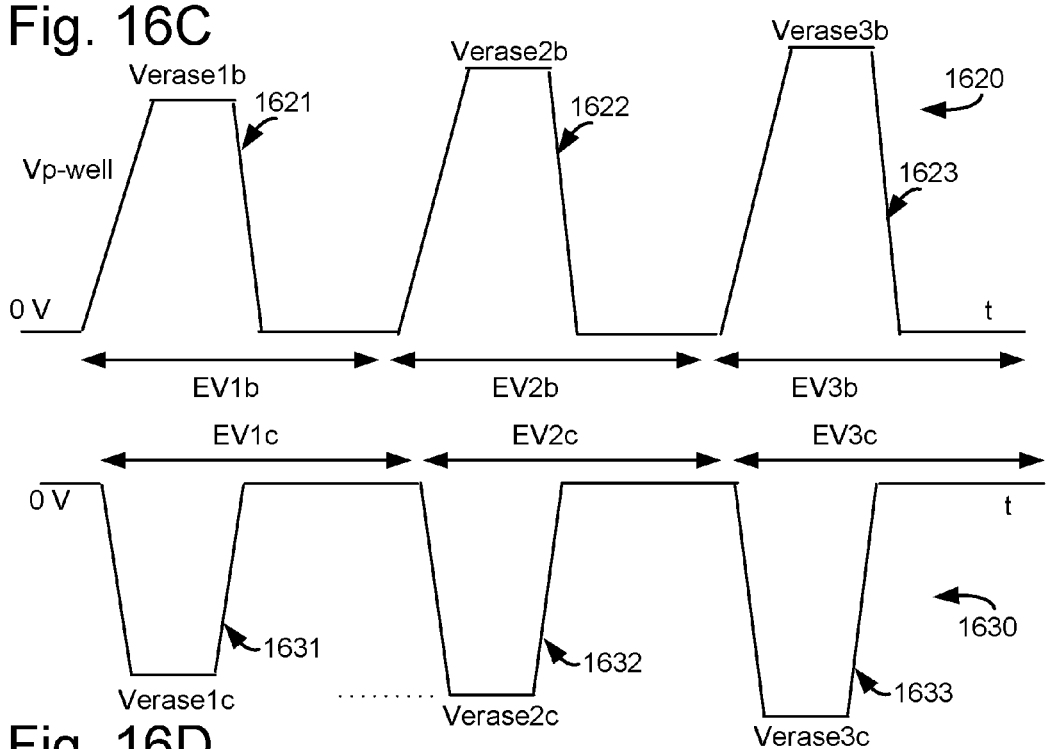
Fig. 16C
Fig. 16D
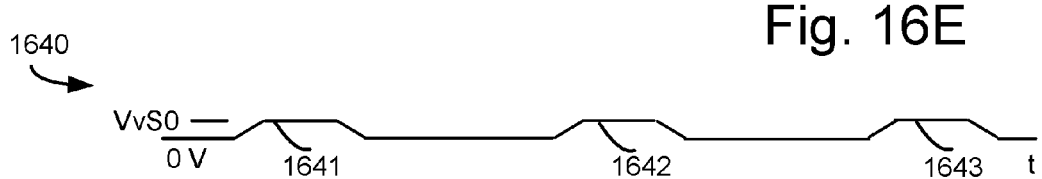
Fig. 16E

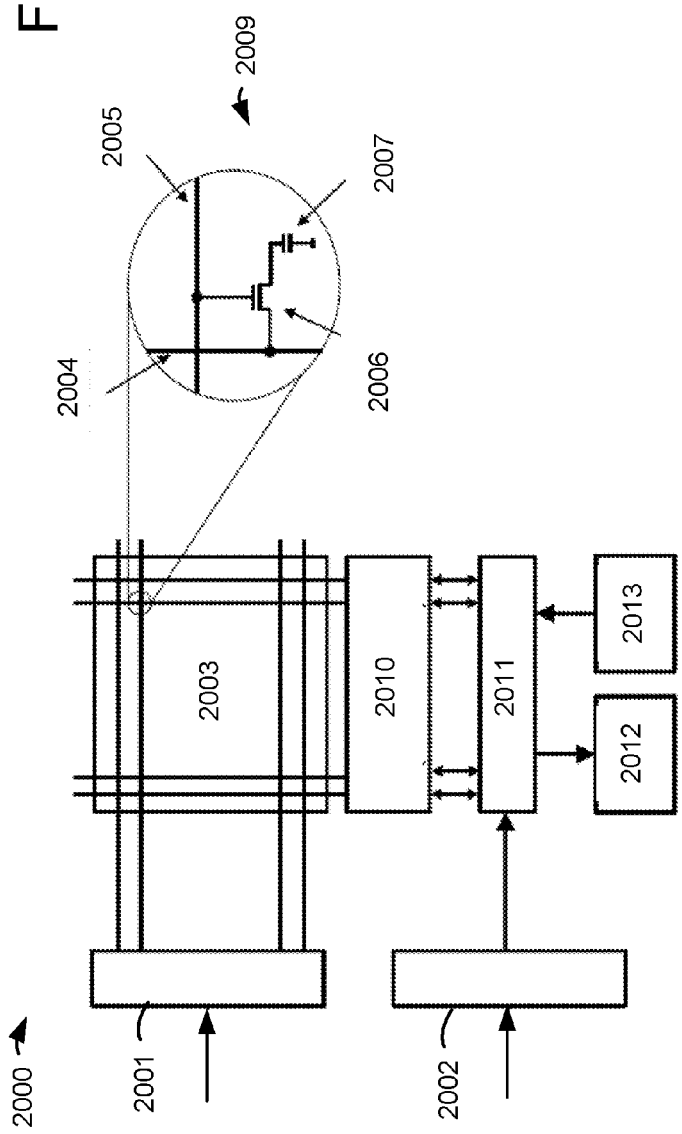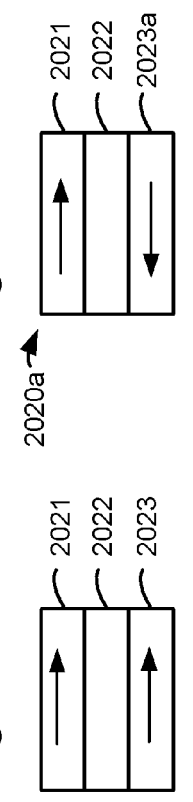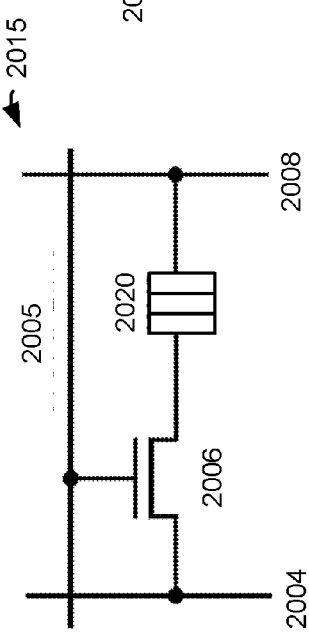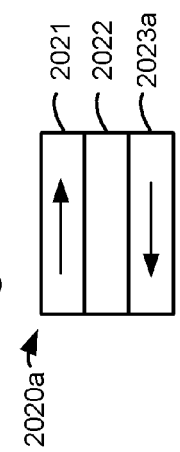

ADAPTIVE DETERMINATION OF PROGRAM PARAMETER USING PROGRAM OF ERASE RATE

BACKGROUND

The present technology relates to operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

However, various challenges are presented in operating such memory devices.

BRIEF DESCRIPTION OF THE DRAWINGS

FIG. 4 depicts an example cross-sectional view of a portion of one of the blocks of FIG. 5.

FIG. 5A depicts a plot of memory hole diameter versus height in the stack of FIG. 4, where the stack is fabricated in a single tier and groups of word lines G0, G1 and G2 having similar memory hole diameters are depicted.

FIG. 5B depicts a plot of memory hole diameter versus height in the stack of FIG. 4, where the stack is fabricated in two tiers and groups of word lines G4, G5 and G6 having similar memory hole diameters are depicted.

FIG. 6 depicts a close-up view of the region 622 of the stack of FIG. 4.

FIG. 7 depicts an example view of NAND strings in sub-blocks in a 3D configuration which is consistent with FIG. 5.

FIG. 8A depicts memory cells in the NAND strings in the sub-blocks SB0-SB3 of FIG. 7.

FIG. 8B depicts additional detail of the sub-blocks SB0-SB3 of FIG. 8A.

FIG. 8F depicts a program rate being determined from memory cells of a word line layer portion in SB0 and being applied to memory cells of other word line layer portions in the same sub-block and other sub-blocks, separately for each group of word line layers.

FIG. 9A depicts an example block diagram of a sense block SB0 in the circuits 128 of FIG. 1A.

FIG. 10E1 depicts a detailed example process for measuring a program rate of a set of memory cells to adjust a step size of a program voltage.

FIG. 10E2 depicts a detailed example process for measuring an erase rate of a set of memory cells to adjust a step size of an erase voltage.

FIG. 11A depicts a waveform of an example programming operation, consistent with FIGS. 10C and 10D, where user data is programmed while the program rate is evaluated.

FIG. 11B depicts a waveform of an example programming operation, consistent with FIGS. 10A and 10B, where user data is not programmed while the program rate is evaluated.

FIG. 12A depicts example threshold voltage (Vth) distributions of memory cells, where four data states are used and the effects of different program rates are shown.

FIG. 12B depicts example Vth distributions of memory cells, where four data states and two erase depths are used, consistent with FIG. 10B.

FIG. 12C depicts example Vth distributions of memory cells, where eight data states are used.

FIG. 12D depicts example Vth distributions of memory cells, where sixteen data states are used.

FIG. 13 depicts a chart of program loop number versus data state and verify voltage, showing which verify tests are performed in which program loop.

FIG. 14E depicts an example Vth distribution of cells which are subject to a verify test in an erase operation using a verify voltage of VvS0, where more than 10% of the cells have Vth<VvS0.

FIG. 14F depicts an example Vth distribution of cells which are subject to a verify test in an erase operation using a verify voltage of VvS0, where more than 90% of the cells have Vth<VvS0.

FIG. 14G depicts an example Vth distribution of cells which are subject to a verify test in a programming operation using a verify voltage of VvSi, where the number of cells (N) with a Vth greater than a specified portion (X %) is greater than Y>X %, consistent with step 1044a in FIG. 10E1.

FIG. 14H depicts a plot showing an increase in delta based on N.

FIG. 15A depicts a plot of verify voltage and data state versus program loop in a programming operation, consistent with FIGS. 10E1 and 13.

FIG. 15E depicts a time line showing when a count occurs for measuring a program rate, where a program loop to end the count is adaptively determined using a verify test of data state S14 as PL=33, the S14-state cells are subject to this verify test, user data is programmed and the same dVpgm is used in a remainder of the programming.

FIG. 15F depicts a time line showing when a count occurs for measuring a program rate, where a program loop to start the count is predetermined as PL=6 and a program loop to end the count is adaptively determined using a verify test of data state S7 as PL=16, where the S7-state cells are subject to this verify test, user data is programmed, and an adjusted Vpgm is used in a remainder of the programming.

FIG. 16A depicts example voltages in an erase operation which uses gate-induced drain leakage (GIDL) to charge up the channel of a NAND string.

FIG. 16B depicts an example channel voltage consistent with FIG. 16A.

FIG. 16C depicts example erase voltages in an erase operation which applies a positive voltage to a p-well of a substrate.

FIG. 16D depicts example erase voltages in an erase operation which applies a negative voltage to the word lines in a block.

FIG. 16E depicts example verify voltages in an erase operation.

FIG. 20A depicts a memory device comprising an array of DRAM memory cells.

FIG. 20B depicts an STT-RAM (spin-transfer torque, random access memory) memory cell which can replace the DRAM cell of FIG. 20A.

FIG. 20C depicts the magnetic tunnel junction (MTJ) 2020 of FIG. 20B in a parallel alignment.

FIG. 20D depicts the magnetic tunnel junction (MTJ) of FIG. 20B in an anti-parallel alignment.

DETAILED DESCRIPTION

Figure 1:
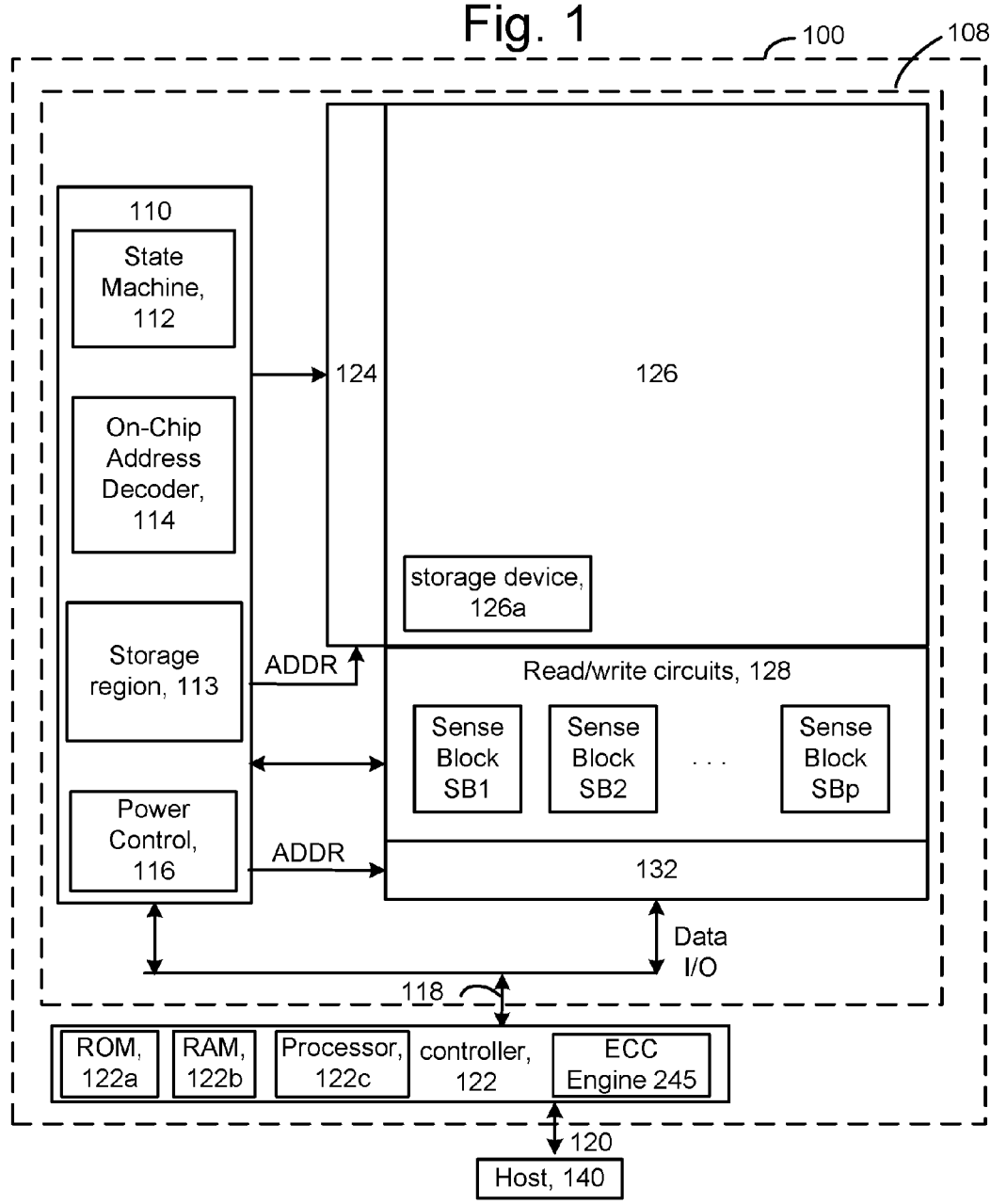
FIG. 1 is a block diagram of an example memory device.

Techniques are provided for optimizing the programming of a memory device. A corresponding memory device is also provided.

In some memory devices, a charge-storing material such as a floating gate or a charge-trapping material is used to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. Other types of memory structures include resistance-switching memories such as ReRAM cross-point memories, magnetoresistive memory (e.g., MRAM and STT-RAM), and phase change memory (e.g., PCRAM).

A memory device can include memory cells which are arranged in strings, for instance, where select gate transistors are provided at the ends of the string to selectively connect a channel of the string to a source line or bit line.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control line (e.g., word line) which acts a control gate. A set of word lines extends from the source side of a block to the drain side of a block.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in channel gradient.

During a programming operation, in one embodiment, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of program voltages which are applied to the word line in respective program loops or program-verify iterations, such as depicted in FIGS. 11A and 11B. The program voltages may increase by a step size. Verify operations may be performed after each application of the program voltage to the word line to determine whether the memory cells have completed programming. When programming is completed for a memory cell, it can be locked out from further programming passes while programming continues for other memory cells in subsequent program loops.

Other examples of programming operations are described, e.g., in connection with FIG. 17-20D. Generally, programming operations can involve applying one or more pulses, e.g., voltage or current pulses, to a memory cell.

The memory cells may also be programmed according to a sub-block programming order, where memory cells in one sub-block, or portion of a block, are programmed before programming memory cells in another sub-block.

Each memory cell may be associated with a data state according to write data (user data) associated with a program command. Based on its data state, a memory cell will either remain in the erased state or be programmed to a data state (a programmed data state) different from the erased state. For example, in a two-bit per cell memory device, there are four data states including the erased state and three higher data states, referred to as the S1, S2 and S3 data states (see FIG. 12A). In a three-bit per cell memory device, there are eight data states including the erased state and seven higher data states referred to as the S0, S1, S2, S3, S4, S5, S6 and S7 data states (see FIG. 12C). In a four-bit per cell memory device, there are sixteen data states including the erased state and fifteen higher data states referred to as the S0, S1, S2, S3, S4, S5, S6, S7, S8, S9, S10, S11, S12, S13, S14 and S15 data states (see FIG. 12D).

During a programming operation, the program rate of the memory cells should be close to a target rate, e.g., an ideal program rate. The program rate represents an increase in the Vth of a memory cell over time. The program rate is a function of the increase in the amount of additional stored charge with each program voltage. However, even when the step size of the program voltage is at a specified level, the program rate can vary from die to die, block to block and even word line to word line due to variations in the fabrication process of the memory device. The program rate can also be a function of memory hole diameter, ambient temperature, and the number of program-erase (PE) cycles of the memory device. A large variation in the program rate reduces the overall performance of the memory device. When the program rate is higher than the target rate, the amount of program noise is increased Vth distributions are widened. When the program rate is lower than the target rate, the programming time is increased above a desired time.

Techniques provided herein address the above and other issues. In one aspect, a rate of change of a characteristic (e.g., a program or erase rate) of a set of memory cells is determined during a program or erase operation. For example, the program rate of a set of memory cells can be determined while programming the cells with an initial step size. An adjustment is then made to a programming parameter based on the rate of change of the characteristic. For example, the programming parameter can be a step size, pulse duration, pulse magnitude, initial voltage, or bit line voltage.

In one approach, the step size is adjusted based on ratio of a target rate to the determined rate. When the program rate is below a target rate, the step size is increased. When the program rate is above a target rate, the step size is decreased. In one aspect, the memory cells are subject to verify tests of different data states, and a count of program voltages is recorded when a specified portion of the memory cells pass the verify test, e.g., have a Vth which exceeds a verify voltage. At the end of the programming, a straight line fit is made of data points which each include one of the verify voltages and a corresponding one of the counts. A slope of this line is a metric of the program rate. Various aspects include delaying the counting until the cells have reached a steady state condition, programming user data during the determination of the program rate, and using the adjusted step size in programming of another set of cells such as in another word line or sub-block. In another aspect, the adjusted step size is determined partway through the programming of the set of cells and used in a remaining programming of the set of cells.

Various other features and benefits are described below.

FIG. 1 is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for storing counts of program loops, step sizes and other parameters as described herein to measure and adjust a program rate of a set of memory cells.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the flowchart of FIG. 10. For example, a control circuit may include any one of, or a combination of, control circuitry 110, state machine 112, decoders 114/132, power control module 116, sense blocks SB1, SB2, . . . , SBp, read/write circuits 128, controller 122, and so forth. See FIGS. 9A and 9B for examples of the sense blocks.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 2:
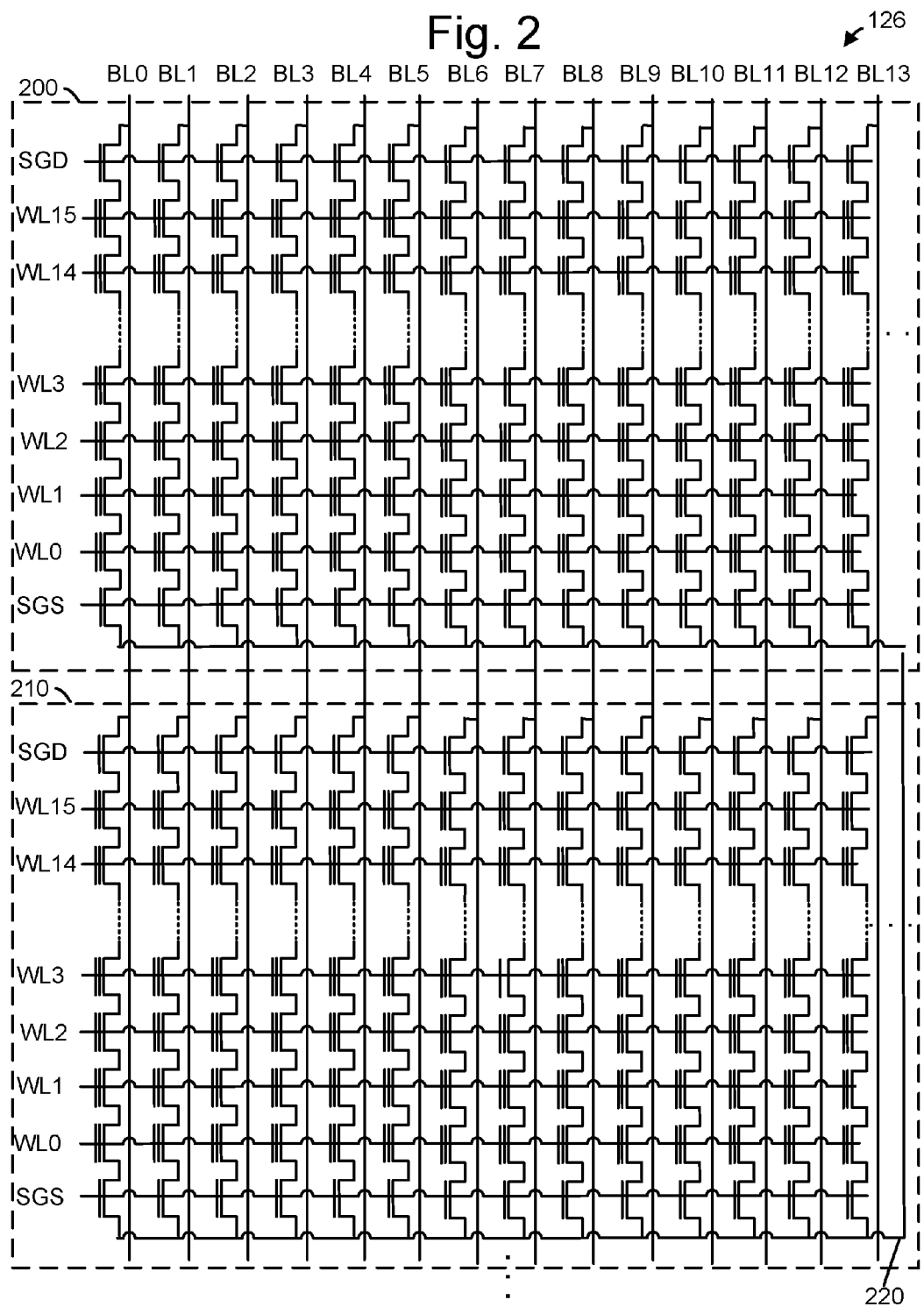
FIG. 2 depicts blocks of memory cells in an example two-dimensional configuration of the memory structure 126 of FIG. 1.

FIG. 2 depicts blocks of memory cells in an example two-dimensional configuration of the memory structure 126 of FIG. 1. The memory structure can include many blocks. Each example block 200, 210 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. Other types of non-volatile memory can also be used. For example, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 3:
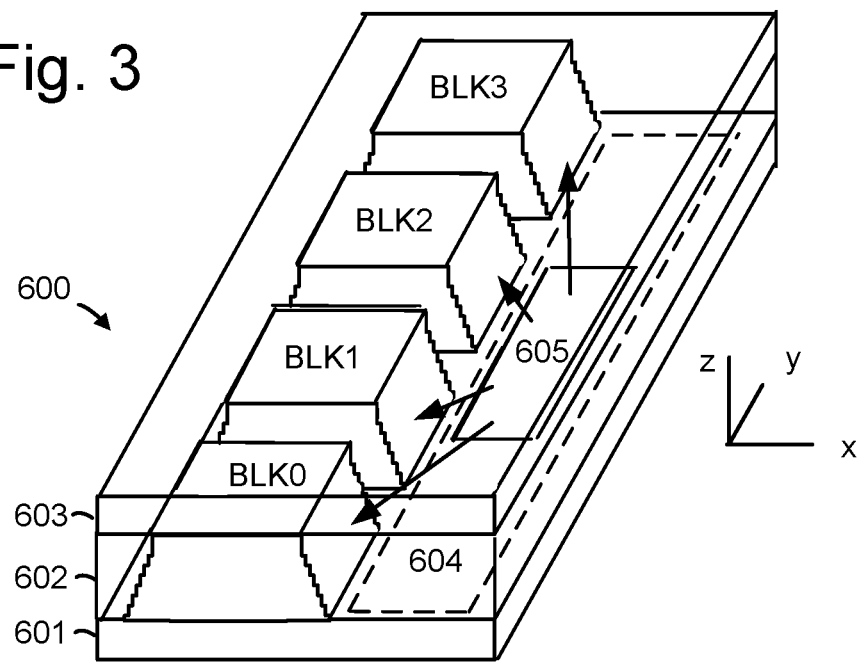
FIG. 3 is a perspective view of a memory device 600 comprising a set of blocks in an example three-dimensional configuration of the memory structure 126 of FIG. 1.

FIG. 3 is a perspective view of a memory device 600 comprising a set of blocks in an example three-dimensional configuration of the memory structure 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

FIG. 4 depicts an example cross-sectional view of a portion of one of the blocks of FIG. 5. The block comprises a stack 610 of alternating conductive and dielectric layers. In this example, the conductive layers comprise two SGD layers, two SGS layers and four dummy word line layers WLD1, WLD2, WLD3 and WLD4, in addition to data word line layers (word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

FIG. 5A depicts a plot of memory hole diameter versus height in the stack of FIG. 4, where the stack is fabricated in a single tier and groups of word lines G0, G1 and G2 having similar memory hole diameters are depicted. The vertical axis is aligned with the stack of FIG. 4 and depicts a width (wMH), e.g., diameter, of the memory holes 618 and 619. This is also a width of the pillar which is formed by the materials within the memory hole.

In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole, e.g., along a height of the stack. Typically, the diameter becomes progressively smaller from the top to the bottom of the memory hole (solid line in FIG. 5A). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line in FIG. 5A). For example, the memory hole width is a maximum at the level of WL9 in the stack, in this example. The memory hole width is slightly smaller at the level of WL10, and progressively smaller at the levels of WL8 to WL0.

Groups of word lines can be defined which are adjacent to a similar memory hole width. For example, a group G0 includes WLL0-WLL2, a group G1 includes WLL3-WLL6 and a group G2 includes WLL7-WLL10. In this example, each group comprises a set of adjacent word lines.

FIG. 5B depicts a plot of memory hole diameter versus height in the stack of FIG. 4, where the stack is fabricated in two tiers and groups of word lines G4, G5 and G6 having similar memory hole diameters are depicted. In another possible implementation, represented by the short dashed line, the stack is fabricated in two (or more) tiers. The bottom tier is formed first with a respective memory hole. The next tier, e.g., the top tier, is then formed with a respective memory hole which is aligned with the memory hole in the bottom tier. Each memory hole is tapered such that a double tapered memory hole is formed in which the width increases, then decreases and increases again, moving from the bottom of the stack to the top.

Groups of word lines can be defined which are adjacent to a similar memory hole width. For example, a group G4 includes WLL0, WLL1, and WLL8-WLL10, a group G5 includes WLL2-WLL4 and a group G6 includes WLL5-WLL7. In this example, G4 includes both adjacent and non-adjacent word lines. That is, G4 has two portions which are separated by at least one other group. G5 and G6 include only adjacent word lines.

Due to the non-uniformity in the width of the memory hole, the programming and erase rates of the memory cells can vary based on their position along the memory hole, e.g., based on their height in the stack. With a smaller diameter memory hole, the electric field across the tunnel oxide is relatively stronger, so that the programming and erase rate is relatively higher. However, memory cells within a group can be expected to have similar programming rates. As discussed further below, an adjusted step size is determined by measuring the program rate of a set of cells of one word line and can be used in programming a set of cells of another word line in the same group. For the next group, another adjusted step size and be determined and applied.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to (e.g., with an increase in) the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Although the example memory system discussed above is a three dimensional memory structure that includes vertical NAND strings with charge-trapping material, other (2D and 3D) memory structures can also be used with the technology described herein. For example, floating gate memories (e.g., NAND-type and NOR-type flash memory), ReRAM cross-point memories, magnetoresistive memory (e.g., MRAM), and phase change memory (e.g., PCRAM) can also be used.

One example of a ReRAM cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature. See also FIG. 17-19B.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. See also FIG. 20A-20D.

Another example of a memory is a spin transfer torque random access memory (STT-RAM). An STT-RAM cell uses a Magnetic Tunnel Junction (MTJ) to store binary data. An MTJ comprises two ferromagnetic layers and one tunnel barrier layer. The two ferromagnetic layers are called the reference layer and the free layer. The magnetic direction of the reference layer remains fixed, while the magnetic direction of the free layer can be parallel or anti-parallel, which is used to represent the binary data stored in the cell.

The magnetic direction of the free layer determines the electrical resistance of the device which is used to read the data stored in the cell. As shown in FIG. 3(b), when the magnetic field of the free layer and reference layer are parallel (i.e., aligned in the same direction), the MTJ resistance is low, representing a logical 0; and when they are anti-parallel to each other (i.e., aligned in the opposite direction), the MTJ resistance is high, representing a logical 1.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

FIG. 7 depicts an example view of NAND strings in sub-blocks in a 3D configuration which is consistent with FIG. 5. The NAND strings 700, 710, 720 and 730 have memory cells connected to word lines WL0-WL10. In a block BLK, each sub-block comprises a set of NAND strings which extend in the x direction and which have a common SGD line, e.g., SGD0, SGD1, SGD2 or SGD3. In this simplified example, there is only one SGD transistor and one SGS transistor in each NAND string. The NAND strings 700, 710, 720 and 730 are in sub-blocks SB0, SB1, SB2 and SB3, respectively. Programming of the block may occur one sub-block at a time. For example, a sub-block programming order may be: 1) SB0, 2) SB1, 3) SB2 and 4) SB3. Within each sub-block, a word line programming order may be followed, e.g., starting at WL0, the source-side word line and proceeding one word line at a time to WL10, the drain-side word line.

Bit lines which extend in the y direction are connected to sets of NAND string. A sense circuit is connected to each bit line. For example, sense circuits 740, 741, 742, 743, 744, 745, 746 and 747 are connected to BL0, BL1, BL2, BL3, BLn-3, BLn-2, BLn-1 and BLn, respectively. During programming of memory cells of a selected word line in SB0, each NAND string will have a respective bit line which is set to a program or lockout status by the respective sense circuit. During sensing, e.g., reading or verifying, of memory cells of a selected word line in SB0, a current in each NAND string will be sensed by the respective sense circuit.

FIG. 8A depicts memory cells in the NAND strings in the sub-blocks SB0-SB3 of FIG. 7. The sub-blocks are based generally on the structure of FIG. 4. The conductive layers in the stack are depicted for reference at the left hand side. Each sub-block includes multiple NAND strings, where one example NAND string is depicted. For example, SB0, SB1, SB2 and SB3 comprise example NAND string 700, 710, 720 and 730, respectively.

NAND string 700 include SGS transistor 800, data memory cells 801, 802, 803, 804, 805, 806, 807, 808, 809, 810 and 811, and SGD transistor 818. NAND string 710 include SGS transistor 820, data memory cells 821, 822, 823, 824, 825, 826, 827, 828, 829, 830 and 831, and SGD transistor 838. NAND string 720 include SGS transistor 840, data memory cells 841, 842, 843, 844, 845, 846, 847, 848, 849, 850 and 851, and SGD transistor 858. NAND string 730 include SGS transistor 860, data memory cells 861, 862, 863, 864, 865, 866, 867, 868, 869, 870 and 871, and SGD transistor 878.

The programming of the block may occur sub-block by sub-block. For example, SB0 may be programmed from WLL0-WLL10, then SB1 may be programmed from WLL0-WLL10, then SB2 may be programmed from WLL0-WLL10 and then SB3 may be programmed from WLL0-WLL10.

FIG. 8B depicts additional detail of the sub-blocks SB0-SB3 of FIG. 8A. Example memory cells are depicted which extend in the x direction along word line in each sub-block. Each memory cell is depicted as a cube for simplicity. Additionally, the groups G0, G1 and G2 of FIG. 5A are provided. SB0 includes NAND strings 700, 701, 702 and 703. SB1 includes NAND strings 710, 711, 712 and 713. SB2 includes NAND strings 720, 721, 722 and 723. SB3 includes NAND strings 730, 731, 732 and 733. SB0 includes a set 704 of memory cells connected to WLL0 and a set 705 of memory cells connected to WLL1. These sets are in adjacent word lines and are both in G0, so their memory hole diameters are similar. An adjusted step size can be determined for the set 704 and used for programming of the set 705 as well as remaining sets in G0. In this case, the block is a multi-layer memory block comprising sub-blocks SB0, SB1, SB2 and SB3; memory cells of the multi-layer memory block are arranged along memory holes which extend vertically in the multi-layer memory block; diameters of the memory holes vary along a height of the multi-layer memory block; a set of memory cells (e.g., the set 704 of cells) is arranged in one layer (e.g., WLL0) in one of the sub-blocks (e.g., SB0); and the adjusted step size is used in programming memory cells (e.g., the set 705 of cells) in an adjacent layer (e.g., WLL1) of the one of the sub-blocks, the adjacent layer is adjacent to the one layer.

Similarly, the adjusted step size can be used for programming sets 714, 724 and 734 of memory cells in SB1, SB2 and SB3, respectively. In this case, the adjusted step size is used in programming of sets of memory cells (e.g., the sets 714, 724 and 734) in the one layer (e.g., WLL0) in another of the sub-blocks (e.g., SB1, SB2 and SB3).

Figure 8C:
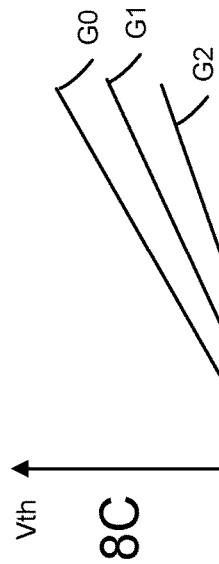
FIG. 8C depicts a change in median Vth versus a program voltage, Vpgm, for memory cells in G0, G1 and G2 of FIG. 8B.

FIG. 8C depicts a change in median Vth versus a program voltage, Vpgm, for memory cells in G0, G1 and G2 of FIG. 8B. This shows how the program rate is a function of the diameter of the memory hole and therefore a function of the group of word line layers. The program rate is higher for G0 than for G1 and G2 because the diameter of the memory hole is smaller for G0 than for G1 and G2. Generally, the memory hole diameter is consistent for a given word line layer in different sub-blocks so the program rate for the cells of a given word line layer should be consistent.

Figure 8E:
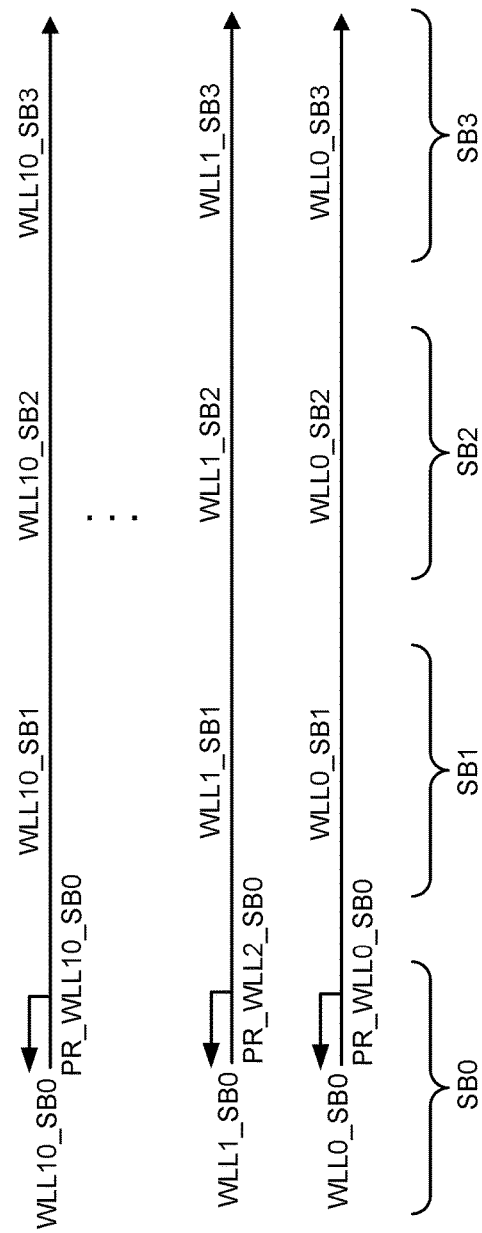
FIG. 8E depicts a program rate being determined from memory cells of a word line layer portion in SB0 and being applied to memory cells of other word line layer portions in other sub-blocks, separately for each word line layer.
Figure 8D:
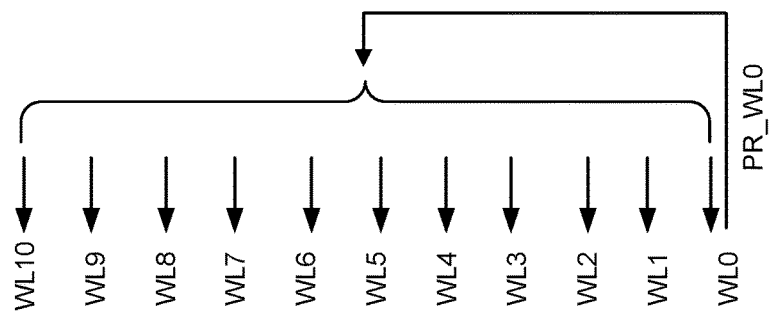
FIG. 8D depicts a program rate PR_WL0 being determined from memory cells of WL0 and being applied to memory cells of WL0 and other word lines in a block, e.g., WL1-WL10.

FIG. 8D depicts a program rate PR_WL0 being determined from memory cells of WL0 and being applied to memory cells of WL0 and other word lines in a block, e.g., WL1-WL10. This approach may apply when the cells of the different word lines are expected to have a similar program rate.

FIG. 8E depicts a program rate being determined from memory cells of a word line layer portion in SB0 and being applied to memory cells of other word line layer portions in other sub-blocks, separately for each word line layer. For example, for the word line layer WLL0 in sub-block SB0 (WLL0_SB0), the program rate PR_WLL0_SB0 is determined and applied in programming of cells in WLL0_SB0, WLL0_SB1, WLL0_SB2 and WLL0_SB3. Alternatively, the program rate could be determined from any of the sub-blocks and applied to other sub-blocks, for a given word line layer. For the word line layer WLL1 in sub-block SB0 (WLL1_SB0), the program rate PR_WLL1_SB0 is determined and applied in programming of cells in WLL1_SB0, WLL1_SB1, WLL1_SB2 and WLL1_SB3. For the word line layer WLL10 in sub-block SB0 (WLL10_SB0), the program rate PR_WLL10_SB0 is determined and applied in programming of cells in WLL10_SB0, WLL10_SB1, WLL10_SB2 and WLL10_SB3.

FIG. 8F depicts a program rate being determined from memory cells of a word line layer portion in SB0 and being applied to memory cells of other word line layer portions in the same sub-block and other sub-blocks, separately for each group of word line layers. For example, for the word line layers WLL0-WLL2 in G0, the program rate PR_WLL0_SB0 is determined from a word line layer portion in one sub-block, e.g., WLL0_SB0, and applied in programming of cells in each of the sub-blocks of G0, e.g., WLL0_SB0, WLL0_SB1, WLL0_SB2, WLL0_SB3; WLL1_SB0, WLL1_SB1, WLL1_SB2, WLL1_SB3; and WLL2_SB0, WLL2_SB1, WLL2_SB2, WLL2_SB3.

For the word line layers WLL3-WLL6 in G1, the program rate PR_WLL3_SB0 is determined from a word line layer portion in one sub-block, e.g., WLL3_SB0, and applied in programming of cells in each of the sub-blocks of G1, e.g., WLL3_SB0, WLL3_SB1, WLL3_SB2, WLL3_SB3; WLL4_SB0, WLL4_SB1, WLL4_SB2, WLL4_SB3; WLL5_SB0, WLL5_SB1, WLL5_SB2, WLL5_SB3; and WLL6_SB0, WLL6_SB1, WLL6_SB2, WLL6_SB3.

For the word line layers WLL7-WLL10 in G2, the program rate PR_WLL7_SB0 is determined from a word line layer portion in one sub-block, e.g., WLL7_SB0, and applied in programming of cells in each of the sub-blocks of G2, e.g., WLL7_SB0, WLL7_SB1, WLL7_SB2, WLL7_SB3; WLL8_SB0, WLL8_SB1, WLL8_SB2, WLL8_SB3; WLL9_SB0, WLL9_SB1, WLL9_SB2, WLL9_SB3; and WLL10_SB0, WLL10_SB1, WLL10_SB2, WLL10_SB3.

FIG. 9A depicts an example block diagram of a sense block SB0 in the circuits 128 of FIG. 1A. The circuits can include multiple sense blocks, where each sense block performs sensing, e.g., read, operations for multiple memory cells via respective bit lines.

In one approach, a sense block comprises multiple sense circuits, also referred to as sense amplifiers. Each sense circuit is associated with data latches and caches. For example, the example sense circuits 950a, 951a, 952a and 953a are associated with caches 950c, 951c, 952c and 953c, respectively.

In one approach, different subsets of bit lines can be sensed using different respective sense blocks. This allows the processing load which is associated with the sense circuits to be divided up and handled by a respective processor in each sense block. For example, a sense circuit controller 960 can communicate with the set, e.g., sixteen, of sense circuits and latches. The sense circuit controller may include a pre-charge circuit 961 which provides a voltage to each sense circuit for setting a pre-charge voltage. In one possible approach, the voltage is provided to each sense circuit independently, e.g., via the data base 903 and a local bus such as LBUS1 or LBUS2 in FIG. 9B. In another possible approach, a common voltage is provided to each sense circuit concurrently, e.g., via the line 905 in FIG. 9B. The sense circuit controller may also include a memory 962 and a processor 963. Further example details of the sense circuit controller and the sense circuits 950a and 951a are provided below.

Figure 9B:
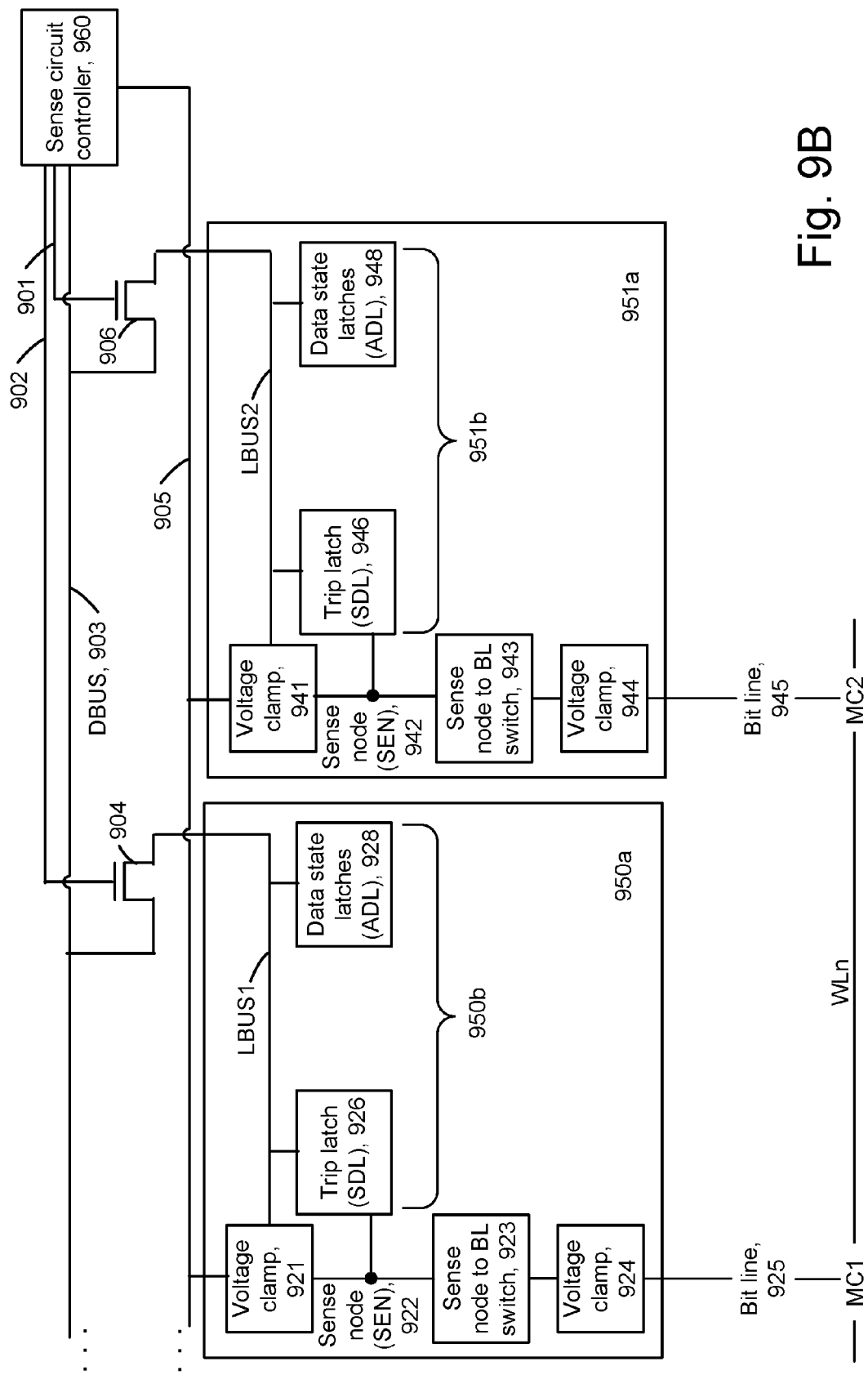
FIG. 9B depicts example details of the sense circuits 950a and 951a of FIG. 9A.

FIG. 9B depicts example details of the sense circuits 950a and 951a of FIG. 9A. The sense circuit controller 960 communicates with multiple sense circuits including example sense circuits 950a and 951a, also shown in FIG. 9A. The sense circuit 950a includes latches 950b, including a trip latch 926 (SDL), and data state latches 928 (ADL). The sense circuit further includes a voltage clamp 921 such as a transistor which sets a pre-charge voltage at a sense node 922 (SEN). A sense node-to-bit line (BL) switch 923 selectively allows the sense node to communicate with a bit line 925, e.g., the sense node is electrically connected to the bit line so that the sense node voltage can decay. The bit line 925 is connected to one or more memory cells, such as a memory cell MC1. A voltage clamp 924 can set a voltage on the bit line, such as during a sensing operation or during a program voltage. A local bus, LBUS1, allows the sense circuit controller to communicate with components in the sense circuit, such as the latches 950b and the voltage clamp in some cases. To communicate with the sense circuit 950a, the sense circuit controller provides a voltage via a line 902 to a transistor 904 to connect LBUS1 with a data bus DBUS, 903. The communicating can include sending data to the sense circuit and/or receive data from the sense circuit.

The sense circuit controller can communicate with different sense circuits in a time-multiplexed manner, for instance. A line 905 may be connected to the voltage clamp in each sense circuit, in one approach.

The sense circuit 951a includes latches 951b, including a trip latch 946 (SDL) and data state latches 948 (ADL). A voltage clamp 941 may be used to set a pre-charge voltage at a sense node 942 (SEN). A sense node-to-bit line (BL) switch 943 selectively allows the sense node to communicate with a bit line 945, and a voltage clamp 944 can set a voltage on the bit line. The bit line 945 is connected to one or more memory cells such as a memory cell MC2. A local bus, LBUS2, allows the sense circuit controller to communicate with components in the sense circuit, such as the latches 951b and the voltage clamp in some cases. To communicate with the sense circuit 951a, the sense circuit controller provides a voltage via a line 901 to a transistor 906 to connect LBUS2 with DBUS. The lines 901 and 902 can be considered to be sense amplifier control (sac) lines as described in FIG. 9A.

The example memory cells MC1 and MC2 are connected to a selected word line WLn.

A cache may be associated with each sense circuit and connected to DBUS.

Figure 9C:
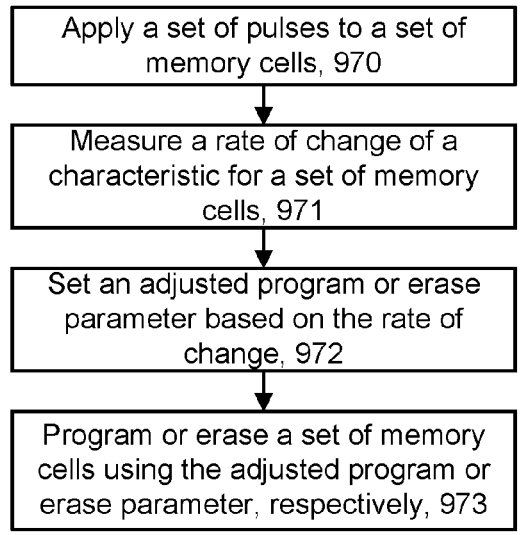
FIG. 9C depicts an example process for setting a program or erase parameter for a set of memory cells.

FIG. 9C depicts an example process for setting a program or erase parameter for a set of memory cells. Step 970 includes applying a set of pulses (e.g., voltages or currents) to a set of memory cells. Step 971 includes measuring a rate of change of a characteristic for the set of memory cells based on the applying of the pulses. For example, the characteristic can be a program or erase rate. Step 972 includes setting an adjusted program or erase parameter based on the rate of change. For example, the parameter can be a step size, pulse duration, pulse magnitude, initial voltage, or bit line voltage. These parameters can be adjusted for incremental step pulse programming or erasing, for instance. Pulse duration can be adjusted when pulses with a fixed magnitude are used. Pulse magnitude can be adjusted when pulses with a fixed duration are used. Step 973 includes programming or erasing a set of memory cells using the adjusted program or erase parameter, respectively. The set of memory cells of step 973 can be the same as in step 970 or different.

Figure 9D:
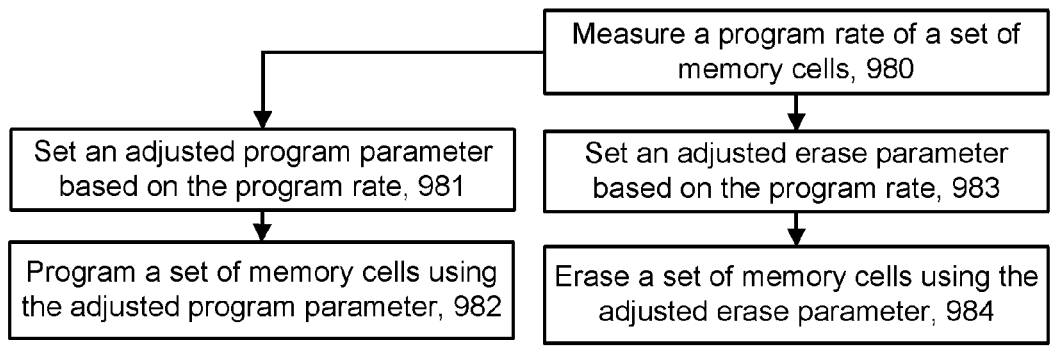
FIG. 9D depicts an example process for setting a program or erase parameter based on a program rate.

FIG. 9D depicts an example process for setting a program or erase parameter based on a program rate. Step 980 includes measuring a program rate of a set of memory cells. Step 981 sets an adjusted program parameter based on the program rate. Step 982 programs a set of memory cells using the adjusted program parameter. Step 983 sets an adjusted erase parameter based on the program rate. Step 984 erases a set of memory cells using the adjusted erase parameter. Generally, there is a correspondence between program rate and erase rate such that a set of cells that has a high program rate will also have a high erase rate.

Figure 9E:
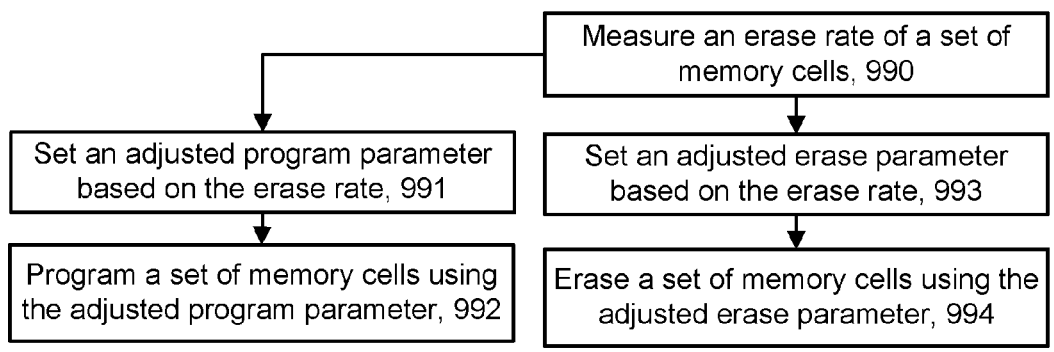
FIG. 9E depicts an example process for setting a program or erase parameter based on an erase rate.

FIG. 9E depicts an example process for setting a program or erase parameter based on an erase rate. Step 990 includes measuring an erase rate of a set of memory cells. Step 991 sets an adjusted program parameter based on the erase rate. Step 992 programs a set of memory cells using the adjusted program parameter. Step 993 sets an adjusted erase parameter based on the erase rate. Step 994 erases a set of memory cells using the adjusted erase parameter.

Figure 10A:
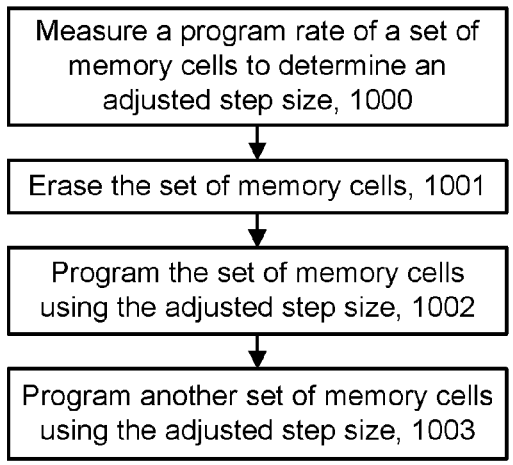
FIG. 10A depicts an example process for measuring a program rate of a set of memory cells to adjust a step size of a program voltage.

FIG. 10A depicts an example process for measuring a program rate of a set of memory cells to adjust a step size of a program voltage. A bock of memory may be initially erased. Step 1000 measures a program rate of a set of memory cells to determine an adjusted step size. The adjusted step size may be stored in a non-volatile storage location. The set of memory cells may be connected to a word line. Step 1001 erases the set of memory cells. For example, a block which includes the set of memory cells may be erased. Step 1002 programs the set of memory cells using the adjusted step size. Step 1003 programs another set of memory cells using the adjusted step size. The another set of memory cells can be connected to a same word line in a different sub-block or to another word line in the same sub-block or a different sub-block. Optionally, the erase is not performed and the word line is not used to store user data.

Figure 10B:
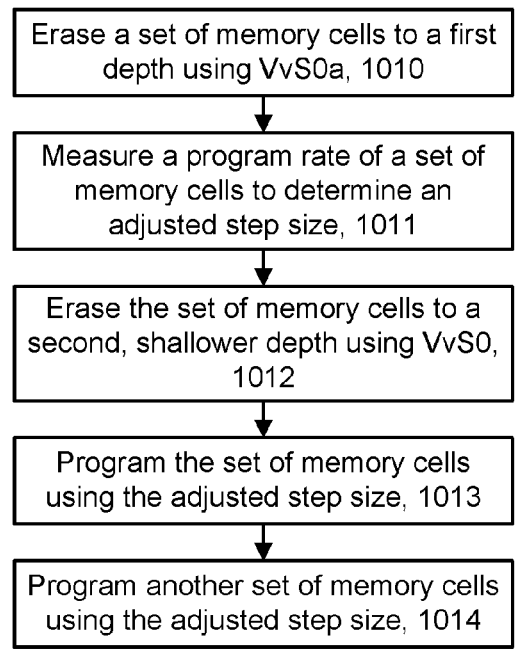
FIG. 10B depicts an example process for measuring a program rate of a set of memory cells to adjust a step size of a program voltage, where the set of memory cells is erased to different depths.

FIG. 10B depicts an example process for measuring a program rate of a set of memory cells to adjust a step size of a program voltage, where the set of memory cells is erased to different depths. Step 1010 includes erasing a set of memory cells to a first depth using an erase verify voltage of VvS0a. See FIG. 12B. Step 1011 measures a program rate of a set of memory cells to determine an adjusted step size. Step 1012 erases the set of memory cells to a second, shallower depth using an erase verify voltage of VvS0 (FIG. 12B). In this case, VvS0>VvS0a. Step 1013 programs the set of memory cells using the adjusted step size. Step 1014 programs another set of memory cells using the adjusted step size. By erasing the cells to a lower Vth, so that there is a larger gap between the erased state Vth and the verify levels of the programmed states, the program rate can be measured more accurately. This is because the cells do not reach a steady state program rate immediately during programming. After one or more program voltages are applied, the cells reach a steady state program rate. By erasing the cells to a lower Vth, the cells are more likely to reach a steady state condition by the time they are subject to verify tests which are used to determine the program rate. The second erase depth can be used subsequently to avoid extending the program time.

Similarly, the cells do not reach a steady state erase rate immediately during erasing. After one or more erase voltages are applied, the cells reach a steady state erase rate.

Figure 10C:
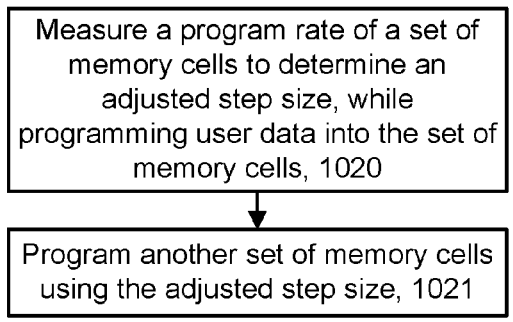
FIG. 10C depicts an example process for measuring a program rate of a set of memory cells to adjust a step size of a program voltage, while user data is programmed into the set of memory cells.

FIG. 10C depicts an example process for measuring a program rate of a set of memory cells to adjust a step size of a program voltage, while user data is programmed into the set of memory cells. In one approach, in FIGS. 10A and 10B, user data is not programmed into the set of memory cells during the measuring of the program rate. Instead, each cell may be programmed from the erased state to the highest state. That is, each memory cell in a set of memory cells can be programmed to a highest verify level of a plurality of different verify levels, or to a highest state of a plurality of different states. Step 1020 measures a program rate of a set of memory cells to determine an adjusted step size, while programming user data into the set of memory cells, as described further below. Step 1021 programs another set of memory cells using the adjusted step size. Generally, the programming progress of cells which are programmed to one or more relatively high data states (e.g., S3, S7 or S15 when there are three, seven or fifteen programmed states, respectively), can be tracked to measure program rate. Other cells can be programmed to one or more relatively low data states and locked out from further programming while the high state cells continue to be monitored.

Using the high state cells to determine the program rate is acceptable since they should represent the program rate of all of the cells in the set. Time savings are achieved by programming user data at the same time as determining the program rate, since a subsequent erase and re-programming can be omitted.

Figure 10D:
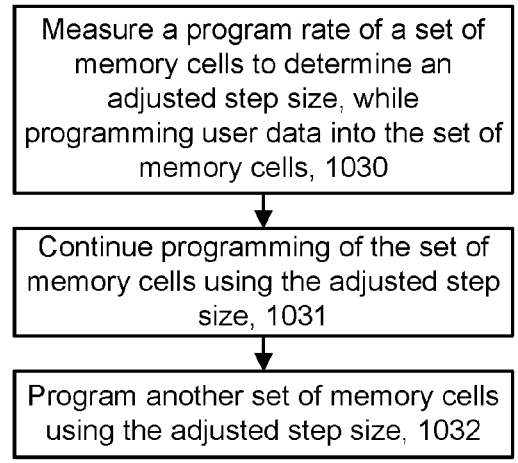
FIG. 10D depicts an example process for measuring a program rate of a set of memory cells to adjust a step size of a program voltage, and using the adjusted step size in continued programming of the set of memory cells.

FIG. 10D depicts an example process for measuring a program rate of a set of memory cells to adjust a step size of a program voltage, and using the adjusted step size in continued programming of the set of memory cells. In one approach, FIGS. 10A, 10B and 10C measure a program rate in a single program pass of a set of cells and use this to apply an adjusted step size in another program pass of the same set of cells or another set of cells. Step 1030 measures a program rate of a set of memory cells to determine an adjusted step size, while programming user data into the set of memory cells. Step 1031 continues the programming of the set of memory cells using the adjusted step size, as described further below. Step 1032 programs another set of memory cells using the adjusted step size.

Using the lower and midrange state cells to determine the program rate is acceptable since they should represent the program rate of all of the cells in the set. Time savings are achieved by programming user data at the same time as determining the program rate, since a subsequent erase and re-programming can be omitted. Additionally, the programming of the higher state cells is more accurate because the optimal adjusted step size is used.

FIG. 10E1 depicts a detailed example process for measuring a program rate of a set of memory cells to adjust a step size of a program voltage. At step 1040, a condition is met for evaluating the program rate of a set of memory cells. For example, this can occur when an ambient temperature is outside of a specified range (see step 1040a and FIG. 10D, when a number of program loops, e.g., program-verify iterations, is outside of a specified range (see step 1040b and FIG. 10K), or when a number of program-erase (PE) cycles exceeds a specified level (see step 1040c and FIG. 10J). Step 1041 initialize a program voltage (Vpgm) and sets an initial step size, dVpgm1. This step size can be, e.g., the step size which was most recently used for programming user data to the set of memory cells. Or, this step size can be smaller than the step size which was most recently used or smaller than a default step size. In one approach, the initial step size is smaller than the adjusted step size by at least 30%. Using a relatively small initial step size can provide a better resolution of the program rate.

Figure 13:
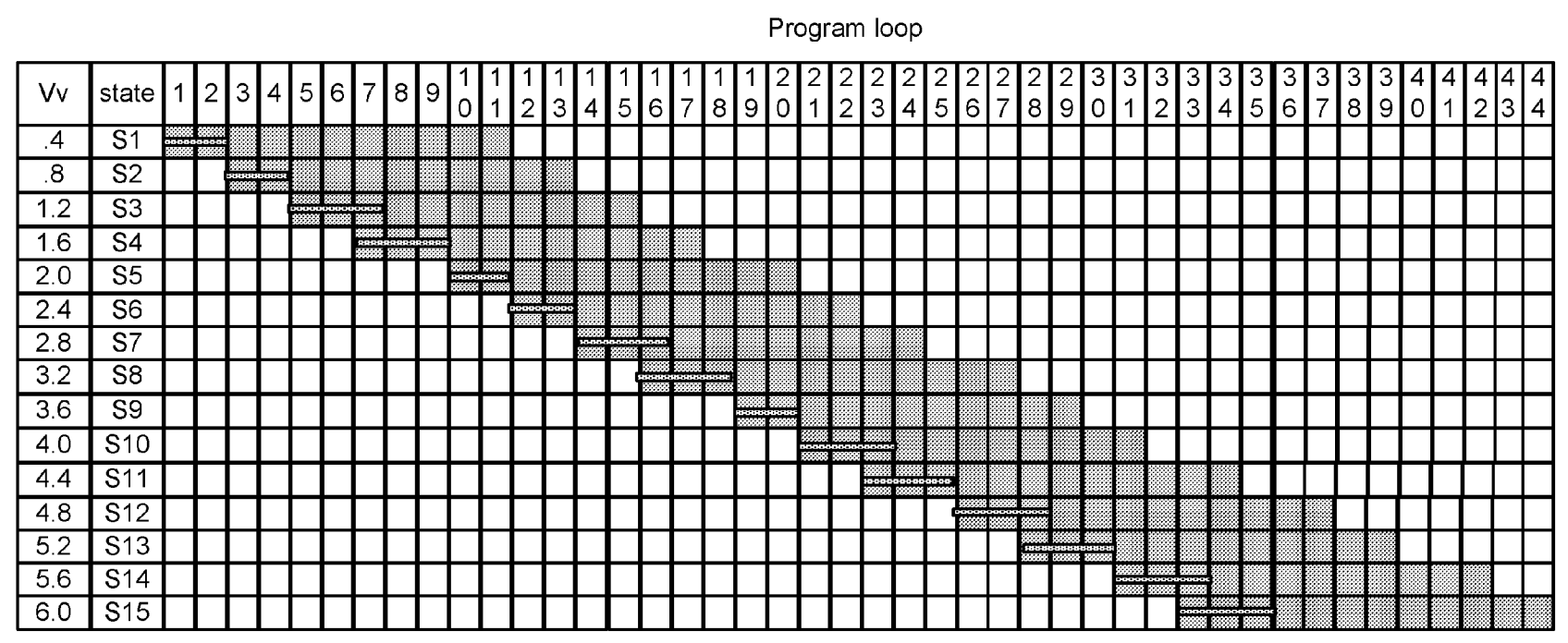

Step 1042 sets a count=1, assuming a condition is met to begin the count (step 1042a), as discussed. This is a count of program loops which are used in programming the cells to different verify levels. Step 1043 involves applying a program voltage to a word line which is connected to the set of memory cells. This step also includes sensing the Vth of the cells relative to one or more verify levels (voltages), VvS, of a set of data states. See, e.g., FIG. 13. Decision step 1044 determines whether Vth>VvS for at least a specified portion (X %) of the cells, e.g., 10%. See FIGS. 14A and 14B. If decision step 1044 is false, step 1047 increments Vpgm by dVpgm1, and the count is also incremented by one. A next program voltage is then applied at step 1043, in a next program loop. If decision step 1044 is true, step 1045 stores the count indexed to the verify level, for instance, or to the corresponding data state. In the example of FIG. 13, the counts=2, 4, 7, 9, 11, 13, 16, 18, 20, 23, 25, 28, 30, 33 and 35 are indexed to verify levels Vv=0.4, 0.8, 1.2, 1.6, 2.0, 2.4, 2.8, 3.2, 3.6, 4.0, 4.4, 4.8, 5.2, 5.6 and 6.0, respectively, or to the data states S0, S1, S2, S3, S4, S5, S6, S7, S8, S9, S10, S11, S12, S13, S14 and S15, respectively. The counts could also be indexed to a time or to program voltage.

An option at step 1044a is to increase the verify level by delta and repeat the sensing if the number or portion of cells with Vth>Vvs is too large, e.g., when at least Y % of the cells have Vth>Vvs and Y exceeds X by some margin. For example, Y may be 30% and X may be 10%. See also FIGS. 14G, 14H and 14I. This approach accounts for the fact that when the step size is large, the natural Vth distribution might overshoot the verify level by a significant amount. This can result in an inaccurate program rate detection. In one approach, the verify level is increased once and the subsequent sensing at VvSi+delta determines that fewer than Y % (but more than X %) of the cells have Vth>VvS. In this case, the current loop count is stored and associated with VvSi+delta instead of VvSi at step 1045. In another approach, the verify level is repeatedly increased until fewer than Y % (but more than X %) of the cells have Vth>VvS. The verify level should not be increased so much that fewer than X % of the cells have Vth>VvS. If this occurs, one option is to exclude the loop count and associated verify level from the program rate determination. Another option is use to the loop count and associated verify level from the program rate determination, if the number of cells with cells have Vth>VvS is close to X %. In a further approach, the verify level can be increase by an amount which is a function of (in proportion to) the number of cells N for which Vth>VvS. Thus, delta will be relatively larger when N is relatively larger. See FIG. 14H.

Decision step 1046 determines if the last count which is to be used in the evaluation of the program rate has been obtained. This last count is associated with a particular verify level and can be for the highest data state or an intermediate data state which is below the highest data state. For example, in FIG. 15B to 15D, the last count is for S15 and in FIG. 15E, the last count is for S14. If decision step 1046 is false, step 1047 increments Vpgm by dVpgm1, and the count is also incremented by one. If decision step 1046 is true, step 1048 obtains a metric of the program rate based on the stored counts. See FIG. 15A. For example, step 1048a may be used to calculate a straight line fit of data points. One example is to fit a straight line through the set of data points using a least squares fit which minimizes the sum of squared residuals.

The straight line can be defined by an equation y=mx+b. In the case of a plot of verify voltage versus loop count such as in FIG. 15A, y is the verify voltage, m is the slope of the line, e.g., the program rate, x is the loop count and b is an offset. The program rate has units of V/count in this example. If the loop count was replaced by the program voltage which was applied in the loop, the program rate has units of V/V.

A method can include determining a slope of a straight line fit of data points, each data point comprising one of the different verify levels and a corresponding one of the counts of the program voltage; and determining an adjustable programming parameter based on a ratio of a target slope or rate to the determined slope or rate.

Step 1049 determines an adjusted step size, dVpgm2 based on the metric. For example, dVpgm2=dVpgm1×target metric/obtained metric. The adjusted step size is based on a ratio of a target rate to the calculated rate. As mentioned, the metric may be a slope of a straight line fit of data points, where each data point comprises one of the verify levels and a corresponding one of the counts of the program voltages. The obtained metric may also be based on a slope of a straight line fit of data points, each data point comprising one of the verify levels and a corresponding one of the program voltages. Following step 1049, three options are depicted. Step 1050 involves erasing the block and programming the evaluated set of cells or another set of cells using dVpgm2. Step 1051 involves completing programming of the set of memory cells using dVpgm2. See FIGS. 15E and 15F. Step 1052 involves programming another set of memory cells using dVpgm2 without erasing the evaluated set of cells.

Figure 14A:
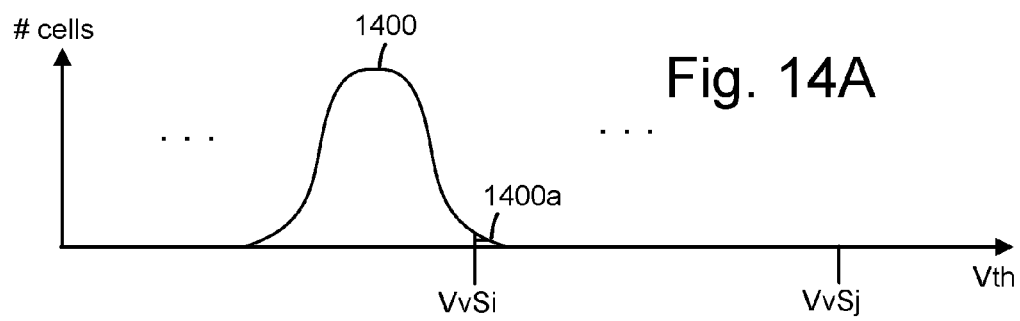
FIG. 14A depicts an example Vth distribution of cells which are subject to a verify test in a programming operation using a verify voltage of VvSi, where fewer than 10% of the cells have Vth>VvSi.
Figure 14B:
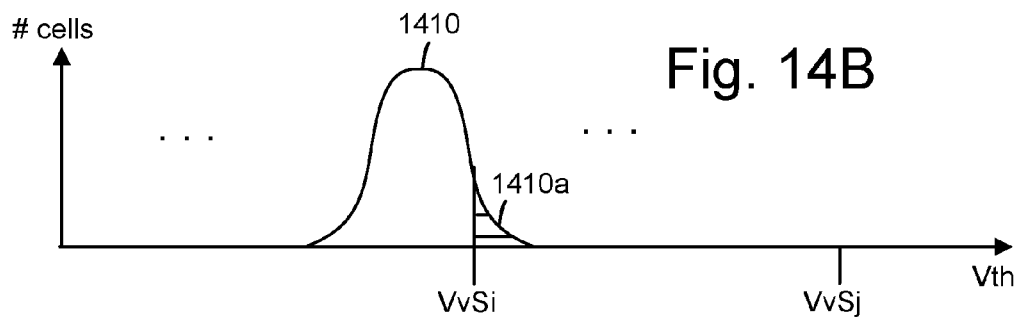
FIG. 14B depicts an example Vth distribution of cells which are subject to a verify test in a programming operation using a verify voltage of VvSi, where more than 10% of the cells have Vth>VvSi.
Figure 14C:
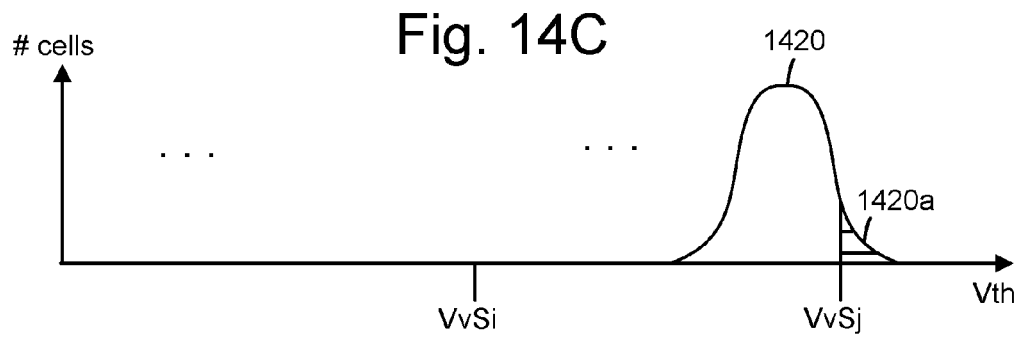
FIG. 14C depicts an example Vth distribution of cells which are subject to a verify test in a programming operation using a verify voltage of VvSj, where more than 10% of the cells have Vth>VvSj.
Figure 14D:
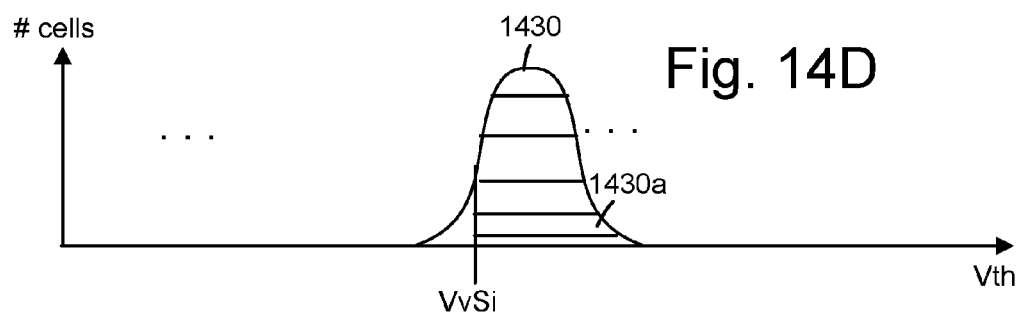
FIG. 14D depicts an example Vth distribution of cells which are subject to a verify test in a programming operation using a verify voltage of VvSi, where more than 90% of the cells have Vth>VvSi.

In another option, the program rate can be determined using a single verify level such as depicted in FIGS. 14B and 14D.

FIG. 10E2 depicts a detailed example process for measuring an erase rate of a set of memory cells to adjust a step size of an erase voltage. At step 1060, a condition is met for evaluating the erase rate of a set of memory cells. For example, this can occur when an ambient temperature is outside of a specified range (step 1060*a*), when a number of erase loops, e.g., erase-verify iterations, is outside of a specified range (step 1060*b*), or when a number of erase-erase (PE) cycles exceeds a specified level (step 1060*c*). Step 1061 initialize an erase voltage (Verase) and sets an initial step size, dVerase1. This step size can be, e.g., the step size which was most recently used for erasing the set of memory cells. Or, this step size can be smaller than the step size which was most recently used or smaller than a default step size. Using a relatively small initial step size can provide a better resolution of the erase rate.

Step 1062 sets a count=1, assuming a condition is met to begin the count (step 1062*a*), as discussed. This is a count of erase loops which are used in erasing the cells. Step 1063 involves applying an erase voltage to the set of memory cells. Various erase waveforms are depicted in FIG. 16A-16E, for example. This step also includes sensing the Vth of the cells relative to one or more verify levels (voltages), e.g., VvS0. See, e.g., FIGS. 14E, 14F and 15G. In FIG. 15G, verify levels are used for S0, S5 and S10. Decision step 1064 determines whether Vth<VvS for at least a specified portion of the cells, e.g., 10%. If decision step 1064 is false, step 1067 increments Verase in magnitude by dVerase1, and the count is also incremented by one. A next erase voltage is then applied at step 1063, in a next erase loop. If decision step 1064 is true, step 1065 stores the count indexed to the verify level, for instance. The counts could also be indexed to a time or to erase voltage.

An option at step 1064*a* is to decrease the verify level, similar to the increase in the verify level in step 1044*a* in FIG. 10E1.

Decision step 1066 determines if the last count which is to be used in the evaluation of the erase rate has been obtained. If decision step 1066 is false, step 1067 increments Verase by dVerase1, and the count is also incremented by one. If decision step 1066 is true, step 1067 stores the count indexed to the verify level. Step 1068 obtains a metric of the erase rate based on the stored counts. For example, step 1068*a* may be used to calculate a straight line fit of data points. One example is to fit a straight line through the set of data points using a least squares fit which minimizes the sum of squared residuals.

The straight line can be defined by an equation y=mx+b. In the case of a plot of verify voltage versus loop count such as in FIG. 15G, y is the verify voltage, m is the slope of the line, e.g., the erase rate, x is the loop count and b is an offset. The erase rate has units of V/count in this example. If the loop count was replaced by the erase voltage which was applied in the loop, the erase rate has units of V/V.

Step 1069 determines an adjusted step size, dVerase2 based on the metric. For example, dVerase2=dVerase1×target metric/obtained metric. The adjusted step size is based on a ratio of a target rate to the calculated rate. As mentioned, the metric may be a slope of a straight line fit of data points, where each data point comprises one of the verify levels and a corresponding one of the counts of the erase voltages. The obtained metric may also be based on a slope of a straight line fit of data points, each data point comprising one of the verify levels and a corresponding one of the erase voltages. Following step 1069, three options are depicted. Step 1070 involves completing the erase of the set of memory cells using dVerase1. Step 1071 involves completing the erase of the set of memory cells using dVerase2. Step 1072 involves erasing another set of memory cells using dVerase2.

Figure 10F:
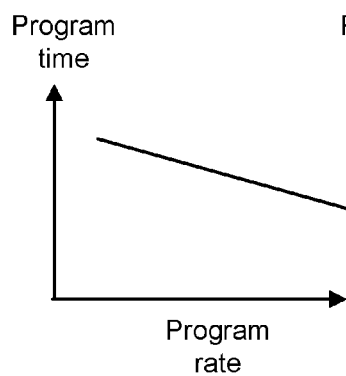
FIG. 10F depicts a plot of program time versus program rate, indicating how program time decreases when program rate increases.

FIG. 10F depicts a plot of program time versus program rate, indicating how program time decreases when program rate increases.

Figure 10G:
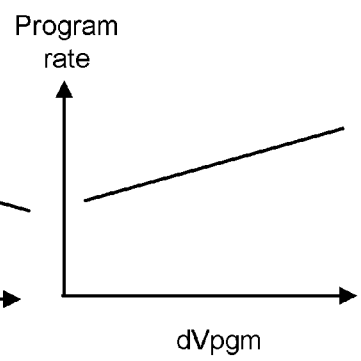
FIG. 10G depicts a plot of program rate versus program voltage step size (dVpgm), indicating how program rate increases when dVpgm increases.

FIG. 10G depicts a plot of program rate versus program voltage step size (dVpgm), indicating how program rate increases when dVpgm increases.

Figure 10H:
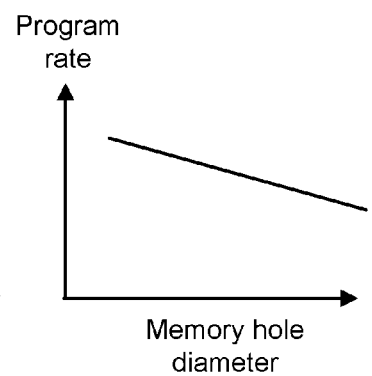
FIG. 10H depicts a plot of program rate versus memory hole diameter, indicating how program rate decreases when the memory hole diameter increases.

FIG. 10H depicts a plot of program rate versus memory hole diameter, indicating how program rate decreases when the memory hole diameter increases.

Figure 10I:
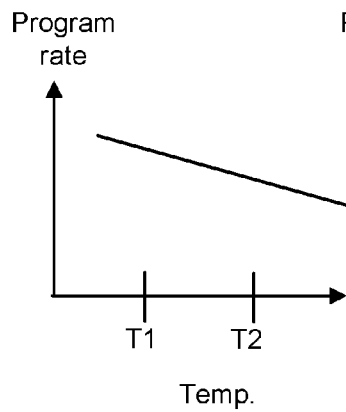
FIG. 10I depicts a plot of program rate versus ambient temperature, indicating how program rate decreases when the ambient temperature increases.

FIG. 10I depicts a plot of program rate versus ambient temperature, indicating how program rate decreases when the ambient temperature increases. An evaluation of the program rate may be triggered when the temperature is outside of a range T1-T2.

Figure 10J:
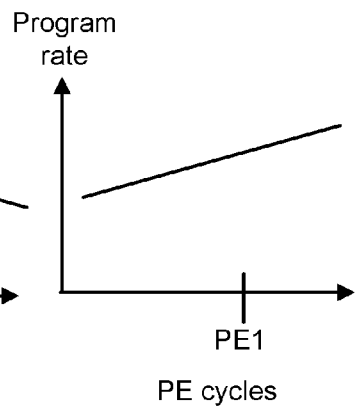
FIG. 10J depicts a plot of program rate versus a number of program-erase (PE) cycles, indicating how program rate increases when the number of PE cycles increases.

FIG. 10J depicts a plot of program rate versus a number of program-erase (PE) cycles, indicating how program rate increases when the number of PE cycles increases. An evaluation of the program rate may be triggered when the PE cycles exceeds a specified level, PE1.

Figure 10K:
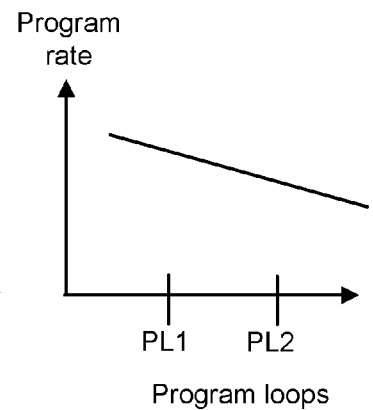
FIG. 10K depicts a plot of program rate versus a number of program loops, indicating how program rate decreases when the number of program loops to complete programming increases.

FIG. 10K depicts a plot of program rate versus a number of program loops, indicating how program rate decreases when the number of program loops to complete programming increases. For example, this can be the number of program loops used to complete a programming operation. In one example, the number of program loops decreases as a memory device is used and the cells become easier to program. An evaluation of the program rate may be triggered when the number of program loops is outside of a range PL1-PL2.

FIG. 11A depicts a waveform of an example programming operation, consistent with FIGS. 10C and 10D, where user data is programmed while the program rate is evaluated. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages.

Each program voltage includes two steps, in one approach. Further, Incremental Step Pulse Programing (ISPP) is used in this example, in which the program voltage steps up in each successive program loop using a fixed or varying step size. This example uses ISPP in a single programming pass in which the programming is completed. ISPP can also be used in each programming pass of a multi-pass operation.

Consistent with the shaded squares and the horizontal bars in the chart of FIG. 13, the waveform 1100 includes a series of program voltages 1101, 1102, 1103, 1104, . . . 1105, . . . 1106, 1107 and 1108 that are applied to a word line selected for programming and to an associated set of memory cells. One or more verify voltages can be provided after each program voltage as an example, based on the target data states which are being verified. A target data state of a cell is the state which the cell is to be programmed. The target data state can be identified by data in latches associated with the cell.

0 V may be applied to the selected word line between the program and verify voltages. Sixteen data states are used, including verify voltages which are consistent with FIG. 12D. For example, a verify voltage of S1 (waveform 1110) may be applied after each of the program voltages 1101 and 1102. Verify voltages of S1 and S2 (waveform 1111) may be applied after each of the program voltages 1103 and 1104. Verify voltages of S12, S13, S14 and S15 (waveform 1112) may be applied after the program voltage 1105. Verify voltages of S14 and S15 (waveform 1113) may be applied after each of the program voltages 1106 and 1107. A verify voltage of S15 (waveform 1114) may be applied after the program voltage 1108.

A subset of the verify voltages are used in decision step 1044 of FIG. 10E. These verify voltages are used to obtain the counts which in turn are used to determine a program rate. The verify voltages of the subset are identified by solid line vertical arrows. In this example, if only one verify voltage is applied after a program voltage, it is used to obtain the count for the program slope (e.g., the verify voltage of S1 is used after program voltage 1102). If multiple verify voltages are applied after a program voltage, the highest of these voltages is used to obtain the count for the program slope (e.g., the verify voltage of S2 is used after program voltages 1103 and 1104, and the verify voltage of S15 is used after program voltage 1105). A dashed line vertical arrow above the verify voltage 1110 shows that one or more initial loops may be skipped before the evaluation of program rate begins.

The last count for obtaining the program rate is in program loop 35. Program loops 36-44 are used to complete the programming of the set of memory cells using dVpgm2. In this example, the program voltages 1101, 1102, 1103, 1104, . . . 1105 step up by dVpgm1, after which the program voltages step up by dVpgm2. Alternatively, the programming can be completed using the initial step size of dVpgm1.

FIG. 11B depicts a waveform of an example programming operation, consistent with FIGS. 10A and 10B, where user data is not programmed while the program rate is evaluated. Consistent with the horizontal bars in the chart of FIG. 13, the waveform 1120 includes a series of program voltages 1121, 1122, 1123, 1124, . . . 1125 that are applied to a word line selected for programming and to an associated set of memory cells. A single verify voltage is provided after each program voltage. Sixteen data states are used, including verify voltages which are consistent with FIG. 12D. For example, a verify voltage of S1 (waveform 1130) may be applied after each of the program voltages 1121 and 1122. A verify voltage of S2 (waveform 1131) may be applied after each of the program voltages 1123 and 1124. A verify voltage of S15 (waveform 1132) may be applied after the program voltage 1125.

Each verify voltage is used to obtain the counts which in turn are used to determine a program rate. The last count for obtaining the count for the program rate is in program loop 35. In this example, the program voltages 1121, 1122, 1123, 1124, . . . 1125 all use a common step size, dVpgm1.

In FIG. 12A to 12D, the vertical axis depicts a number of memory cells on a log scale and the horizontal axis depicts a threshold voltage, Vth.

FIG. 12A depicts example threshold voltage (Vth) distributions of memory cells, where four data states are used and the effects of different program rates are shown. A Vth distribution 1200 of the S0 or erased state is obtained by erasing a block of cells using an erase verify voltage of VvS0. From S0, the cells can be programmed to any of the programmed states S1, S2 and S3 using the verify voltages VvS1, VvS2 and VvS3, respectively, to provide the Vth distributions 1201, 1202 and 1203, respectively. In this example, the Vth distributions 1200, 1201, 1202 and 1203 of data states S0, S1, S2 and S3, respectively, represent a set of cells with a relatively low program rate. The Vth distributions are relatively narrow because of the low program rate and the corresponding reduced program noise. The Vth distributions 1200a, 1201a, 1202a and 1203a of data states S0, S1, S2 and S3, respectively, represent a set of cells with a relatively high program rate. The Vth distributions are slightly wider because of the high program rate and the corresponding increased program noise. With a high program rate, it is more likely that cells with a Vth just below the verify voltage will jump past the verify voltage by a wide margin with the next program voltage, thereby increasing the upper tail of the Vth distribution.

In this case, the lower program rate is the target rate. An evaluation of the cells with the faster program rate will result in a decrease in the step size.

Read voltages VrS1, VrS2 and VrS3 can be used to distinguish between the data states in a read operation.

FIG. 12B depicts example Vth distributions of memory cells, where four data states and two erase depths are used, consistent with FIG. 10B. A Vth distribution 1200a of the S0 or erased state (identified as a deep erased state S0a) is obtained by erasing a block of cells using an erase verify voltage of VvS0a<VvS0. From S0a, the cells can be programmed to any of the programmed states S1, S2 and S3 using the verify voltages VvS1, VvS2 and VvS3, respectively, to provide the Vth distributions 1201, 1202 and 1203, respectively. Additionally, comparing the Vth distribution 1200 with the Vth distribution 1200b, additional program loops are needed to increase the Vth of the cells to VvS1 or a higher verify level at which the count begins for measuring the program rate. These additional program loops can allow the cells to enter a steady state mode in which their program rate is uniform, and to achieve a natural Vth distribution. Thus, the cells enter the steady state mode sooner so that the measuring of the program rate can begin sooner. One possible benefit is that the number of data points for measuring the program rate can increase. Another possible benefit is that the program rate can be measured sooner in the programming process so that the adjusted step size and can be used sooner in a remainder of the programming process. This results in the program rate of the remainder of the programming process being closer to the target rate.

A control circuit may be configured to erase the set of memory cells to a first depth (VvS0a) prior to the evaluation of the set of memory cells and to a second depth (VvS0), higher than the first depth, after the evaluation and prior to the subsequent programming.

FIG. 12C depicts example Vth distributions of memory cells, where eight data states are used. The Vth distributions 1210, 1211, 1212, 1213, 1214, 1215, 1216 and 1217 represent data states S0, S1, S2, S3, S4, S5, S6 and S7, respectively, which have verify voltages of VvS0, VvS1, VvS2, VvS3, VvS4, VvS5, VvS6 and VvS7, respectively. Read voltages VrS1, VrS2, VrS3, VrS4, VrS5, VrS6 and VrS7 can be used to distinguish between the data states in a read operation.

FIG. 12D depicts example Vth distributions of memory cells, where sixteen data states are used. The Vth distributions 1220, 1221, 1222, 1223, 1224, 1225, 1226, 1227, 1228, 1229, 1230, 1231, 1232, 1233, 1234 and 1235 represent data states S0, S1, S2, S3, S4, S5, S6, S7, S8, S9, S10, S11, S12, S13, S14 and S15, respectively, which have verify voltages of VvS0, VvS1, VvS2, VvS3, VvS4, VvS5, VvS6, VvS7, VvS8, VvS9, VvS10, VvS11, VvS12, VvS13, VvS4 and VvS15, respectively. Read voltages VrS1, VrS2, VrS3, VrS4, VrS5, VrS6, VrS7, VrS8, VrS9, VrS10, VrS11, VrS12, VrS13, VrS4 and VrS15 can be used to distinguish between the data states in a read operation.

A Vth distribution 1220a is a natural Vth distribution, e.g., in which the relative program rates of different cells can be observed. The natural Vth distribution may not be achieved until after one or more initial program loops in a programming pass. The evaluation of the program rate can be delayed until the natural Vth distribution has been achieved so that the program rate can more accurately reflect the relative program rates of the different cells. In one approach, the Vth distribution 1220a maintains its shape but gradually moves higher during programming, until the final Vth distribution 1220b is depicted. A counter can be set to count the number of program loops needed for the natural Vth distribution to pass all fifteen verify levels, for instance. In one approach, when the natural Vth distribution passes VvS1, for instance, the count is set to zero. The counter will count the program loop number when the natural Vth distribution passes the other verify levels. Then, the verify level versus loop count can be converted to a program rate. Based on the measured program rate relative to a target rate, the step size can be adjusted for use in subsequent programming.

In one approach, the counter will count the program loop number when the natural Vth distribution passes the verify levels of each of S3-S15. However, to save time, fewer verify levels may be used. For example, the verify level of every other state, e.g., S3, S5, S7, S9, S11, S13 and S15, may be used.

FIG. 13 depicts a chart of program loop number versus data state and verify voltage, showing which verify tests are performed in which program loop. There are sixteen data states in this example. The program loop, or program-verify iteration, extends in the horizontal direction (from 1-44) and the state (from S0-S15, consistent with FIG. 12D) and verify voltage (from 0.4-6.0 V) extends in the vertical direction. For each program loop, each shaded square represents the case where a verify test is performed for a corresponding data state, when user data is programmed (such as in FIGS. 10C and 10D). Each horizontal bar represents the case where a verify test is performed for the evaluation of the program rate.

As an example, assume user data is programmed during the evaluation. During loops 1 and 2, a verify test is performed for programming user data to S1 and for the program rate evaluation. The counting will typically involve a cell which is ultimately programmed to a higher state, since the counting involves determining how many loops are used to program the cells through multiple verify levels. Latches which are associated with each cell can be accessed to determine the target data state of a cell. One or more target data states can be identified for use in the evaluation. Thus, in loops 1 and 2, for cells which have the S0 state as the target data state, the verify test will determine whether the cells have reached the target data state, e.g., have Vth>VvS1, and should therefore be locked out from further programming. For cells which are used to evaluate the program rate, e.g., cells which have one or more specified target data states such as S14 or S15, the verify test will determine whether at least a specified portion of the cells, e.g., at least 10%, have Vth>VvS1. However, these cells are not locked out from further programming when Vth>VvS1.

Subsequently, during loop 5, for instance, a verify test is performed for programming user data to S1, S2 and S3 and for the program rate evaluation. For cells which have the S1, S2 or S3 state as the target data state, the verify test will determine whether the cells have reached the target data state, e.g., have Vth>VvS1, Vth>VvS2 or Vth>VvS3, respectively, and should therefore be locked out from further programming. For cells which are used to evaluate the program rate, the verify test will determine whether at least a specified portion of the cells, e.g., at least 10%, have Vth>VvS3. However, these cells are not locked out from further programming when Vth>VvS3.

Subsequently, during loop 35, for instance, a verify test is performed for programming user data to S12, S13, S14 or S15 and for the program rate evaluation. For cells which have the S12, S13, S14 or S15 state as the target data state, the verify test will determine whether the cells have reached the target data state, e.g., have Vth>VvS12, Vth>VvS13, Vth>VvS14 or Vth>VvS15, respectively, and should therefore be locked out from further programming. For cells which are used to evaluate the program rate, the verify test will determine whether at least a specified portion of the cells, e.g., at least 10%, have Vth>VvS15. In this case, these cells are locked out from further programming when Vth>VvS15. The program rate and the adjusted step size can be calculated at this time.

Subsequently, during loop 36, a verify test is performed for programming user data to S12, S13, S14 or S15 but not for the program rate evaluation. For cells which have the S12, S13, S14 or S15 state as the target data state, the verify test will determine whether the cells have reached the target data state and should therefore be locked out from further programming.

Subsequently, during loop 44, a verify test is performed for programming user data to S15 but not for the program rate evaluation. For cells which have the S15 state as the target data state, the verify test will determine whether the cells have reached the target data state and should therefore be locked out from further programming.

In an example where user data is not programmed, the horizontal bars of the chart of FIG. 13 determine which verify tests are performed in which loops and the shaded squares can be ignored. In this case, loop 35 is the final loop.

In FIGS. 14A and 14B, the vertical axis depicts a number of memory cells on a log scale and the horizontal axis depicts Vth. VvS is the verify voltage of an example data state.

FIG. 14A depicts an example Vth distribution of cells which are subject to a verify test in a programming operation using a verify voltage of VvS, where fewer than 10% of the cells have Vth>VvS. At this time, a small portion 1400a of the upper tail of the Vth distribution 1400 has exceeded VvS. Assume this portion of the cells is less than a specified portion, such as 10%.

FIG. 14B depicts an example Vth distribution of cells which are subject to a verify test in a programming operation using a verify voltage of VvS1, where more than 10% of the cells have Vth>VvSi. Si denotes any ith programmed state, e.g., among multiple programmed states. At this time, a larger portion 1410a of the upper tail of the Vth distribution 1410 exceeds VvSi. Assume this portion of the cells is more than the specified portion, such as 10%. At this time, a record is made, e.g., of the current program loop number PLi and the corresponding verify level or state (VvSi or state Si).

FIG. 14C depicts an example Vth distribution of cells which are subject to a verify test in a programming operation using a verify voltage of VvSj, where more than 10% of the cells have Vth>VvSj. A state j is a programmed state after the state i by one or more states such that j>i. A portion 1420a of the upper tail of the Vth distribution 1420 exceeds VvSj. Assume this portion of the cells is more than the specified portion, such as 10%. At this time, a record is made, e.g., of the current program loop number PLj and the corresponding verify level or state VvSj (VvSj or state Sj). A measure of program rate can be determined from (VvSj−VvSi)/(PLj−PLi).

FIG. 14D depicts an example Vth distribution of cells which are subject to a verify test in a programming operation using a verify voltage of VvS1, where more than 90% of the cells have Vth>VvSi. At this time, a large portion 1430a of the upper tail of the Vth distribution 1430 exceeds VvSi. In this approach, a measure of program rate can be determined by subjecting the cells to a verify test using only one verify voltage, e.g., VvSi. When the condition of FIG. 14B is reached, a record is made, e.g., of the current program loop number, PLi_10%. When the condition of FIG. 14D is reached, a record is made, e.g., of the current program loop number, PLi_90%. A measure of program rate can be determined from (dV)/(PL_90%-PLi_10%), where dV is a measure of the Vth distribution width. dV can be predetermined from theory or testing, or adaptively determined during the programming. Or, a measure of program rate can be determined from 1/(PL_90%-PLi_10%).

In the above programming examples, it is also possible to use a verify voltage which is not associated with a data state.

FIG. 14E depicts an example Vth distribution of cells which are subject to a verify test in an erase operation using a verify voltage of VvS0, where more than 10% of the cells have Vth<VvS0. The cells being erased can be in one or more programmed states at the start of an erase operation. In one approach, the cells are in different programmed states and are erased to a common erased state. In another approach, the cells are in only one programmed state and are erased to a common erased state. For example, the cells may be programmed to the highest programmed state among a plurality of programmed state.

A portion 1440a of the lower tail of the Vth distribution 1440 is less than VvS0. Assume this portion of the cells is more than the specified portion, such as 10%. At this time, a record is made, e.g., of the current erase loop number, ELj_10%.

FIG. 14F depicts an example Vth distribution of cells which are subject to a verify test in an erase operation using a verify voltage of VvS0, where more than 90% of the cells have Vth<VvS0. A portion 1441a of the lower tail of the Vth distribution 1441 is less than VvS0. Assume this portion of the cells is more than the specified portion, such as 90%. At this time, a record is made, e.g., of the current erase loop number, EL_90%.

In this approach, a measure of erase rate can be determined by subjecting the cells to a verify test using only one verify voltage, e.g., VvS0. When the condition of FIG. 14E is reached, a record is made, e.g., of the current erase loop number ELi_10%. When the condition of FIG. 14F is reached, a record is made, e.g., of the current erase loop number ELi_90%. A measure of erase rate can be determined from (dV)/(EL_90%-ELi_10%), where dV is a measure of the Vth distribution width. dV can be predetermined from theory or testing, or adaptively determined during the erasing. Or, a measure of erase rate can be determined from 1/(EL_90%-ELi_10%).

In the above erasing examples, it is also possible to use a verify voltage which is not associated with the erased state. The verify voltage could be associated with a programmed data state or not associated with any data state. It is also possible to use multiple verify levels to determine an erase rate, analogous to the determination of the program rate using FIGS. 14B and 14C. For example, in FIG. 15B, a measure of erase rate can be determined by subjecting the cells to a verify test using multiple (e.g., three) verify voltages, VvS10, VvS5 and VvS0.

FIG. 14G depicts an example Vth distribution 1450 of cells which are subject to a verify test in a programming operation using a verify voltage of VvS1, where the number of cells (N) with a Vth greater than a specified portion (X %) is greater than Y>X %, consistent with step 1044a in FIG. 10E1. The N cells are represented by the portion 1450a of the Vth distribution. For example, assume that at a certain loop count, the sensing at VvSi indicates that 40% of the cells have Vth>VvSi. This exceeds a specified limit of Y=30%. As a result, another sensing is performed at VvSi+delta. This sensing indicates that 20% of the cells have Vth>VvSi+delta. The loop count is then stored and associated with VvSi+delta instead of VvS1, and this data is used is determining the program rate. Delta can be fixed or set adaptively, as explained next.

FIG. 14H depicts a plot showing an increase in delta based on N. The delta begins to increase above 0 V when N exceeds Y %. A linear or non-linear increase may be used.

Figure 14I:
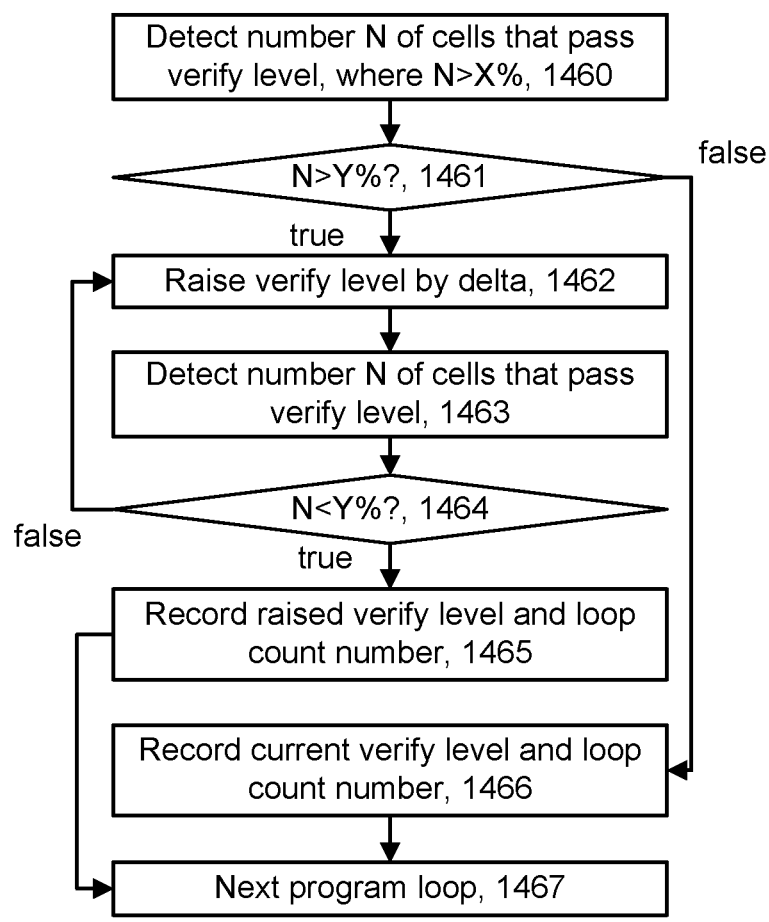
FIG. 14I depicts a process corresponding to step 1044a in FIG. 10E1, FIGS. 14G and 14H.

FIG. 14I depicts a process corresponding to step 1044a in FIG. 10E1, FIGS. 14G and 14H. The process occurs during the sensing/verify portion of a program-verify iteration or program loop. Step 1460 detects a number N of cells that pass a verify level, where we assume N>X %. At decision step 1461, if N>Y %, step 1462 raises the verify level by delta and step 1463 detects a number N of cells that pass the raised verify level. If N<Y % at decision step 1464, step

1465 records the raised verify level and loop count number. A next program loop then occurs at step 1467. If N<Y % is false at decision step 1464, the verify level can be raised again at step 1462. A limit may be imposed on the number of times the verify level is raised. If N>Y % is false, step 1466 records the raised verify level and loop count number.

An apparatus provided herein thus includes a set of memory cells in a block, sense circuits connected to the set of memory cells, a driver connected to the set of memory cells, and a control circuit. The control circuit is configured to: cause the driver to apply a set of pulses to the set of memory cells, cause the sense circuits to test a characteristic of the set of memory cells relative to one or more verify levels, based on results from the sense circuits, determine a rate of change of the characteristic, set an adjustable programming parameter based on the rate of change of the characteristic, and program memory cells in the block using the adjustable programming parameter. Further, the control circuit is configured to determine for one of the pulses a number (N) of memory cells of the set of memory cells which exceeds a verify level (VvSi) of the one or more verify levels and if the number exceeds a threshold (Y %), increase the verify level by a delta and cause the sense circuits to test the characteristic of the set of memory cells relative to the verify level plus the delta.

Figure 15B:
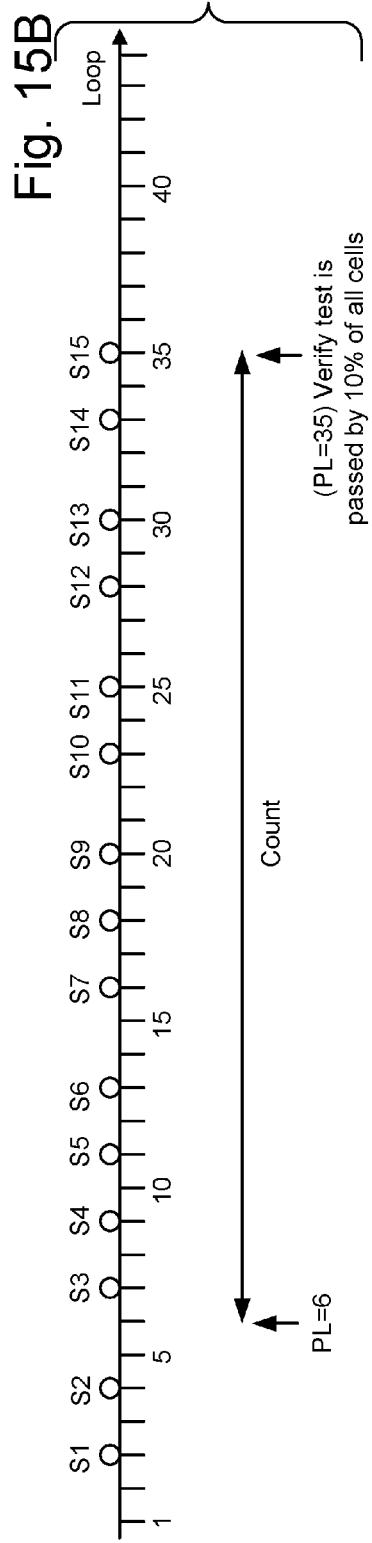
FIG. 15B depicts a time line showing when a count occurs for measuring a program rate, where a program loop to start the count is predetermined as PL=6 and a program loop to end the count is adaptively determined using a verify test of data state S15 as PL=35, where all cells are used to measure the program rate and user data is not programmed.

FIG. 15A depicts a plot of verify voltage and data state versus program loop in a programming operation, consistent with 10E1 and FIG. 13. The circles represent data points, where each data point comprises one of the verify levels and a corresponding one of the counts of the program voltages. For example, the data point 1500 comprises the verify level of S15 (VvS15) and the loop count=35. A long dashed line 1501 is a straight line fit of the data points. A slope of this line is the measured program rate. A short dashed line 1510 has a slope which is a target program rate. In this case, the measured rate exceeds the target rate. Assume that programming with a step size of 0.2 V was used to measure the program rate for a set of cells, the slope of the line 1501 is 0.15 and the slope of the line 1510 is 0.13. The step size can therefore be adjusted to 0.2×(0.13/0.15)=0.17 V. The horizontal axis is repeated with the data points for reference in FIGS. 15B and 15E.

Note that the total number of program loops used to complete programming is also a metric of program rate. However, the slope of the line described herein is more accurate as it considers more data points. Moreover, the total number of program loops can be affected inordinately by a few very slow programming cells, for instance.

FIG. 15B depicts a time line showing when a count occurs for measuring a program rate, where a program loop to start the count is predetermined as PL=6 and a program loop to end the count is adaptively determined using a verify test of data state S15 as PL=35, where all cells are used to measure the program rate and user data is not programmed. Time, and program loop number, proceed moving to the right in the figure. The count can be started after skipping one or more initial program loops, e.g., to allow the cells to reach a steady state condition and a natural Vth distribution. The counting takes place between PL=6 and PL=35. Using a predetermined starting loop results in a simpler implementation. The count ends when a specified portion, e.g., 10% of the cells, pass the verify test for S15, for instance.

Figure 15C:
FIG. 15C depicts a time line showing when a count occurs for measuring a program rate, where a program loop to start the count is adaptively determined as PL=6 and a program loop to end the count is adaptively determined using a verify test of data state S15 as PL=35.

FIG. 15C depicts a time line showing when a count occurs for measuring a program rate, where a program loop to start the count is adaptively determined as PL=6 and a program loop to end the count is adaptively determined using a verify test of data state S15 as PL=35. The start occurs when a specified portion, e.g., 10% of the cells, pass the verify test for S3, for instance. This approach allows the start of the evaluation to be customized for each set of memory cells. This is an example of determining when to start the evaluation based on a programming progress of the set of memory cells during programming to one or more data states, e.g., S1 and S2, which are below a set of data states, e.g., S3-S15, used in the evaluation.

Further, this is an example of where, before the evaluation of the program rate, the set of memory cells are programmed to one or more data states, e.g., S1 and S2, which are below a set of data states, e.g., S3-S15, used in the evaluation. The set of memory cells are programmed from the one or more data states to the set of data states during the evaluation.

Figure 15D:
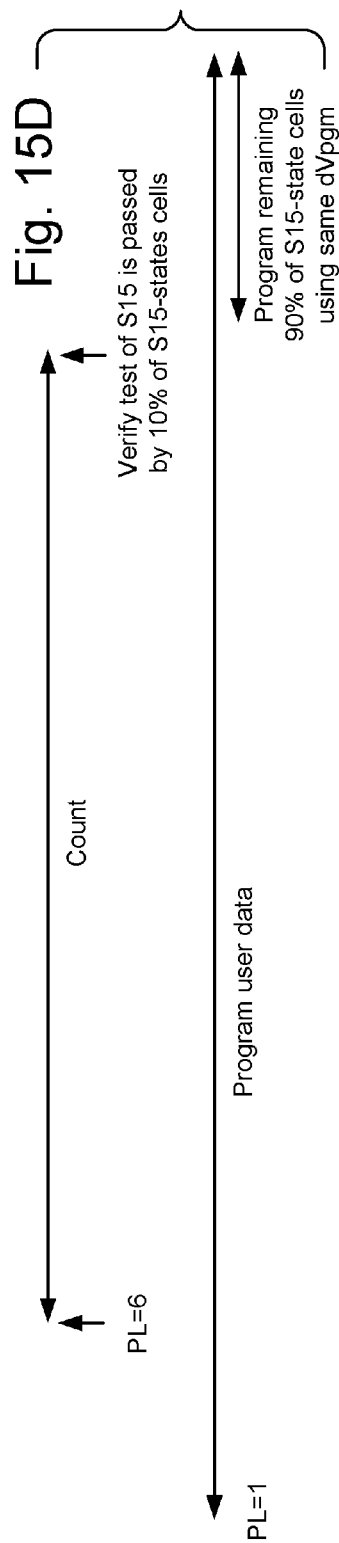
FIG. 15D depicts a time line showing when a count occurs for measuring a program rate, where a program loop to end the count is adaptively determined using a verify test of data state S15 as PL=35, the S15-state cells are subject to this verify test and user data is programmed.
Figure 15G:
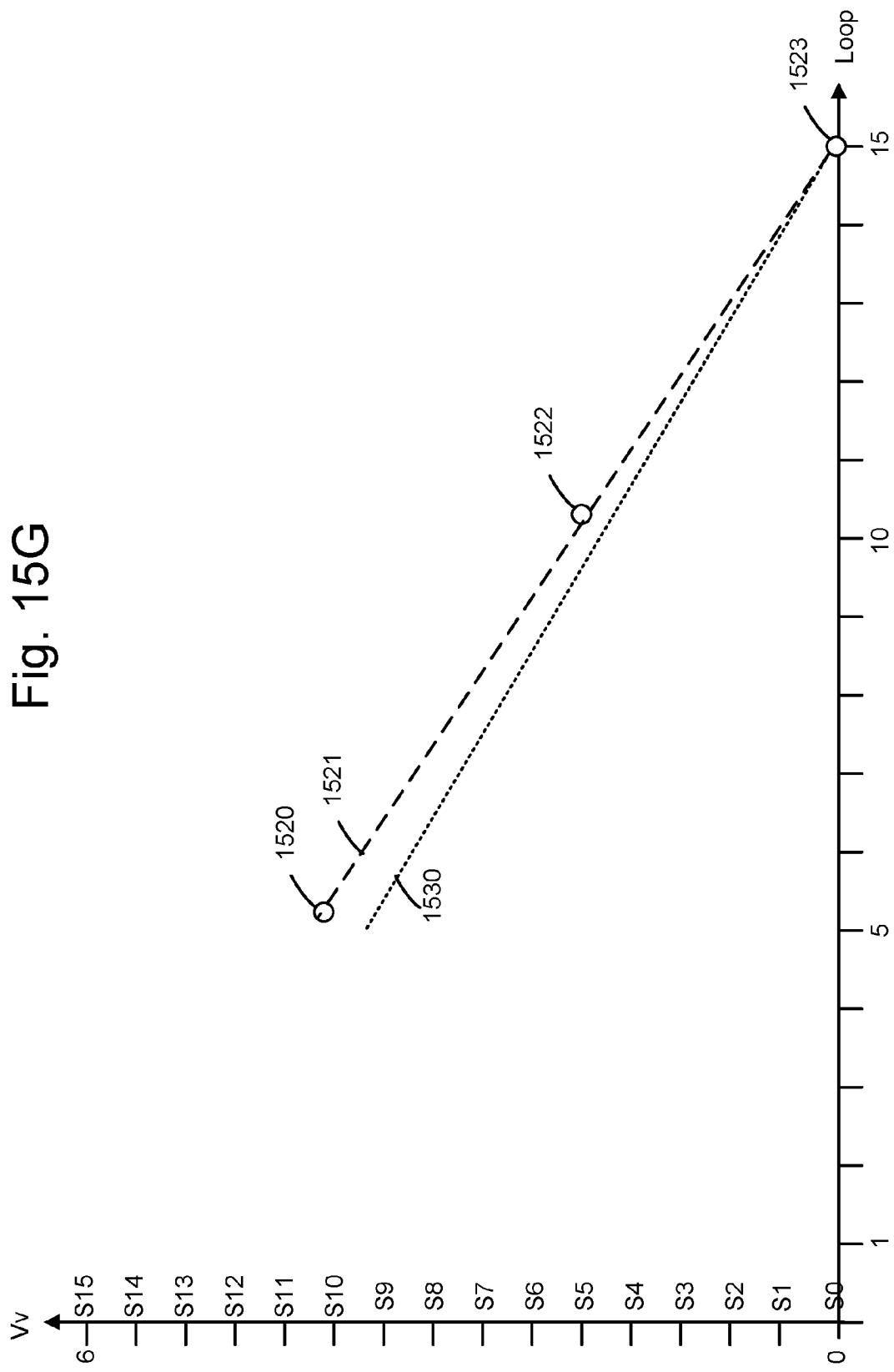
FIG. 15G depicts a plot of verify voltage and data state versus erase loop in an erase operation, consistent with FIG. 10E2.

FIG. 15D depicts a time line showing when a count occurs for measuring a program rate, where a program loop to end the count is adaptively determined using a verify test of data state S15 as PL=35, the S15-state cells are subject to this verify test and user data is programmed. The count ends when a specified portion, e.g., 10% of the cells, pass the verify test for S15, for instance. Loops 36-44 are used to program the remaining cells using the same dVpgm which was used during the count (this was dVpgm1 in previous examples). These remaining cells will include approximately 90% of the S15 state cells. Alternatively, it is possible to use the adjusted step size, dVpgm2, to program the remaining cells. Some benefit may be realized by using the adjusted step size even if only for the last few program loops. The programming of the user data begins at PL=1 and ends at PL=44.

This example uses the S15 state cells to determine the program rate.

This is an example where, during the set of program voltages, some memory cells of the set of memory cells are locked out from further programming while programming of other memory cells of the set of memory cells continues. The obtained metric of program rate is based on results from the sense circuits for the other memory cells and not based on results from the sense circuits for the some memory cells.

Referring also to FIG. 13, when user data is programmed, the number of verify voltages applied to the word line can differ in different program loops. For example, the number of verify voltages can be one, or a relatively small number in the first few program loops. Specifically, loops 1 and 2 use one verify voltage, loops 3 and 4 use two verify voltages, loops 5 and 6 use three verify voltages, and loops 7-9 use four verify voltages. The number of verify voltages per program loop then reaches a uniform, maximum value, or, generally a specified number, such as five voltages, e.g., in loops 10-34. This is an indication that the cells have reached a steady state condition. Accordingly, in one approach, loop 10 is used to start the evaluation. A design parameter can be set which indicates the maximum number of verify voltages per program loop, e.g., five. In this case, during the programming, the evaluation can start in the loop in which verify tests begin for the fifth programmed state.

A process can therefore include, before the evaluation, programming a set of memory cells while increasing a number of verify voltages per program loop until the number of verify voltages per program loop reaches a specified number of verify voltages, and determining when to start the evaluation based on when the number of verify voltages per program loop reaches the specified number of verify voltages.

FIG. 15E depicts a time line showing when a count occurs for measuring a program rate, where a program loop to end the count is adaptively determined using a verify test of data state S14 as PL=33, the S14-state cells are subject to this verify test, user data is programmed and the same dVpgm is used in a remainder of the programming. At PL=33, the verify test of S14 is passed by, e.g., 10% of the S14-state cells. Loops 34-44 are used to program the remaining cells using the same dVpgm which was used during the count (this was dVpgm1 is previous examples). These remaining cells will include approximately 90% of the S14 state cells and most of the S15-state cells. Alternatively, it is possible to use the adjusted step size, dVpgm2, to program the remaining cells. The programming of the user data begins at PL=1 and ends at PL=44.

This example uses the S14 state cells to determine the program rate. In another option, both S14 and S15 states can be used to determine the program rate, for instance.

FIG. 15F depicts a time line showing when a count occurs for measuring a program rate, where a program loop to start the count is predetermined as PL=6 and a program loop to end the count is adaptively determined using a verify test of data state S7 as PL=16, where the S7-state cells are subject to this verify test, user data is programmed, and an adjusted Vpgm is used in a remainder of the programming. At PL=16, the verify test of S7 is passed by, e.g., 10% of the S7-state cells, and the program rate and adjusted step size are determined. Loops 17-44 are used to program the remaining cells using the adjusted step size, dVpgm2. These remaining cells will include approximately 90% of the S7 state cells and most of the S8 to S15 state cells. The programming of the user data begins at PL=1 and ends at PL=44.

Alternatively, the cells with target data states of S7-S15 can be subject to the verify test of S7.

FIG. 15G depicts a plot of verify voltage and data state versus erase loop in an erase operation, consistent with FIG. 10E2. Similar to FIG. 15A, the circles represent data points, where each data point comprises one of the verify levels and a corresponding one of the counts of the erase voltages. For example, the data point 1520 comprises the verify level of S10 (VvS10) and the loop count=5. The data point 1522 comprises the verify level of S5 (VvS5) and the loop count=10. The data point 1523 comprises the verify level of S0 (VvS0) and the loop count=15. In this example, all of the cells being erased may initially be in the highest programmed state, e.g., S15. In other approaches, such as in FIGS. 14E and 14F, the verify test is at VvS0 and the cells being erased may initially be in different programmed states.

A long dashed line 1521 is a straight line fit of the data points. A slope of this line is the measured erase rate. A short dashed line 1530 has a slope which is a target erase rate. In this case, the measured rate exceeds the target rate. Assume that erasing with a step size of 0.2 V in magnitude was used to measure the erase rate for a set of cells, the slope of the line 1521 is −0.40 and the slope of the line 1530 is −0.38. The step size can therefore be adjusted to 0.2×(−0.38/−0.40) =0.19 V.

Note that the total number of erase loops used to complete erasing is also a metric of erase rate. However, the slope of the line described herein is more accurate as it considers more data points. Moreover, the total number of erase loops can be affected inordinately by a few very slow programming cells, for instance.

FIG. 16A depicts example voltages in an erase operation which uses gate-induced drain leakage (GIDL) to charge up the channel of a NAND string. This approach can be used, e.g., in erasing cells in the three-dimensional device of FIG. 4. The vertical axis depicts voltage and the horizontal axis depicts time. The waveform 1600 depicts a series of bit line and/or source line voltages 1601, 1603 and 1605 with magnitudes of Verase1a, Verase2a and Verase3a, respectively, which step up in each erase-verify iteration. The waveform also depicts select gate voltages 1602, 1604 and 1606 with a common magnitude of Vsg_er, in one approach. In another approach, the select gate voltage also steps up with the bit line and/or source line voltage. The waveform provides a number of erase-verify loops EV1a, EV2a and EV3a, each of which includes an erase portion and a verify portion (verify test). The channel of a NAND string can be charged up in an erase operation based on GIDL, which is generated in proportion to the drain-to-gate voltage of the select gate transistors at the drain-end and/or source-end of the NAND sting. In another option, the erase voltage steps up to its peak in two steps instead of one to allow time for the charge up of the channel to occur. In another option, the erase voltage and the select gate voltage both step up to their peaks in two steps.

FIG. 16B depicts an example channel voltage consistent with FIG. 16A. The channel voltage (Vch) in represented by a waveform 1610 which has elevated portions 1611, 1612 and 1613 coincident with the elevated voltages of FIG. 16A. In the approach of FIGS. 16A and 16B, the word line voltage is at a level, e.g., 0 V or close to 0 V, which provides a positive channel-to-gate voltage.

FIG. 16C depicts example erase voltages in an erase operation which applies a positive voltage to a p-well of a substrate. This approach is particularly suitable for a 2D memory device. The waveform 1620 comprises voltage pulses 1621, 1622 and 1623 with amplitudes of Verase1b, Verase2b and Verase3b, respectively, which can step up in each loop. The voltage pulses are in erase-verify loops EV1b, EV2b and EV3b. The word line voltage may be at a level, e.g., 0 V or close to 0 V, which provides a positive channel-to-gate voltage.

FIG. 16D depicts example erase voltages in an erase operation which applies a negative voltage to the word lines in a block. In this approach, the memory device has the capability to apply a negative voltage on the word lines, such as by using a negative charge pump. In one approach, the drain (bit line) and source can be set at 0 V, and there is a positive source-to-control gate voltage of the memory cells. The waveform 1630 depicts a series of negative control gate voltages 1631, 1632 and 1633 with magnitudes of Verase1c, Verase2c and Verase3c, respectively, in erase-verify loops EV1c, EV2c and EV3c, respectively.

FIG. 16E depicts example verify voltages in an erase operation. FIG. 16E is time aligned with FIG. 16A to 16D and can be used with any of these waveforms to provide the verify test of an erase-verify loop. The waveform 1640 includes voltage pulses 1641, 1642 and 1643 at VvS0 which are applied to the word lines during a verify test of an erase operation. The erase-verify voltages can be small positive values, 0 V, or negative values.

Figure 17:
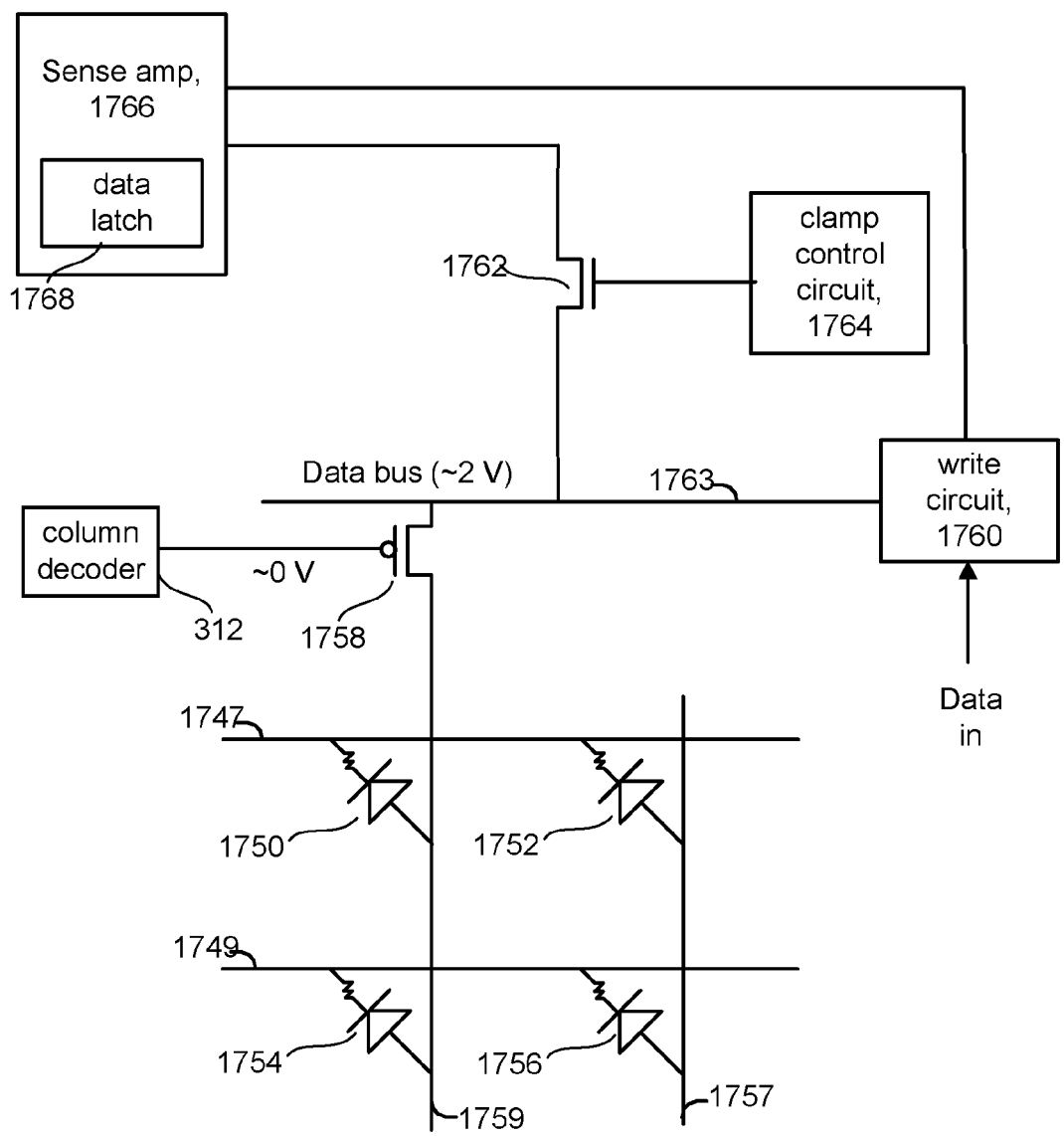
FIG. 17 depicts an embodiment of a circuit for reading the state of a resistance-switching memory cell.

FIG. 17 depicts an embodiment of a circuit for reading the state of a resistance-switching memory cell. A variety of materials show resistance-change or resistance-switching behavior in which the resistance of the material is a function of the history of the current through, and/or voltage across, the material. These materials include chalcogenides, carbon polymers, perovskites, and certain metal oxides (MeOx) and metal nitrides (MeN). Specifically, there are metal oxides and nitrides which include only one metal and exhibit reliable resistance switching behavior. This group includes, for example, Nickel Oxide (NiO), Niobium Oxide (Nb2O5), Titanium Dioxide (TiO2), Hafnium Oxide (HfO2) Aluminum Oxide (Al2O3), Magnesium Oxide (MgOx), Chromium Dioxide (CrO2), Vanadium Oxide (VO), Boron Nitride (BN), and Aluminum Nitride (AlN). The material may be formed in an initial state, for example, a relatively low-resistance state. Upon application of sufficient voltage, the material switches to a stable high-resistance state which is maintained after the voltage is removed. In some cases, the resistance switching is reversible such that subsequent application of an appropriate current or voltage can serve to return the material to a stable low-resistance state which is maintained after the voltage or current is removed. This conversion can be repeated many times. For some materials, the initial state is high-resistance rather than low-resistance. A set process may refer to switching the material from high to low resistance, while a reset process may refer to switching the material from low to high resistance. The set and reset processes can be considered to be programming processes which change the resistance state. In other cases, the resistance switching is irreversible.

Resistance-change materials are of interest for use in nonvolatile memory arrays. One resistance state may correspond to a data "0," for example, while the other resistance state corresponds to a data "1." Some of these materials may have more than two stable resistance states. Moreover, in a memory cell, the material can be in series with a steering element such as a diode, which selectively limits the voltage across, and/or the current flow through, the material. For example, a diode can allow current to flow in only one direction of the while essentially preventing a current flow in the opposite direction. Such a steering element itself is not typically a resistance-change material. Instead, the steering element allows a memory cell to be written to, and/or read from, without affecting the state of other memory cells in an array.

Two of the many bit lines and two of the many word lines are depicted. Bit line 1759 is coupled to cells 1750 and 1754, and bit line 1757 is coupled to cells 1752 and 1756. Bit line 1759 is the selected bit line and may be at 2 V, for instance. Bit line 1757 is an unselected bit line and may be at ground, for instance. Word line 1747 is the selected word line and may be at 0 V, for instance. Word line 1749 is an unselected word line and may be at 2 V, for instance.

A read circuit for one of the bit lines 1759 is depicted to be connected to the bit line via transistor 1758, which is controlled by a gate voltage supplied by column decoder 312 in order to select or unselect the corresponding bit line. Transistor 1758 connects the bit line to a Data bus 1763. Write circuit 1760 (which is part of system control logic) is connected to the Data bus. Transistor 1762 connects to the Data bus and operates as a clamp device that is controlled by clamp control circuit 1764 (which is part of system control logic). Transistor 1762 is also connected to a sense amp 1766, which includes a data latch 1768. The output of sense amp 1766 is connected to a data out terminal (to system control logic, a controller and/or a host). Write circuit 1760 is also connected to the sense amp 1766 and the data latch 1768.

When attempting to read the state of the resistance-switching material, all word lines are first biased at Vread (e.g., approximately 2 V) and all bit lines are at ground. The selected word line is then pulled to ground. For example, this discussion will assume that memory cell 1750 is selected for reading. One or more selected bit lines 1759 are pulled to Vread through the data bus (by turning on transistor 1758) and the clamp device (transistor 1762, which receives ~2 V+Vth, the threshold voltage of the transistor 1762). The clamp device's gate is above Vread but controlled to keep the bit line near Vread. In one approach, current is pulled by the selected memory cell 1750 through transistor 1762 from a sense node in the sense amp. The sense node can receive a reference current that is between a high-resistivity state current and a low-resistivity state current. The sense node changes based on the current difference between the cell current and the reference current. Sense amp 1766 generates a data out signal by comparing the sensed voltage to a reference read voltage. If the memory cell current is larger than the reference current, the memory cell is in the low-resistivity state and the voltage at the sense node will be lower than the reference voltage. If the memory cell current is smaller than the reference current, the memory cell is in the high-resistivity state and the voltage at the sense node will be higher than the reference voltage. The output data signal from the sense amp 1766 is latched in data latch 1768.

Figure 18A:
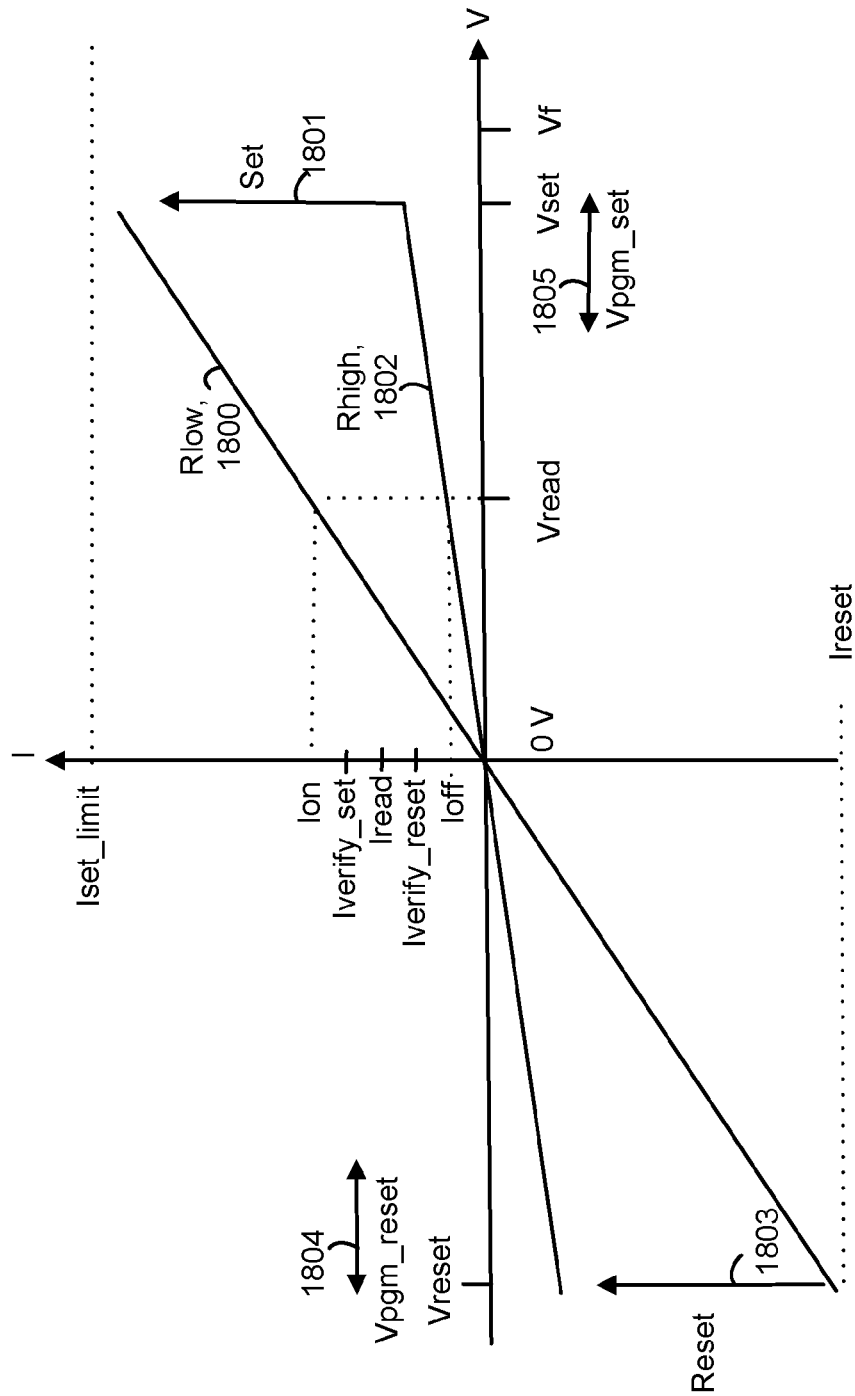
FIG. 18A is a graph depicting I-V characteristics of an example bipolar resistance-switching material which sets using a positive voltage.

Referring to FIG. 18A, for example, while in the high-resistivity state (line 1802), if one or more voltages of the program voltage and sufficient current are applied, the resistance-switching material can be set (line 1801) to the low-resistivity state (line 1800). The voltage will remain somewhat constant and the current will increase toward Iset_limit. Note that the first time the resistance-switching material is set, Vf (the forming voltage) is needed to set the device. After that, one or more voltages of Vpgm are sufficient to set the device. The forming voltage Vf may be greater than Vset. While in the low-resistivity state (line 1800), if Vpgm<0 V is applied, the resistance-switching material can be reset to the high-resistivity state (line 1802).

In one embodiment, Vset is approximately 7 V, Vreset is approximately −9 V, Iset_limit is approximately 1 to 10 μA and Ireset could be as low as, e.g., 100 nA. These voltages and currents apply to the case of a resistance-switching material and a diode in series.

FIG. 18A is a graph depicting I-V characteristics of an example bipolar resistance-switching material which sets using a positive voltage. In this example, the set process (a transition from Rhigh to Rlow) occurs when a positive voltage is applied, and the reset process (a transition from Rlow to Rhigh) occurs when a negative voltage is applied. Line 1802 represents the I-V characteristic when in the high-resistivity (Rhigh) state and line 1800 represents a transition to the low-resistivity (Rlow) state. Line 1801 represents the set process and line 1803 represents the reset process.

A read voltage Vread is also depicted. To determine the resistance-switching material's state, Vread is applied across the resistance-switching material while the resulting current is measured and compared to a reference or trip current Iread. A higher or lower measured current indicates that the resistance-switching material is in the low- or high-resistivity state, respectively. For example, if Ioff<Iread is measured, the material is in the high resistance state. If Ion>Iread is measured, the material is in the low resistance state. A forming voltage Vf is also depicted. This is an example of a user read which occurs after the memory cell has been programmed. In this case, the reference current is positioned to provide a roughly equal margin between the expected current in the Rlow state, Ion and the expected current in the Rhigh state, Ioff. Vread can also be used during a program verify process in which case the reference current can be different than during a user read. For example, a set verify current (Iverify_set) can be greater than Iread to provide a margin above Iread. Similarly, a reset verify current (Iverify_reset) can be less than Iread to provide a margin below Iread. Vread can be the same or different during a user read or a program verify read.

Specifically, due to sensing noise, temperature differences, supply voltage variation, cell relaxation variations and other factors, a given cell may not flow the exact same current when read at different times, e.g., verify versus user read. To ensure a valid user read with high probability, the on chip circuitry can provide a margin between the verify read and the user read. The margin can be in the direction to make it more difficult to pass a verify read than a user read. For example, if the cell is in a high current state (low resistance state) the verify read can be at a lower Vread, e.g., 50 mV lower, or with a higher reference current as compared to user read conditions. For a cell in a low current state (high resistance state) the verify read can be at a slightly higher Vread or a lower reference current compared to user read conditions.

A current limit Iset_limit for a current through the memory cell can be enforced during a set process.

During a set process, the program voltage Vpgm_set can have a range of magnitudes as indicated by arrow 1805. The magnitude may be less than Vset and then step up. Similarly, during a reset process, the program voltage Vpgm_reset can have a range of magnitudes as indicated by arrow 1804. The magnitude may be less than Vreset and then step up. Ireset is a current in the cell when it resets. Due to variations among cells, they will set or reset under slightly different conditions. The use of step-wise increasing voltages allows each cell to set or reset using the lowest possible voltage.

Figure 18B:
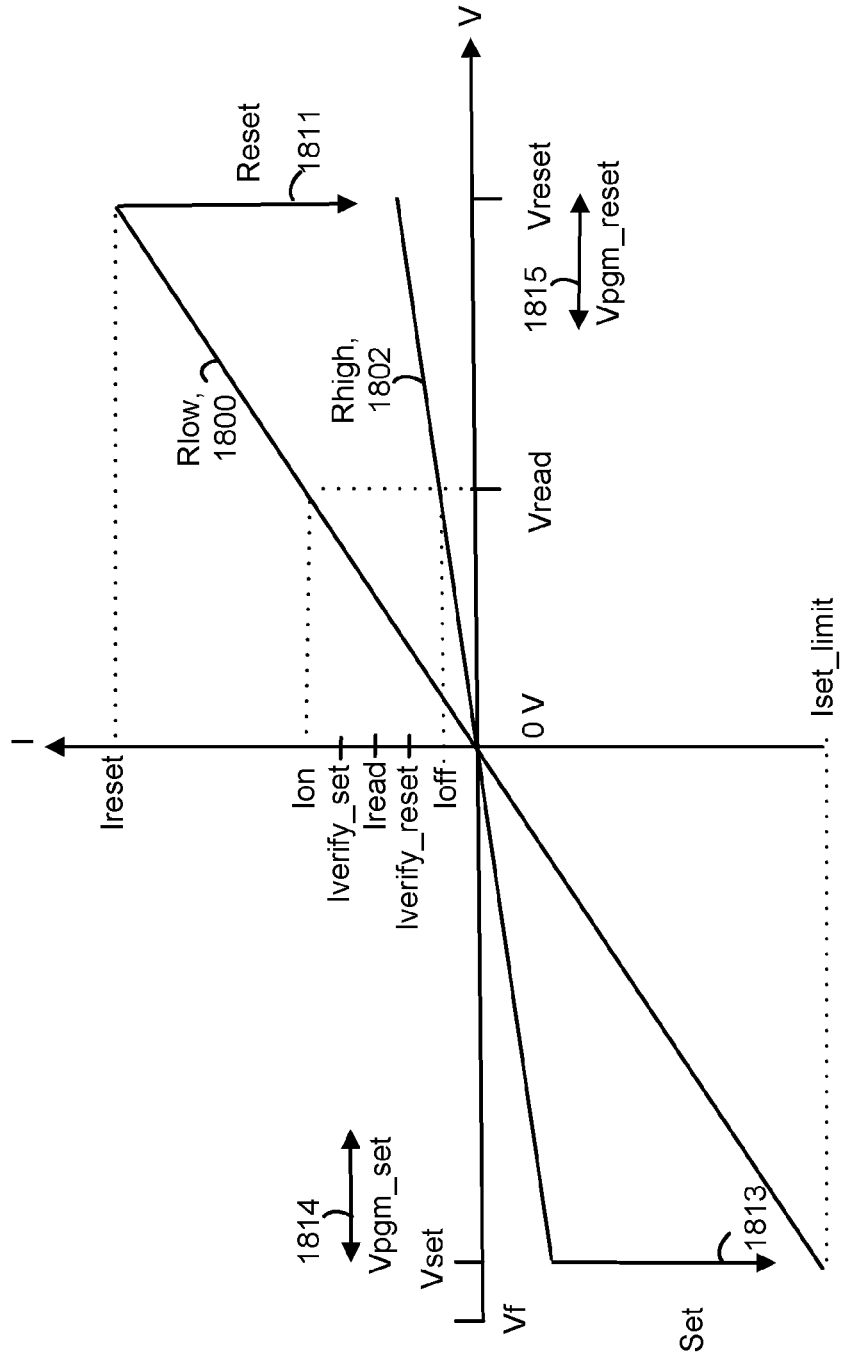
FIG. 18B is a graph depicting I-V characteristics of an example bipolar resistance-switching material which sets using a negative voltage.

FIG. 18B is a graph depicting I-V characteristics of an example bipolar resistance-switching material which sets using a negative voltage. Line 1800 represents the Rlow state and line 1802 represents the Rhigh state as in FIG. 18A. Line 1811 represents a reset and line 1813 represents a set. Arrow 1814 represents a range of magnitudes for Vpgm_set and arrow 1815 represents a range of magnitudes for Vpgm_reset.

For a resistance-switching cell, the program (e.g., set) or erase (e.g., reset) rate can be determined by measuring the current in the cell when different sensing voltages are applied, before the set or reset occurs. This results in the slope of the line 1800 or 1802 in a reset or set operation, respectively. Although there is a non-linearity in the switching of the resistance state, the slope of the line 1800 or 1802 can be used as a rate metric for a reset or set operation, respectively.

Figure 19A:
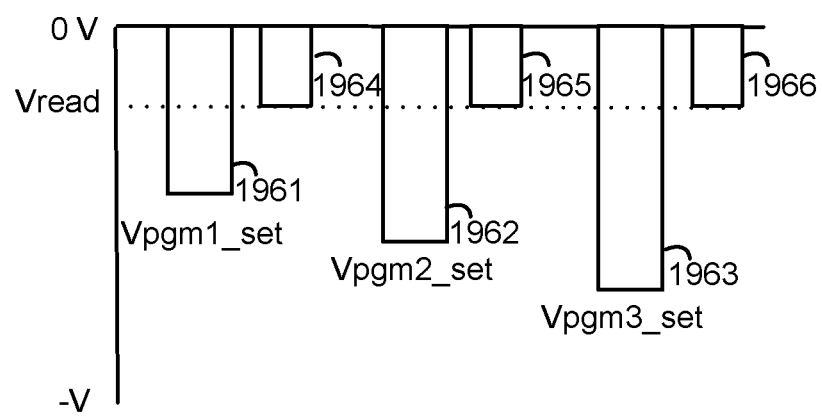
FIG. 19A depicts example pulses in a set process for a resistance-switching memory cell.

FIG. 19A depicts example pulses in a set process for a resistance-switching memory cell. This example is consistent with FIG. 18B, where negative voltages are applied in a set process. A program voltage 1961 of magnitude Vpgm1_set is followed by a read (verify) voltage 1964 of magnitude Vread. In this case, assume the program verify test is failed. Subsequently, a program voltage 1962 of magnitude Vpgm2_set is followed by a read voltage 1965 of magnitude Vread. In this case, assume the program verify test is again failed. Subsequently, a program voltage 1963 of magnitude Vpgm3_set is followed by a read voltage 1966 of magnitude Vread. In this case, assume the program verify test is passed and the set operation is completed.

Figure 19B:
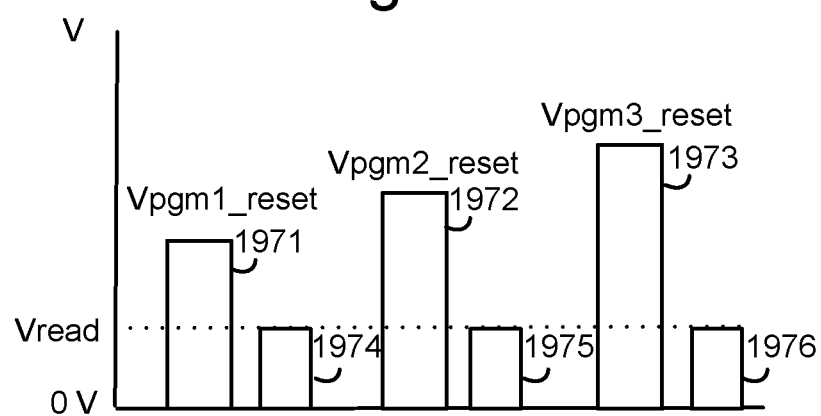
FIG. 19B depicts example pulses in a reset process for a resistance-switching memory cell.

FIG. 19B depicts example pulses in a reset process for a resistance-switching memory cell. A program voltage 1971 of magnitude Vpgm1_reset is followed by a read (verify) voltage 1974 of magnitude Vread. In this case, assume the program verify test is failed. Subsequently, a program voltage 1972 of magnitude Vpgm2_reset is followed by a read voltage 1975 of magnitude Vread. In this case, assume the program verify test is again failed. Subsequently, a program voltage 1973 of magnitude Vpgm3_reset is followed by a read voltage 1976 of magnitude Vread. In this case, assume the program verify test is passed and the reset operation is completed.

FIGS. 19A and 19B use a dual polarity algorithm in which one polarity is used for all voltages in the set process and the opposite polarity is used for all voltages in the reset process. Further, there is a read operation relative to a set or reset current. If the target is not met, the magnitude and/or duration of the voltage is increased and another program iteration is performed.

FIG. 20A depicts a memory device comprising an array of DRAM memory cells. DRAM is a type of volatile memory. The memory device 2000 includes a row decoder 2001 which receives a row address, a column decoder 2002 which receives a column address, a memory array 2003, sense amplifiers/row buffers 2010, a column selector 2011, a read latch 2012 and a write driver 2013. An example DRAM memory cell 2009 is provided by a bit line 2004, a word line 2005, an access transistor 2006 and a storage capacitor 2007.

FIG. 20B depicts an STT-RAM (spin-transfer torque, random access memory) memory cell which can replace the DRAM cell of FIG. 20A. An example STT-RAM cell 2015 is provided by the bit line 2004, the word line 2005, a sense line 2008, the access transistor 2006 and a magnetic tunnel junction (MTJ).

FIG. 20C depicts the magnetic tunnel junction (MTJ) 2020 of FIG. 20B in a parallel alignment. The MJT includes a reference layer 2021, a barrier layer 2022 and a free layer 2023. The arrows in layers 2021 and 2023 represent a magnetic direction. The magnetic direction of the reference layer is fixed and the magnetic direction of the free layer can change to be parallel (aligned in the same direction) or anti-parallel to represent binary data.

FIG. 20D depicts the magnetic tunnel junction (MTJ) 2020a of FIG. 20B in an anti-parallel alignment. The MJT includes the reference layer 2021, the barrier layer 2022 and the free layer 2023a with a magnetic direction opposite to the case of FIG. 20C. In the STT-RAM, the resistance of the MTJ changes based on the stored data. To program data, a large current is applied to change the magnetic orientation of the free layer. A series of current pulses can be applied, where the pulses may or may not increase step wise. Depending on the direction of the current, the free layer becomes parallel or anti-parallel to the fixed layer. The amount of current required for writing into an MTJ is significantly larger than that needed for reading from it. To read the data stored in an MJT cell, a small voltage is applied between sense and bit lines, and the amount of current flow is sensed.

For a magnetoresistive memory cell, in one approach, the parallel state can be the programmed state and the anti-parallel state can be the erased state, or the anti-parallel state can be the programmed state and the parallel state can be the erased state. The program or erase rate can be measured by sensing the resistance of the cell after one or more of the current pulses, and determine a slope of resistance versus pulse number.

Accordingly, it can be seen that, in one embodiment, an apparatus comprises: a set of memory cells in a block; sense circuits connected to the set of memory cells; a driver connected to the set of memory cells; and a control circuit, the control circuit configured to: cause the driver to apply a set of pulses to the set of memory cells, cause the sense circuits to test a characteristic of the set of memory cells relative to one or more verify levels, based on results from the sense circuits, determine a rate of change of the characteristic, set an adjustable programming parameter based on the rate of change of the characteristic, and program memory cells in the block using the adjustable programming parameter.

In another embodiment, a method comprises: applying a set of program voltages to a set of memory cells, wherein the program voltages increase according to an initial step size, and the set of memory cells is in a block; determining counts of the program voltages used in programming the memory cells to different verify levels; determining an adjustable programming parameter based on the counts; and performing subsequent programming of memory cells in the block using the adjustable programming parameter.

In another embodiment, an apparatus comprises: means for applying a set of program voltages to a set of memory cells, wherein the program voltages increase according to an initial step size, and the set of memory cells is in a block; means for determining a count of the program voltages used in programming the memory cells to different verify levels; means for determining an adjustable programming parameter based on the counts; and means for performing subsequent programming of memory cells in the block using the adjustable programming parameter.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a set of memory cells in a block;
   sense circuits connected to the set of memory cells;
   a driver connected to the set of memory cells; and
   a control circuit, the control circuit configured to:
      cause the driver to apply a set of pulses to the set of memory cells,
      cause the sense circuits to evaluate a characteristic of the set of memory cells, the characteristic comprises threshold voltage, current or resistance;
      based on results from the sense circuits, determine a rate of change of the characteristic,
      set an adjustable programming parameter based on the rate of change of the characteristic, and
   program memory cells in the block using the adjustable programming parameter, wherein:
      the block is a multi-layer memory block comprising sub-blocks;
      memory cells of the multi-layer memory block are arranged along memory holes which extend vertically in the multi-layer memory block;
      diameters of the memory holes vary along a height of the multi-layer memory block;
      the set of memory cells is arranged in one layer in one of the sub-blocks; and
      the adjustable programming parameter is used in programming of sets of memory cells in the one layer in another of the sub-blocks.

2. The apparatus of claim 1, wherein:
   the sense circuits are configured to evaluate the characteristic of the set of memory cells relative to one or more levels in an erase operation.

3. The apparatus of claim 1, wherein:
   the adjustable programming parameter comprises an adjusted step size;
   the set of memory cells is connected to a word line; and
   the programming of memory cells in the block using the adjustable programming parameter involves the set of memory cells connected to the word line and occurs in a single programming pass in which the pulses are stepped up by an initial step size and then by the adjusted step size.

4. The apparatus of claim 1, wherein:
   the sense circuits are configured to evaluate the characteristic of the set of memory cells relative to a set of levels; and
   the control circuit is configured to determine the rate of change of the characteristic based on counts of the pulses used to cause the characteristic to reach each level of the set of levels, and based on a slope of a straight line fit of data points, wherein each data point comprises one of the levels and a corresponding one of the counts of the pulses.

5. The apparatus of claim 1, wherein:
   the sense circuits are configured to evaluate the characteristic of the set of memory cells relative to one or more levels; and
   the control circuit configured to determine for one of the pulses a number of memory cells of the set of memory cells which exceeds a level of the one or more levels and if the number exceeds a threshold, increase the level by a delta and cause the sense circuits to compare the characteristic of the set of memory cells to the level plus the delta.

6. The apparatus of claim 1, wherein:
   the sense circuits are configured to evaluate the characteristic of the set of memory cells relative to a set of levels; and
   the control circuit is configured to determine the rate of change of the characteristic based on a slope of a straight line fit of data points, each data point comprising one of the levels of the set of levels and a corresponding one of the pulses.

7. The apparatus of claim 1, wherein:
   the sense circuits are configured to evaluate the characteristic of the set of memory cells relative to one or more levels in a programming operation; and
   the control circuit is configured to determine when to cause the sense circuits to compare the characteristic to the one or more levels based on a programming progress of the set of memory cells during the programming operation.

8. The apparatus of claim 1, wherein:
   the sense circuits are configured to evaluate the characteristic of the set of memory cells relative to one or more verify levels in a programming operation; and
   the control circuit is configured to:
      during the set of pulses, lockout some memory cells of the set of memory cells from further programming while continuing programming of other memory cells of the set of memory cells; and
      determine the rate of change of the characteristic based on results from the sense circuits for the other memory cells and not based on results from the sense circuits for the locked out memory cells.

9. The apparatus of claim 1, wherein:
   the sense circuits are configured to evaluate the characteristic of the set of memory cells relative to one or more levels in a programming operation; and
   the control circuit is configured to erase the set of memory cells to a first depth prior to determining the rate of change of the characteristic and to a second depth, higher than the first depth, after the determining the rate of change of the characteristic and prior to the programming of memory cells in the block using the adjustable programming parameter.

10. The apparatus of claim 1, wherein:
the control circuit is configured to detect that an ambient temperature is outside of a specified range and determine the rate of change of the characteristic in response to the detection.

11. The apparatus of claim 1, wherein:
the control circuit is configured to detect a number of program-verify iterations used in programming the set of memory cells and determine the rate of change of the characteristic in response to the detection.

12. The apparatus of claim 1, wherein:
the adjustable programming parameter is used in programming sets of memory cells in an adjacent layer in each of the sub-blocks, the adjacent layer is adjacent to the one layer.

13. The apparatus of claim 1, wherein:
the adjustable programming parameter comprises an adjusted step size.

14. A method, comprising:
applying a set of program voltages to a set of memory cells in a single programming pass, wherein the program voltages increase according to an initial step size, and the set of memory cells is in a block;
determining counts of the program voltages used in programming the memory cells to different target data states having different verify levels in the single programming pass;
determining an adjustable programming parameter based on a rate of change of the counts; and
performing subsequent programming of memory cells in the block using the adjustable programming parameter.

15. The method of claim 14, wherein:
determining a slope of a straight line fit of data points, each data point comprising one of the different verify levels and a corresponding one of the counts of the program voltage; and
determining the adjustable programming parameter based on a ratio of a target slope to the determined slope.

16. The method of claim 14, wherein:
each memory cell in the set of memory cells is programmed to a highest verify level of the different verify levels.

17. The method of claim 14, wherein:
multiple verify voltages are applied after one of the program voltages; and
a highest verify voltage of the multiple verify voltages is used to obtain one of the counts.

18. The method of claim 14, wherein:
the counts comprise a count of the program voltages used in programming the memory cells to one target data state having one verify level and a count of the program voltages used in programming the memory cells to another target data state having another verify level which is higher than the one verify level.

19. An apparatus, comprising:
means for applying program voltages in respective program loops to a set of memory cells in a programming operation, wherein the program voltages increase according to a step size, and the set of memory cells is in a block;
means for increasing a number of verify voltages per program loop until the number of verify voltages per program loop reaches a specified number of verify voltages;
means for determining a count of the program voltages used in programming the memory cells to different verify voltages when the number of verify voltages per program loop reaches the specified number of verify voltages;
means for determining an adjustable programming parameter based on a rate of change of the counts; and
means for performing subsequent programming of memory cells in the block using the adjustable programming parameter.

* * * * *